United States Patent [19]
Hayashi et al.

[11] Patent Number: 5,726,613
[45] Date of Patent: Mar. 10, 1998

[54] ACTIVE INDUCTOR

[75] Inventors: Hitoshi Hayashi; Masashi Nakatsugawa, both of Yokohama; Masahiro Muraguchi, Yokosuka, all of Japan

[73] Assignee: Nippon Telegraph and Telephone Corporation, Tokyo, Japan

[21] Appl. No.: 594,591

[22] Filed: Jan. 31, 1996

[30] Foreign Application Priority Data

Feb. 1, 1995 [JP] Japan ..................... 7-015435

[51] Int. Cl.$^6$ ............................................. H03H 11/48
[52] U.S. Cl. ............................................. 333/214; 333/217
[58] Field of Search ............................... 333/214, 217; 330/291; 331/115

[56] References Cited

U.S. PATENT DOCUMENTS

| | | | |
|---|---|---|---|
| 3,178,662 | 4/1965 | Dill et al. | 333/214 |
| 3,553,609 | 1/1971 | Edge | 333/214 |
| 4,118,600 | 10/1978 | Stahl | 333/217 X |
| 4,338,582 | 7/1982 | Presser | 333/217 X |
| 5,012,201 | 4/1991 | Morita et al. | 333/214 X |
| 5,175,513 | 12/1992 | Hara | 331/115 |
| 5,256,991 | 10/1993 | Campbell et al. | 333/215 |
| 5,347,238 | 9/1994 | Kobayashi | 331/117 R |

FOREIGN PATENT DOCUMENTS

| | | |
|---|---|---|
| 50-32853 | 3/1975 | Japan . |
| 50-32854 | 3/1975 | Japan . |
| 52-40944 | 3/1977 | Japan . |
| 2-205107 | 8/1990 | Japan . |
| 5-24685 | 4/1993 | Japan . |

OTHER PUBLICATIONS

Hara et al., "Broad-Band Monolithic Microwave Active Inductor and Its Application to Miniaturized Wide-Band Amplifiers", IEEE Transactions on Microwave Theory and Techniques, 36(12):1920–1924 (1988).

Hara et al., "Lossless Broad-Band Monolithic Microwave Active Inductors", IEEE Transactions on Microwave Theory and Techniques, 37(12):1979–1984 (1989).

(List continued on next page.)

*Primary Examiner*—Paul Gensler
*Attorney, Agent, or Firm*—Finnegan, Henderson, Farabow, Garrett & Dunner, L.L.P.

[57] ABSTRACT

An active inductor having a greater inductance, low loss, and which is small is provided by the present invention. The active inductor comprises a common source FET and a cascode-connected common gate FET connected thereto for providing unidirectional feedback. The drain electrode of the front FET and the source electrode of the rear FET, consisting of the common gate cascode FET, are connected together. A resistor is connected at one end to this connection. The two terminals of the active inductor correspond to the other end of the resistor and the source electrode of the common source FET. A frequency independent negative resistance is generated in series with the inductance by this configuration. By properly tuning the resistance of the resistor, it is possible to make the impedance viewed from the two terminals to have inductance component only, and therefore an active inductor having less resistance loss is obtained.

38 Claims, 50 Drawing Sheets

OTHER PUBLICATIONS

Alinikula et al., "Monolithic Active Resonators For Wireless Applications", IEEE 1994 Microwave and Millimeter–Wave Monolithic Circuits Symposium, pp. 197–200, (1994).

Alinikula et al., "Integrating Active Resonators for Wireless Applications", Microwave Journal, pp. 106, 109, 111–113, (1995).

Lucyszyn et al., "Monolithic Narrow–Band Filter using Ultrahigh–Q Tunable Active Inductors", IEEE Transactions on Microwave Theory and Techniques, 42(12):2617–2622 (1994).

Kobayashi et al., "A Novel Heterojunction Bipolar Transistor Active Feedback Design", IEEE Microwave and Guided Wave Letters, 4(5):146–148 (1994).

Kobayashi et al., "A Novel Heterojunction Bipolar Transistor VCO using an Active Tunable Inductance", IEEE Microwave and Guided Wave Letters, 4(7):235–237 (1994).

Hayashi et al., "A Consideration of Low–loss Microwave Active Inductor", The Institute of Electronics, Information and Communication Engineers, Technical Report, (1995).

Hayashi et al., "A Configuration of Low–Loss Active Inductor", The Institute of Electronics, Information and Communication Engineers, Autumn National Meeting, (1995).

Common-Gate Cascode FET

Common-Source Cascode FET 500.0 MHz     freq     5.0 GHz 500.0 MHz     freq     5.0 GHz 5,726,613

1

ACTIVE INDUCTOR

BACKGROUND OF THE INVENTION

The present invention relates to a miniaturized, broadband and low-loss active inductor. Spiral inductors, having metallic materials laid on inductive substrates, are often used in conventional MMICs (Microwave Monolithic Integrated Circuits). Although spiral inductors have an advantage of being simple in structure, they have a drawback in being large and occupying a large space when a large inductance must be produced.

FETs (Field Effect Transistors) are more space effective compared to spiral inductors, and therefore are more suitable for making smaller active inductors, which enable smaller MMICs. However, when FETs are used in active inductors, the resistance loss due to the drain conductance, gate bias resistance, and DC bias circuit, inevitably degrades the function of the inductor at frequency bands higher than microwave bands.

SUMMARY OF THE INVENTION

The present invention was made in view of the above-stated problems of conventional active inductors and has an object of providing an active inductor which has sufficient inductance at frequency bands higher than microwave bands and enabling a low loss against resistance due to drain conductance and other sources, while enabling miniaturization.

The active inductor according to the present invention comprises active elements exclusively, the active inductor comprising a first compensation means for generating a frequency independent negative resistance thereby canceling a frequency independent resistance component to achieve a low resistance loss and broad frequency characteristics.

The active inductor according to the present invention may also comprise a first transistor having first, second and third electrodes; a second transistor having first, second and third electrodes; a third transistor having first, second and third electrodes; and first and second terminals, wherein the first electrode of the second transistor is connected to the second electrode of the first transistor, the second electrode of the second transistor is connected to the third electrode of the first transistor; the first electrode of the third transistor is connected to the second electrode of the second transistor and the second electrode of the third transistor is connected to the third electrode of the second transistor, the third electrode of the third transistor is connected to the first electrode of the first transistor; the third electrode of the second transistor and the second electrode of the third transistor are connected to the first terminal; and the second electrode of the first transistor is connected to the second terminal.

Because the inductor according to the present invention comprises active elements only, the number of elements is reduced resulting in a small size of the inductor. The self resonance frequency of the inductor is higher compared to inductors in which passive elements such as capacitors are employed. Furthermore, even at frequency bands corresponding to microwaves, the impedance of the active inductor has an inductance component only and therefore any desired inductance is obtainable, which enables a low-loss inductor covering a wide frequency range from DC to high frequency bands.

When an FET or an HEMT (High Electron Mobility Transistor) is used as a transistor, the first electrode, second electrode, and the third electrode of the transistor correspond to the gate electrode, source electrode, and drain electrode thereof, respectively. When a bipolar transistor is used as the transistor, the first electrode, second electrode, and the third electrode of the transistor correspond to the base electrode, emitter electrode and the collector electrode, respectively.

DETAILED DESCRIPTION OF THE INVENTION

Active inductors using FETs are suitable for miniaturizing MMICs because FET circuits are smaller than spiral inductors. However, a drawback of this type of active inductor is that the function degrades at frequencies higher than microwave bands, especially at one half of the cut-off frequency $f_T$ whereat the FET's characteristics are lowered due to the resistance loss caused by the drain conductance. This problem will be discussed in more detail in the following sections.

First Convention Active Inductor

Figure 1:
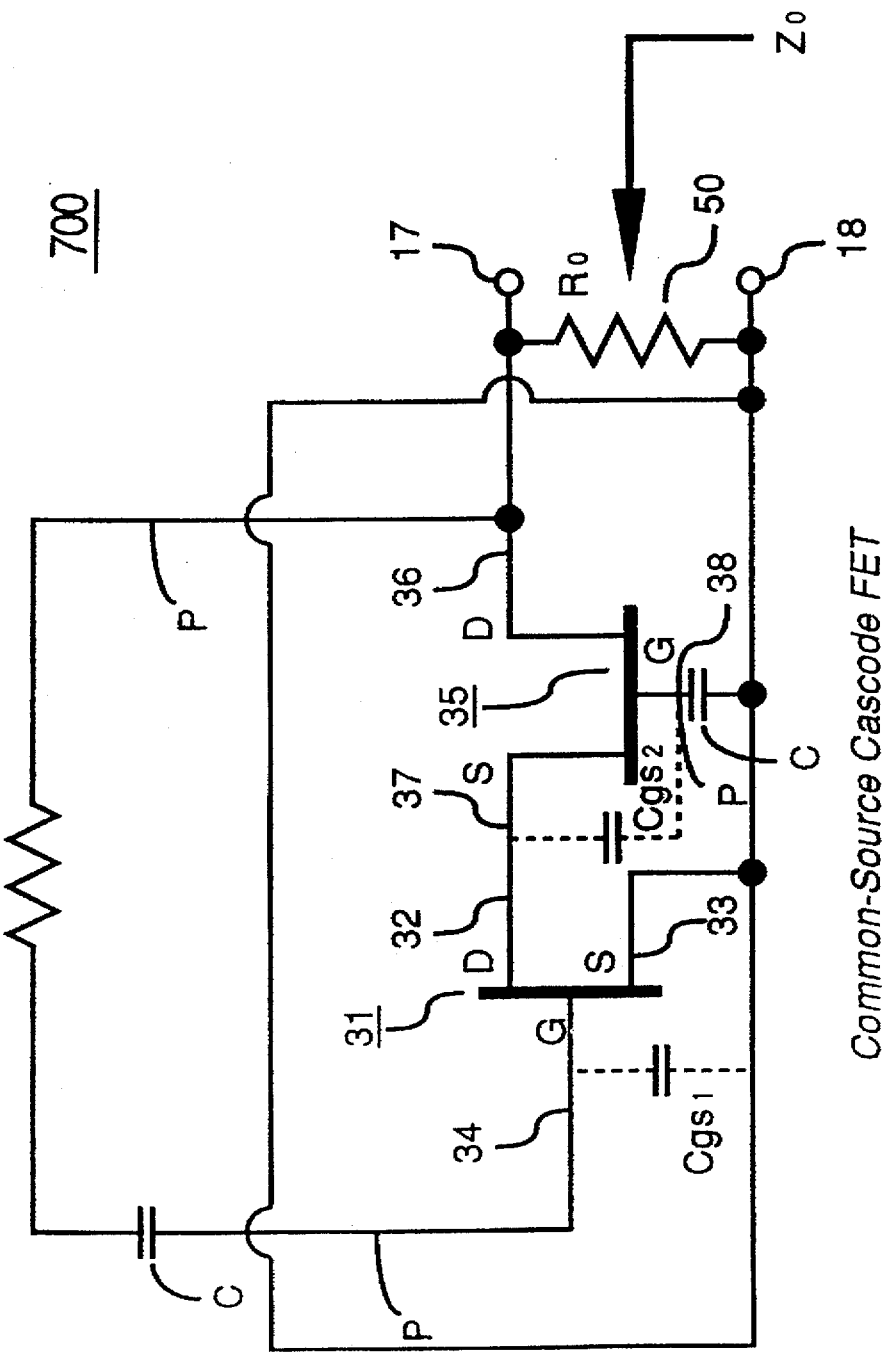
FIG. 1 shows a first conventional active inductor.

FIG. 1 shows the first conventional active inductor, which is designed to provide relatively good performance at higher frequencies and small size, as described in Japanese Patent Application Second Publication Hei 5-24,685. In this active inductor 700, common source FET 31 and common gate FET 35 are cascode-connected, and resistor 16 is inserted between gate, 34 of FET 31 and drain 36 of FET 35. Resistor 50 having resistance $R_0$ is inserted between the terminals 17 and 18. The resistor 50 reduces the increase of inductance at higher frequencies and converges the inductance at broad frequency ranges. The voltage is applied at point P via a coil for curing of higher frequency components and the element C is a capacitor for eliminating direct current components, in FIG. 1.

The impedance $Z_0$ viewed from terminals 17 and 18 which are connected to drain 36 and gate 38 of FET 35 is inductive. Therefore, the circuit shown in FIG. 1 can be used as an active inductor.

The impedance $Z_0$ of the active inductor 700 viewed from terminals 17 and 18, supposing that resistor 50 is not connected, is calculated in the following section. Supposing, for simplicity, that FET 31 and FET 35 are electrically identical and characteristics of both of them are determined by the capacitances $C_{gs1}$ and $C_{gs2}$ of a gate source beneath the gate and the transconductances $g_{m1}$ and $g_{m2}$. By using the above terms, the impedance $Z_0$ is obtained as follows:

$$Z_0 = \frac{1 + j\omega C_{gs1} R}{\frac{1}{1+\left(\frac{f}{f_T}\right)^2} \left\{ g_{m1} + j\omega C_{gs1} \left(\frac{f}{f_T}\right)^2 \right\}} \quad (1)$$

Figure 2:
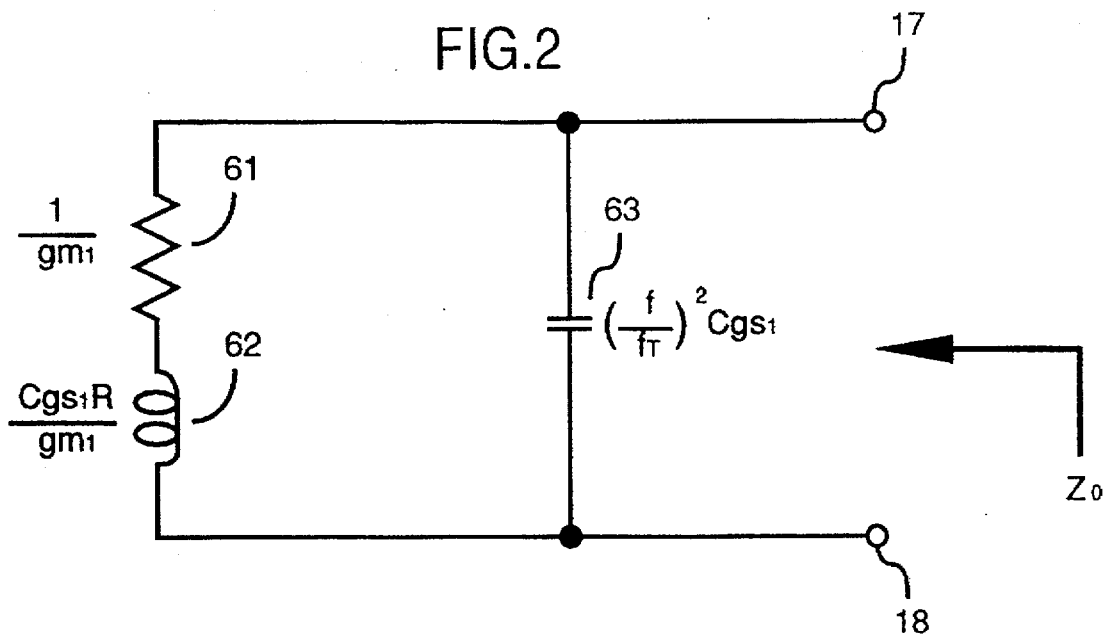
FIG. 2 shows an equivalent circuit of the active inductor depicted in FIG. 1.

The cut off frequency $f_T$ of the FET is expressed as $f_T = g_{m1}/(2\pi C_{gs1}) = g_{m2}/(2\pi C_{gs2})$. It is not difficult to obtain FETs having identical $f_T$s when they are taken from the same wafer. An equivalent circuit of the above-described active inductor is shown in FIG. 2. As shown in the figure, the active inductor as described above is approximately equivalent with a circuit wherein a capacitor 63 having a capacitance $(f/f_T)^2 C_{gs1}$ is connected in parallel with a resistor 61 having a resistance of $1/g_{m1}$ and an inductor 62 having an inductance of $C_{gs1} R/g_{m1}$ connected in series.

If a short gate length FET for microwave bands is used for a frequency approximately $f_T/3$, the value $(f/f_T)^2$ is $1/9$ which is much smaller than 1. Therefore, the imaginary part of the denominator in equation (1) becomes negligible, and the active inductor results in an inductor circuit having resistor 61 and inductor 62 connected in series.

Figure 3:
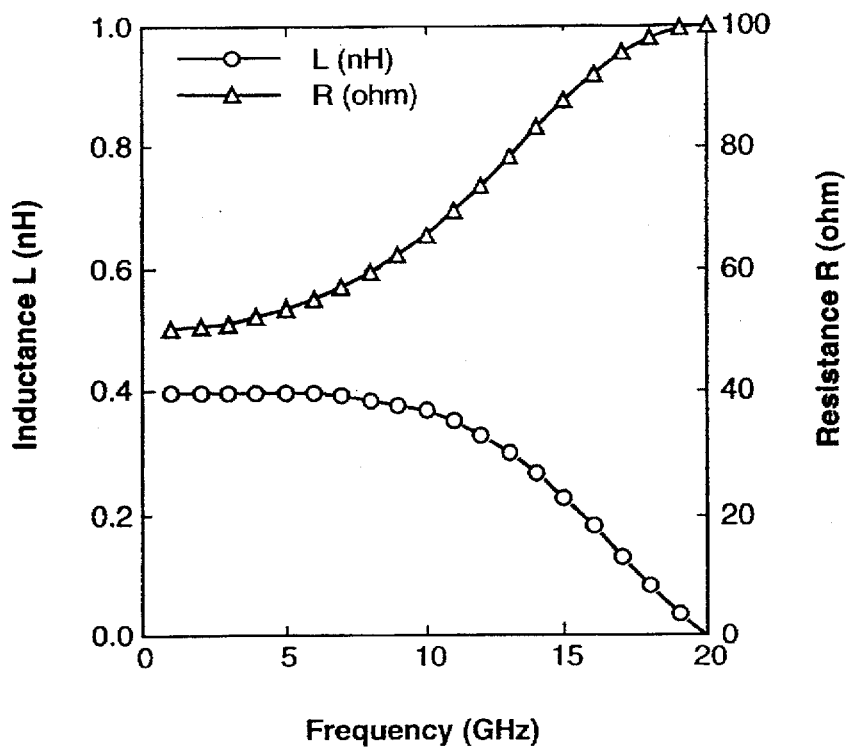
FIG. 3 shows frequency characteristics of the active inductor depicted in FIG. 1.

FIG. 3 shows the frequency characteristics of the impedance $Z_0(=R+j\omega L)$ as shown in equation (1) when an FET having a gate width of 100 microns (transconductance $g_m = 20$ mS, capacitance $C_{gs} = 0.16$ pF, cut-off frequency $f_T = g_m/(2\pi C_{gs}) = 20$ GHz) is used. Each FET is supposed to have identical gate width. Resistor 16 has a 50 ohm resistor as resistance R.

As shown in FIG. 3, this active inductor has a resistance component in series with the inductance, and because the transconductance $g_m$ is not large enough, the loss becomes larger and thus the performance degrades at frequencies higher than microwave frequencies.

Second Conventional Active Inductor

Figure 4:
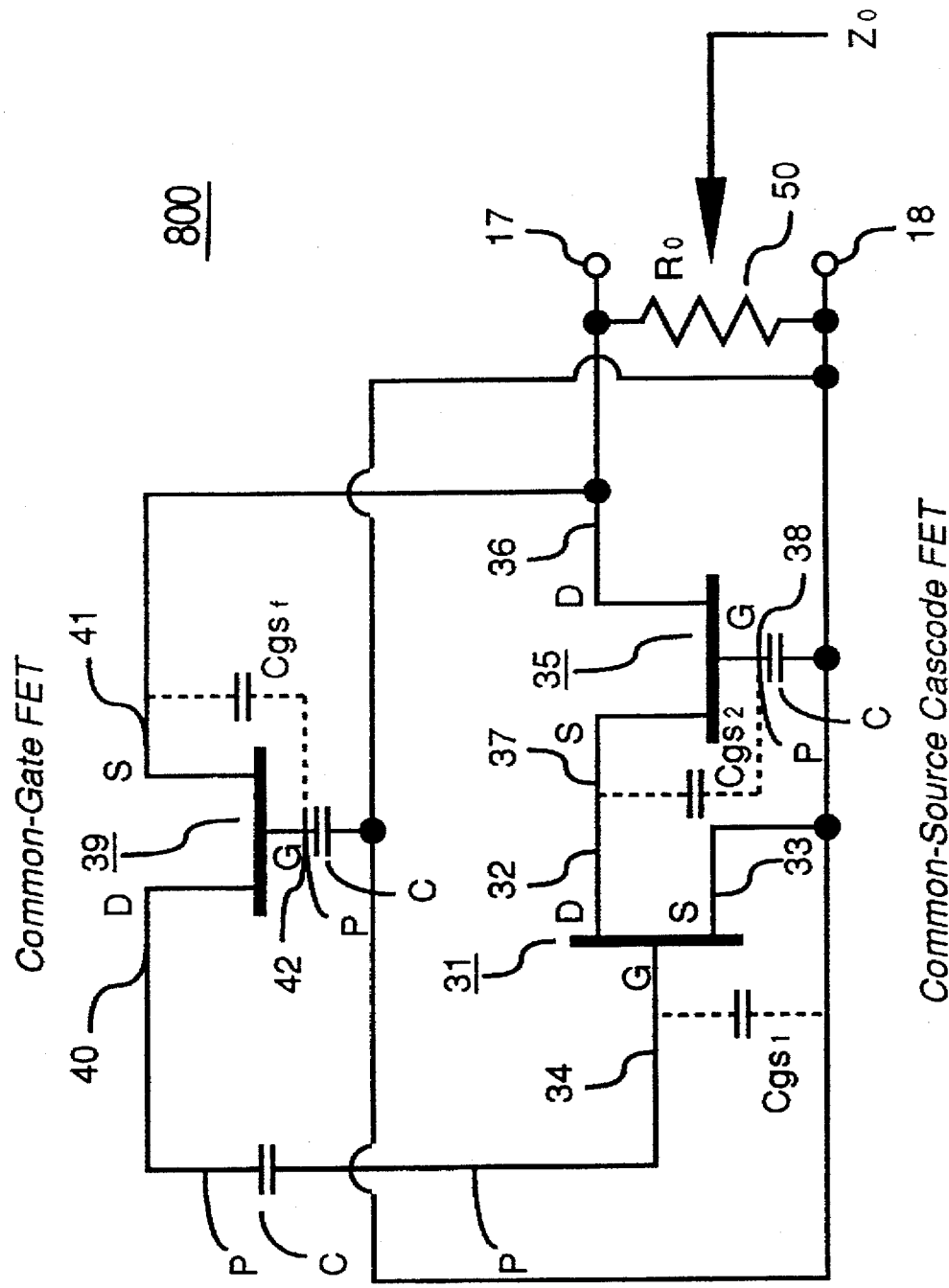
FIG. 4 shows a second conventional active inductor.

FIG. 4 shows a second active inductor which is also designed to reduce size and improve high frequency performance, as described in Japanese Patent Application First Publication Hei 2-205,107. Common source FET 31 and common gate FET 35 are cascode connected and unidirectional feedback is applied from drain 36 of FET 35 to gate 34 of FET 31 through the common gate FET 39 in active inductor 800.

The impedance viewed from terminals 17 and 18, connected with drain 36 and gate 38 of FET 35, respectively, is inductive, and therefore the FET circuit shown in FIG. 4 can be used as an active inductor. Because the impedance $Z_0$ is approximately determined by the inductance component and has little loss at lower frequencies, the active inductor 800 has an improved performance at higher frequencies compared with inductor 700 shown in FIG. 1.

The impedance $Z_0$ of the active inductor 800 viewed from terminals 17 and 18, supposing that resistor 50 is not connected, is calculated in the following section. Suppose, for simplicity, that FET 31, FET 35 and FET 39 are electrically identical and that their characteristics are determined by the capacitances $C_{gs1}$, $C_{gs2}$, and $C_{gsf}$ of the gate source beneath the gate and the transconductances $g_{m1}$, $g_{m2}$ and $g_{mf}$. By using the above terms, the impedance $Z_0$ is obtained as follows $$Z_0 = \frac{1}{\frac{g_{mf}}{1+\left(\frac{f}{f_T}\right)^2} \left[ \frac{g_{m1}}{j\omega C_{gs1}} \left\{ 1 - \left(\frac{f}{f_T}\right)^2 - \left(\frac{f}{f_T}\right)^4 \right\} + \left(\frac{f}{f_T}\right)^2 \right]} \quad (2)$$

Figure 5:
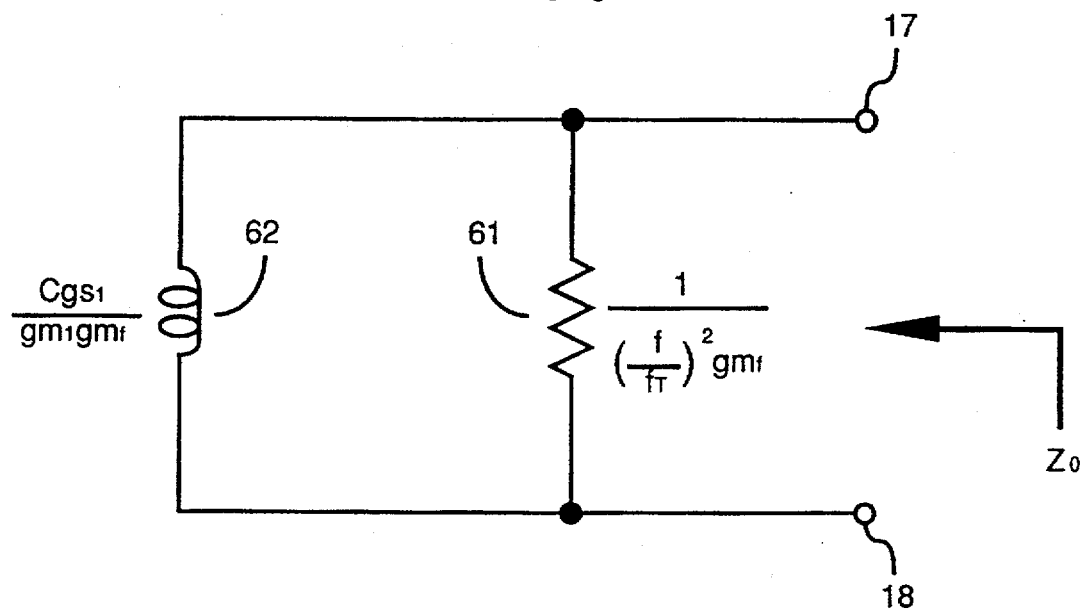
FIG. 5 shows an equivalent circuit of the active inductor depicted in FIG. 4.

The cut off frequencies $f_T$ of the FETs are expressed as $f_T = g_{m1}/(2\pi C_{gs1}) = g_{m2}/(2\pi C_{gs2}) = g_{mf}/(2\pi C_{gsf})$. FIG. 5 shows a circuit equivalent to the active inductor described above. As shown in FIG. 5, the active inductor described above is approximately equivalent with a circuit having a resistor 61 having $1/(f/f_T)^2 g_{mf}$ as a resistance and an inductor 62 having an inductance $C_{gs1}/(g_{m1} g_{mf})$ connected in parallel.

If a short gate length FET for microwave bands is used for a frequency approximately $f_T/3$, the value $(f/f_T)^2$ is $1/9$ which is much smaller than 1. Therefore, the imaginary part of the denominator in equation (2) is negligible and the impedance $Z_0$ is determined only by the inductance, resulting in a loss-less active inductor.

Figure 6A:
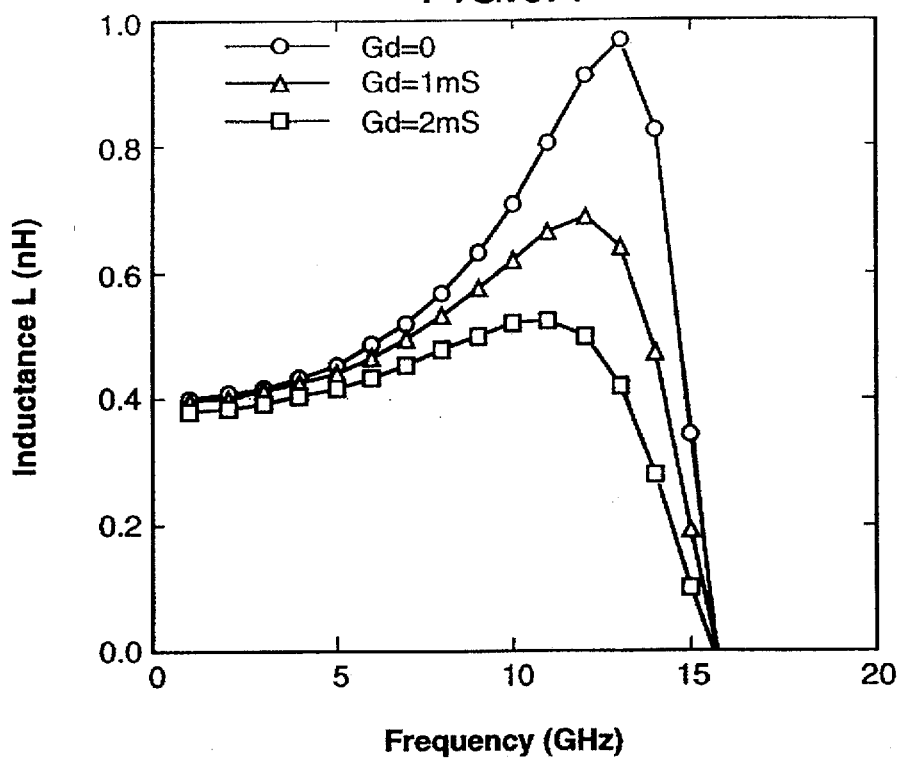
FIG. 6A shows frequency characteristics of the inductance L of the conventional inductor depicted in FIG. 4.
Figure 6B:
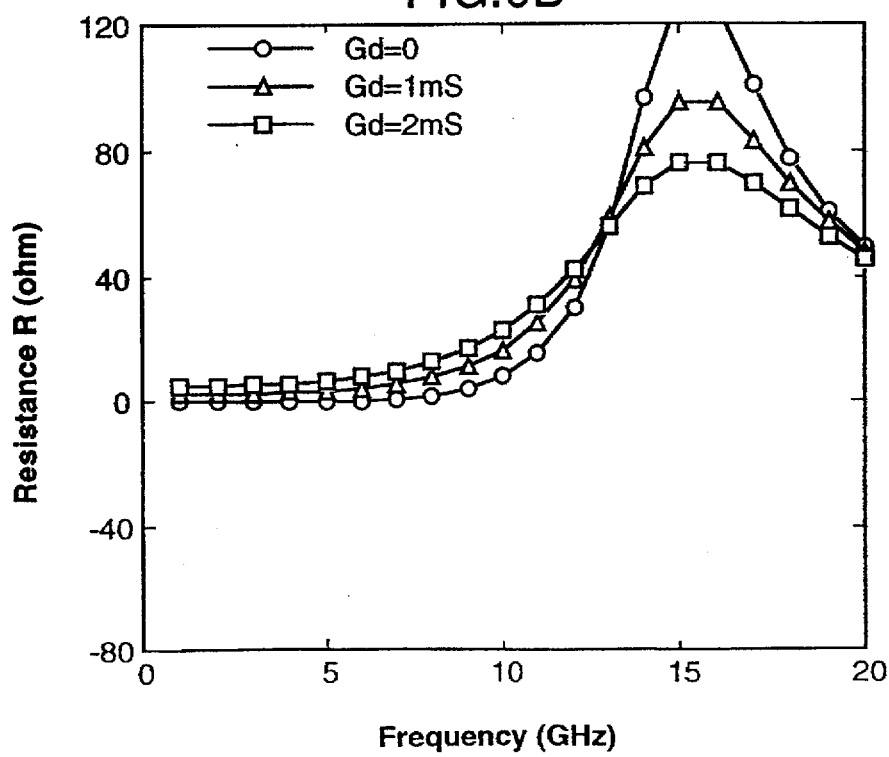
FIG. 6B shows frequency characteristics of the resistance R of the conventional inductor depicted in FIG. 4.

FIGS. 6A and 6B show the frequency characteristics of L (inductance component) and R (resistance component) of the impedance $Z_0$ when an FET having a gate width of 100 microns (transconductance $g_m = 20$ mS, capacitance $C_{gs} = 0.16$ pF, cut-off frequency $f_T = g_m/(2\pi C_{gs}) = 20$ GHz) is employed. Each FET is supposed to have identical gate width. The figure shows the results corresponding to drain conductance $G_d = 0, 1, 2$ mS.

As shown in the figure, a constant resistance loss is observed at frequencies as low as several GHz in accordance with the increase of the drain conductance. At 10 GHz($=f_T/2$), the real part of the denominator $(f/f_T)^2 g_m/(1+(f/f_T)^2)$, and therefore the loss also, is not negligible. Therefore, the active inductor described above does not provide low loss characteristics at frequencies higher than those for microwave bands.

Third Conventional Active Inductor

Figure 7:
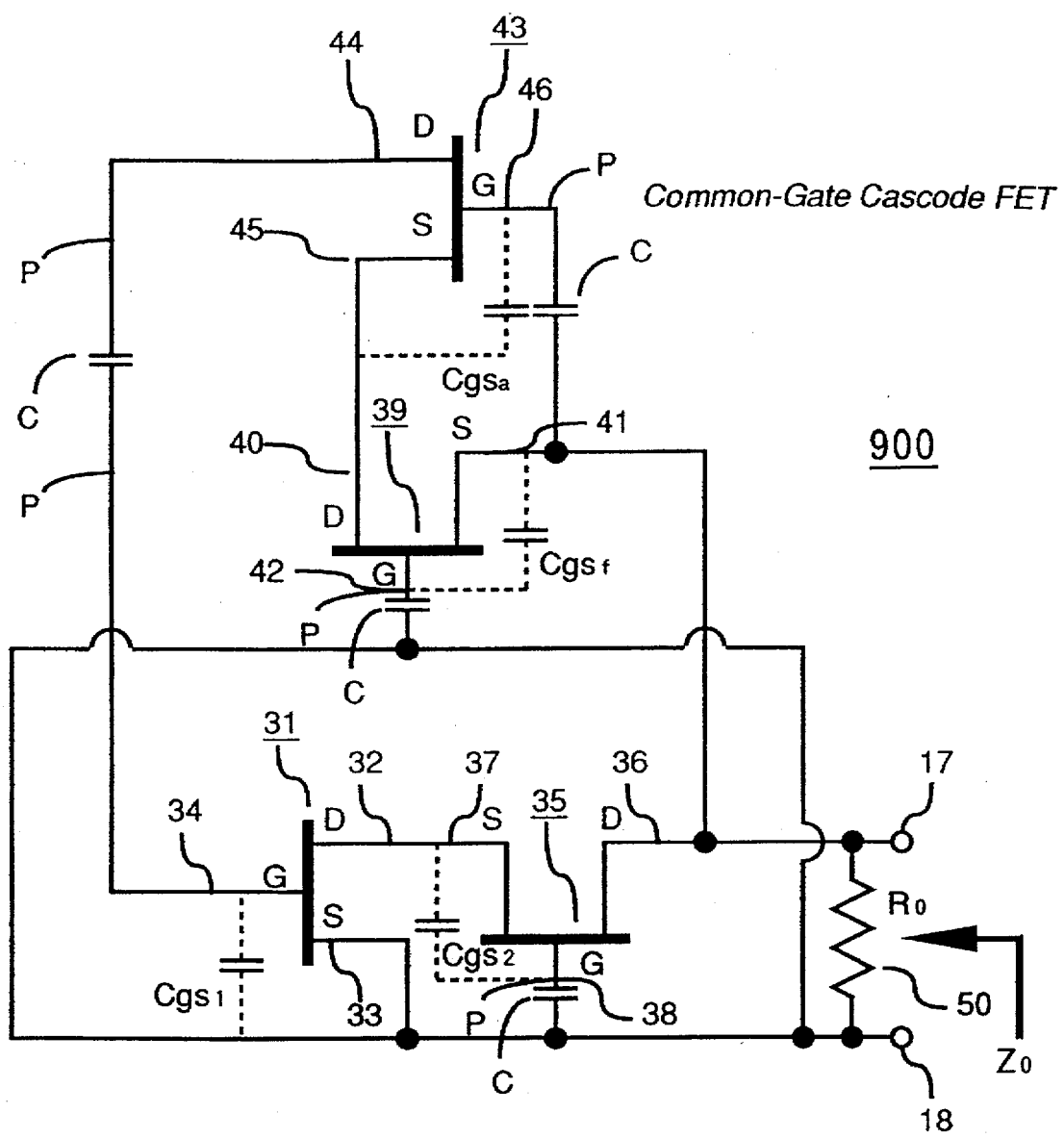
FIG. 7 shows a third conventional active inductor.

FIG. 7 shows a third conventional active inductor which is a cascode-connected/common gate cascode-connected feedback type active inductor, and which is described in Japanese Patent Application First Publication Hei 2-205, 107. In this active inductor 900, a feedback circuit consisting of common gate and cascode-connected FET 39 and FET 43 is used instead of FET 39 in FIG. 4.

The impedance $Z_0$ of the circuit viewed from terminals 17 and 1 g is calculated, supposing that resistor 50 is not connected. Also suppose, for simplicity, that FET 31, FET 35, FET 39 and FET 43 are electrically identical and their characteristics are determined by the capacitances $C_{gs1}$, $C_{gs2}$, $C_{gsf}$ and $C_{gsa}$ of the gate source beneath the gate and the transconductances $g_{m1}$, $g_{m2}$, $g_{mf}$ and $g_{ma}$. By using the above terms, the impedance $Z_0$ is obtained as follows:

$$Z_0 = \cfrac{1}{\cfrac{g_{mf}}{\left\{1+\left(\frac{f}{f_T}\right)^2\right\}^2}\left[\frac{g_{m1}}{j\omega C_{gs1}}\left\{1-\left(\frac{f}{f_T}\right)^2-\left(\frac{f}{f_T}\right)^4-\left(\frac{f}{f_T}\right)^6\right\}-1+\left(\frac{f}{f_T}\right)^2\right]} \quad (3)$$

Figure 8:
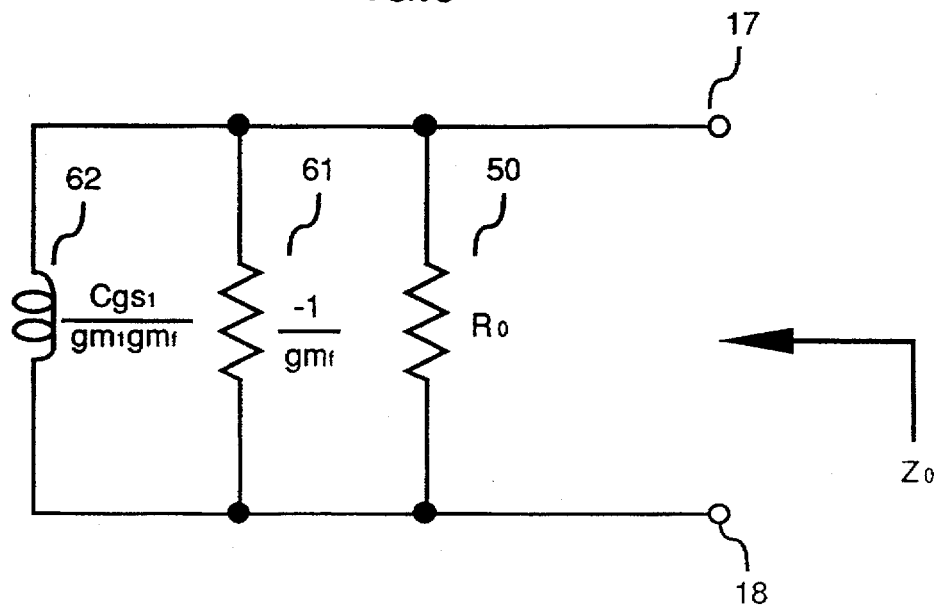
FIG. 8 shows an equivalent circuit of the active inductor depicted in FIG. 7.

The cut-off frequencies $f_T$ of the FETs are expressed as $f_T = g_{m1}/(2\pi C_{gs1}) g_{m2}/(2\pi C_{gs2}) = g_{mf}/(2\pi C_{gsf}) = g_{ma1}(2\pi C_{gsa})$. As shown in FIG. 8, the active inductor 900 as described above is approximately equivalent with a circuit having a resistor having a resistance of $R_0$, a negative resistance having $(-1/g_{mf})$ as resistance, and an inductor having an inductance $C_{gs1}/(g_{m1}g_{mf})$ connected in parallel. If the resistance $R_0 = 1/g_{mf}$, the negative resistance is canceled and a loss-free active inductor having inductance only is obtained.

Figure 9A:
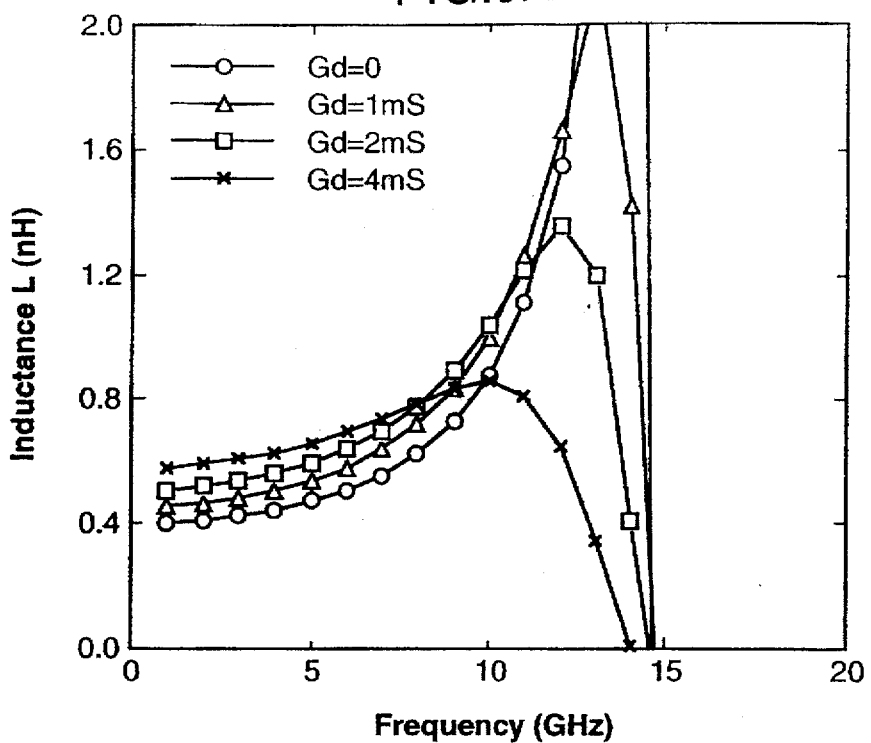
FIG. 9A shows frequency characteristics of the inductance L of the conventional inductor depicted in FIG. 7.
Figure 9B:
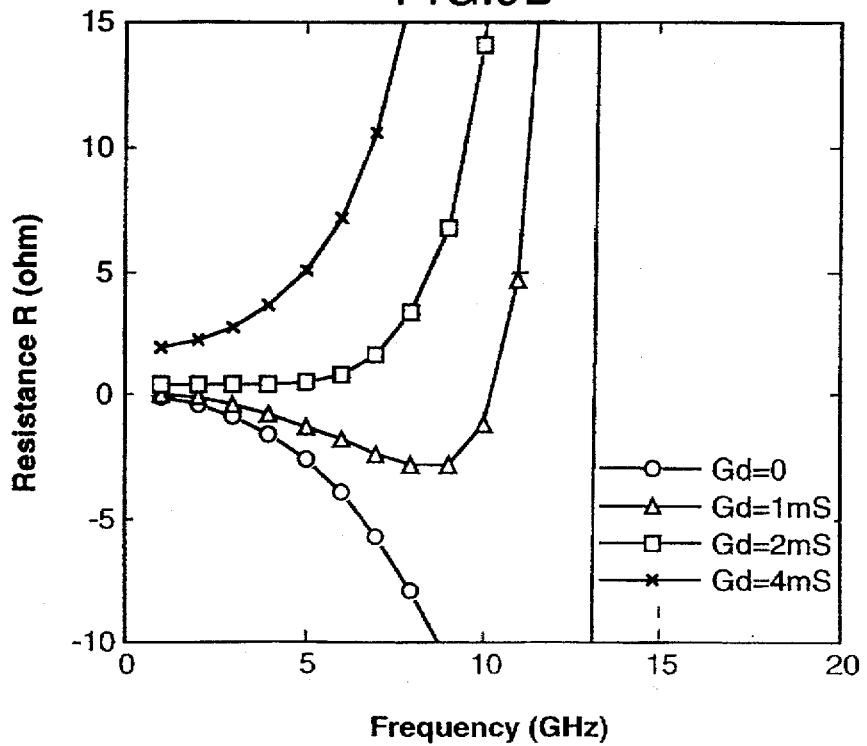
FIG. 9B shows frequency characteristics of the resistance R of the conventional inductor depicted in FIG. 7.

FIGS. 9A and 9B show the frequency characteristics of L and R of the impedance $Z_0$ when an FET having a gate width of 100 microns (transconductance $g_m = 20$ mS, capacitance $C_{gs} = 0.16$ pF, drain conductance $G_d = 0, 1, 2, 4$ ms, cut-off frequency $f_T = g_m/(2\pi C_{gs}) = 20$ GHz is employed. Each FET is supposed to have identical gate width. The resistance $R_0$ of the resistor 550 is 200 ohms.

The active inductor 900 as described above has a negative resistance connected in parallel with the inductance, and therefore the loss can be suppressed by tuning resistance $R_0$ at a certain range of frequencies. However, the disadvantage is that the frequency range at which compensation is obtainable is not broad enough.

Fourth Conventional Active Inductor

Figure 10:
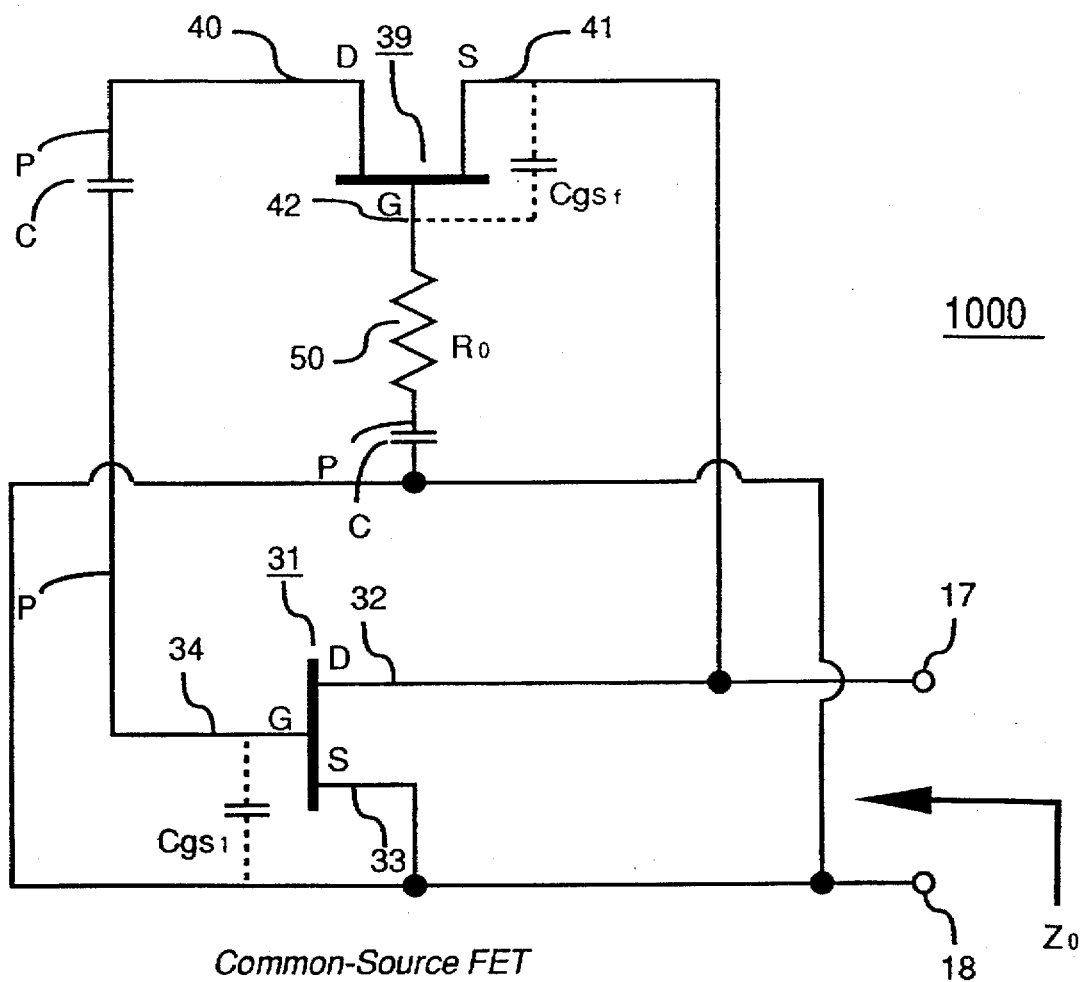
FIG. 10 shows a fourth conventional active inductor.

FIG. 10 shows the fourth conventional active conductor wherein a resistance is inserted at gates according to the article by P. Alinikula, et al., "Monolithic active resonators for wireless applications", IEEE Microwave and Millimeter-Wave Monolithic Circuits Symposium Dig., pp. 197–200, 1994, and the article by P. Alinikula, et al., "Integrating Active Resonators for Wireless Applications", Microwave Journal, pp. 106–113, January 1995. In the active inductor 1000, feedback is provided from drain 32 to gate 34 of common source FET 31, and resistor 50 having a resistance of $R_0$ is inserted in gate 42 of FET 39 and capacitor C for refusing direct current voltage. The impedance $Z_0$ viewed from the terminals 17 and 18 can be expressed, by using the capacitances $C_{gs1}$ and $C_{gsf}$ which is the capitances of the gate and source beneath the gate, transconductances $g_{m1}$ and $g_{mf}$ transconductance $g_{m1}$ and $g_{mf}$ for simplicity.

$$Z_0 = \cfrac{\left\{1-\left(\frac{f}{f_T}\right)^2\right\}\left\{\frac{1}{g_{mf}}+\left(\frac{f}{f_T}\right)^2 R_0\right\}}{\left\{1-\left(\frac{f}{f_T}\right)^2+\left(\frac{f}{f_T}\right)^4\right\}} - \cfrac{\left(\frac{f}{f_T}\right)^2\left[\left\{1-\left(\frac{f}{f_T}\right)^2\right\}R_0-\frac{1}{g_{mf}}\right]}{\left\{1-\left(\frac{f}{f_T}\right)^2+\left(\frac{f}{f_T}\right)^4\right\}} \quad (4)$$

The cut-off frequency $f_T$ of the FETs is $g_{m1}/(2\pi C_{gs1}) = g_{mf}/(2\pi C_{gsf})$. FETs having identical cut off frequencies are easily obtainable from the same wafer.

Figure 11:
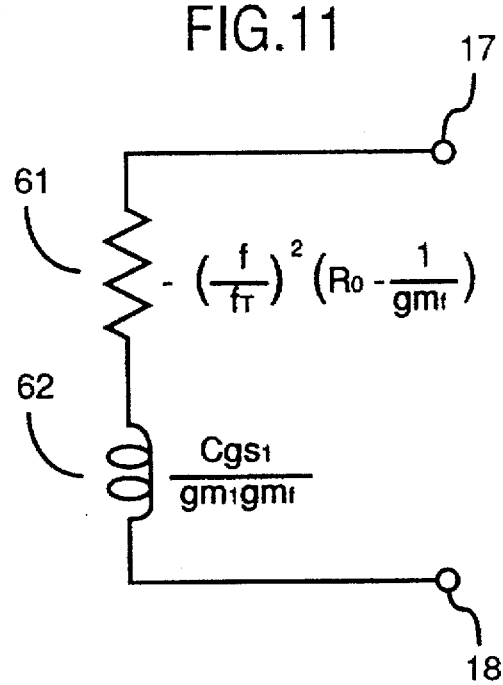
FIG. 11 shows an equivalent circuit of the active inductor depicted in FIG. 10.

As shown in FIG. 11, active inductor 1000 is approximately equivalent with a circuit consisting of a resistor 61 having a resistance of $(f/f_T)^2(R_0 - 1/g_{mf})$ an inductor 62 having an inductance of $C_{gs1}/(g_{m1}g_{mf})$ which are connected in series.

Figure 12A:
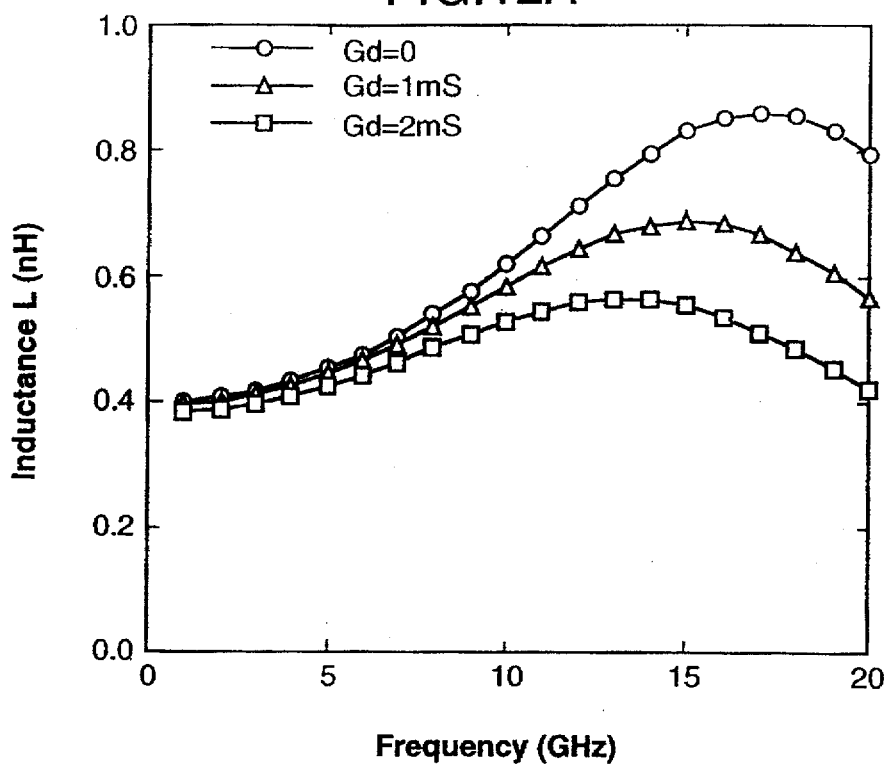
FIG. 12A shows frequency characteristics of the inductance L of the conventional inductor depicted in FIG. 10.
Figure 12B:
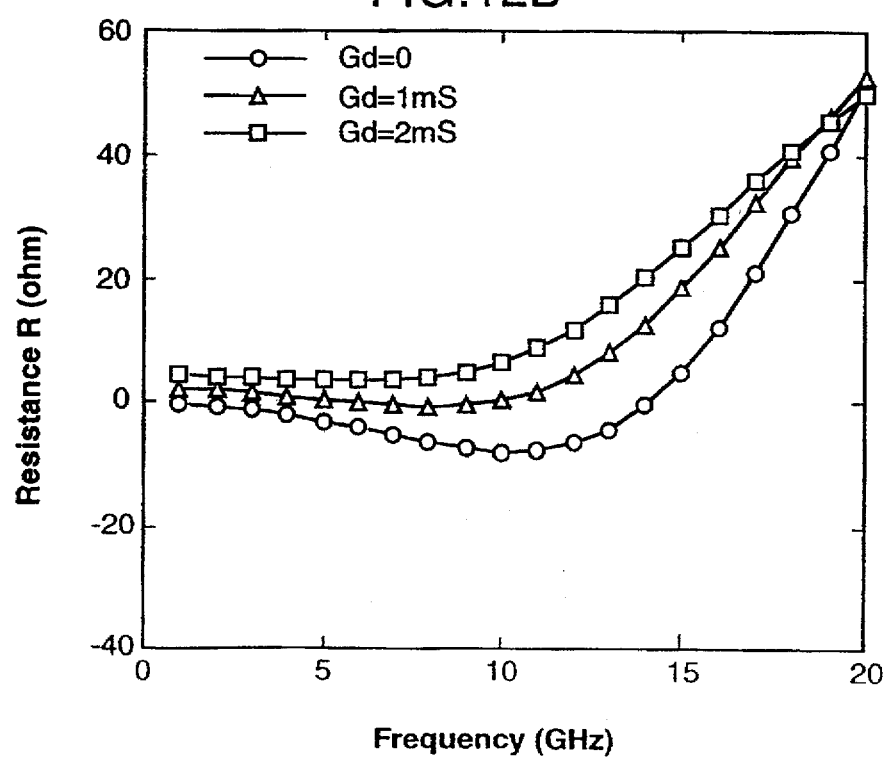
FIG. 12B shows frequency characteristics of the resistance R of the conventional inductor depicted in FIG. 10.

FIGS. 12A and 12B show the frequency characteristics of L and R of the impedance $Z_0$ when an FET having a gate width of 100 microns (transconductance $g_m = 20$ mS, capacitance $C_{gs} = 0.16$ pF, drain conductance $G_d = 0, 1, 2$ mS, cut-off frequency $f_T = g_m/(2\pi C_{gs}) = 20$ GHz) is employed. Each FET is supposed to have identical gate width. The resistance $R_0$ of resistor 50 is 100 ohms.

The active inductor 1000 as described above has a negative resistance dependent on the frequency, and therefore the loss can be suppressed by tuning resistance $R_0$ at a certain range of frequencies. However, the shortcomings are that the frequency range at which the compensation is obtainable is not broad enough.

Fifth Conventional Active Inductor

Figure 13:
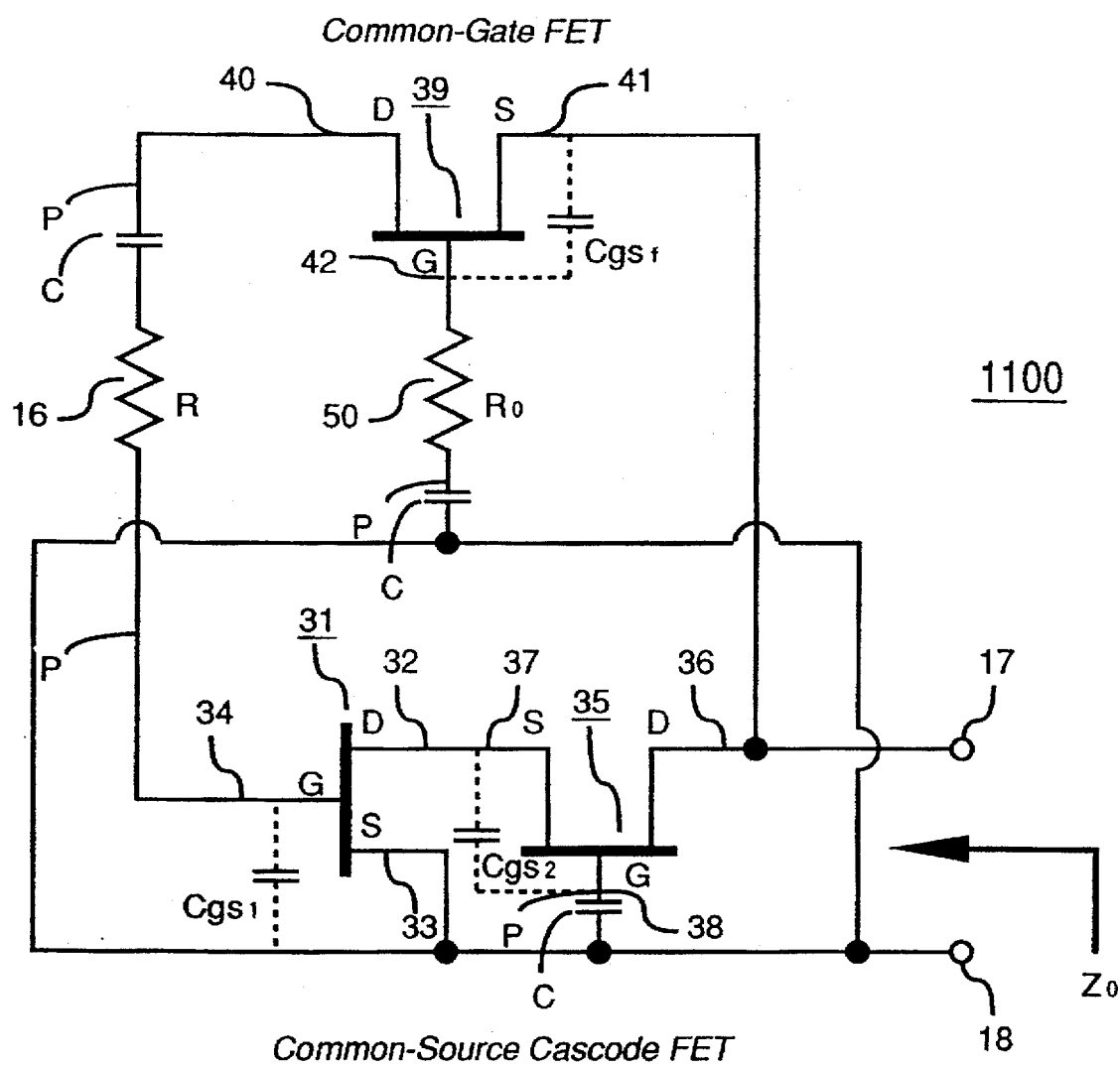
FIG. 13 shows a fifth conventional active inductor.

FIG. 13 shows a fifth conventional active inductor wherein a resistor is inserted at gates according to the article by S. Lucyszyn, et al., "Monolithic narrow-band filter using ultrahigh-Q tunable active inductors", IEEE Transactions on Microwave Theory and Techniques, Vol. 42, pp. 2617–2622, December 1994. In the active inductor 1100, as described in connection with the second conventional active inductor, common source FET 31 and common gate FET 35 are cascode-connected and unidirectional feedback is applied from drain 36 of FET 35 to gate 34 of FET 31 through the common gate FET 39. In addition, a resistor 50 having a resistance of $R_0$ is inserted between gate 42 of FET 39 and capacitor C for refusing direct current voltage, and feedback resistor 16 having a resistance of R is inserted between gate 34 of FET 31 and drain 40 of FET 39.

The impedance $Z_0$ of the active inductor 1100 viewed from terminals 17 and 18, supposing that the resistance $R_0$ of resistor 16 which functions as a feedback resistor for controlling the inductance value of the active inductor, has the value of zero, is calculated in the following section. Suppose, for simplicity, that FET 31, FET 35 and FET 39 are electrically identical and their characteristics are determined by the capacitances $C_{gs1}$, $C_{gs2}$ and $C_{gsf}$ of the gate source beneath the gate and the transconductances $g_{m1}$, $g_{m2}$ and $g_{mf}$. By using the above terms, the impedance $Z_0$ is obtained as follows:

$$Z_0 = \cfrac{1}{\cfrac{1}{\cfrac{1+\left(\frac{f}{f_T}\right)^2}{1-\left(\frac{f}{f_T}\right)^2-\left(\frac{f}{f_T}\right)^4}\cfrac{j\omega C_{gs1}}{g_{m1}g_{mf}}} + \cfrac{1}{\cfrac{1+\left(\frac{f}{f_T}\right)^2}{1-\left(\frac{f}{f_T}\right)^2}\cfrac{1}{g_{mf}}}} + \cfrac{1}{\cfrac{1}{\cfrac{\left(\frac{f}{f_T}\right)^2+\left(\frac{f}{f_T}\right)^4}{\left(\frac{f}{f_T}\right)^2-\left(\frac{f}{f_T}\right)^4}R_0} + \cfrac{1}{\cfrac{1+\left(\frac{f}{f_T}\right)^2}{\left(\frac{f}{f_T}\right)^2}\cfrac{j\omega C_{gsf}R_0}{g_{mf}}}} \quad (5)$$

The cut-off frequency $f_T$ of the FETs is $g_{m1}/(2\pi C_{gs1}) = g_{mf}/(2\pi C_{gsf})$. FETS having identical cut-off frequency are obtainable from the same wafer.

Figure 14:
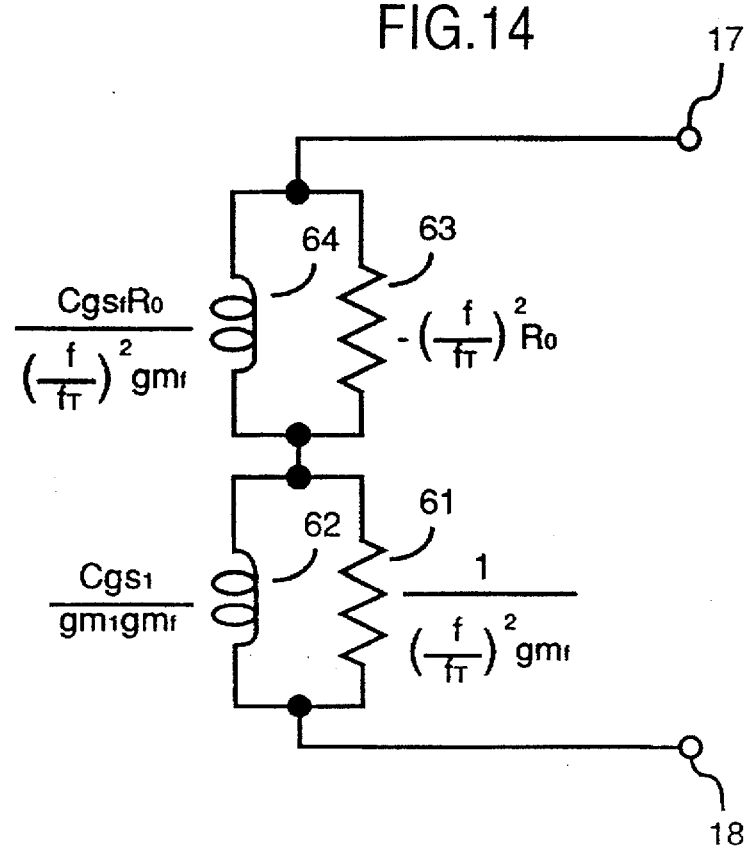
FIG. 14 shows an equivalent circuit of the active inductor depicted in FIG. 13.

As shown in FIG. 14, active inductor 1100 is approximately equivalent to a circuit consisting of a resistor 61 having a resistance of $V((f/f_T)^2 g_{mf})$ and an inductor 62 having an inductance of $C_{gs1}/(g_{m1}g_{mf})$, which are connected in parallel, a negative resistor 63 having a resistance $-(f/f_T)^2 R_0$, and an inductor 64 having an inductance $C_{gs}R_0^2/((f/f_T)^2 g_{mf})$, which are connected in parallel, where both parallel circuits are connected in series.

Figure 15A:
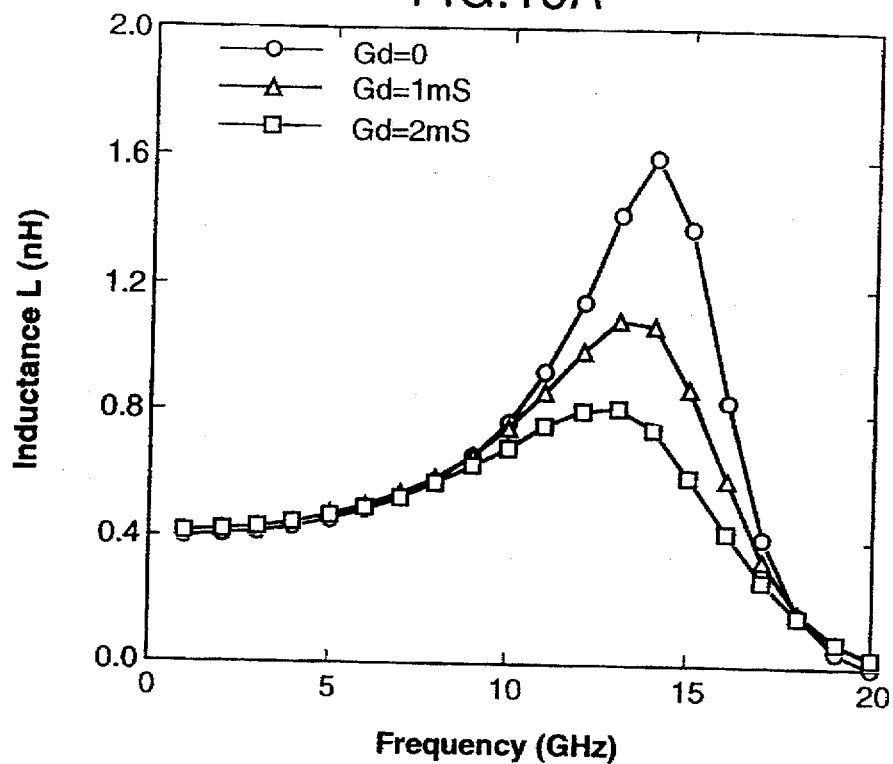
FIG. 15A shows frequency characteristics of the inductance L of the conventional inductor depicted in FIG. 13.
Figure 15B:
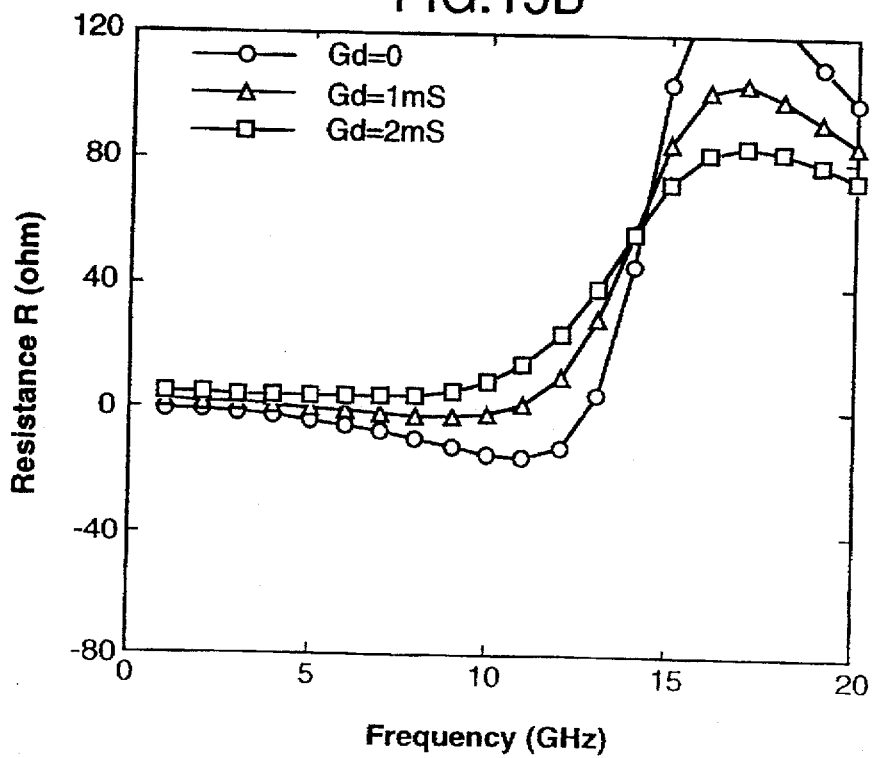
FIG. 15B shows frequency characteristics of the resistance R of the conventional inductor depicted in FIG. 13.

FIGS. 15A and 15B show the frequency characteristics of L and R of the impedance $Z_0$ when an FET having a gate width of 100 microns (transconductance $g_m$=20 mS, capacitance $C_{gs}$=0.16 pF, drain conductance $G_d$=0, 1, 2 mS, and cut-off frequency $f_T=g_m/(2\pi C_{gs})$=20 GHz) is employed. Each FET is supposed to have identical gate width. The resistor has a 50 ohm resistor as resistance $R_0$.

The active inductor 1000 as described above has a negative resistance dependent on the frequency, and therefore the loss can be suppressed by properly tuning resistance $R_0$ in a certain range of frequencies. However, the disadvantages are that the frequency range at which the compensation is obtainable is not broad enough.

The construction and characteristics of the conventional active inductors have been explained in the previous sections. The active inductor according to the present invention will be described in the following sections.

First Preferred Embodiment

Figure 16:
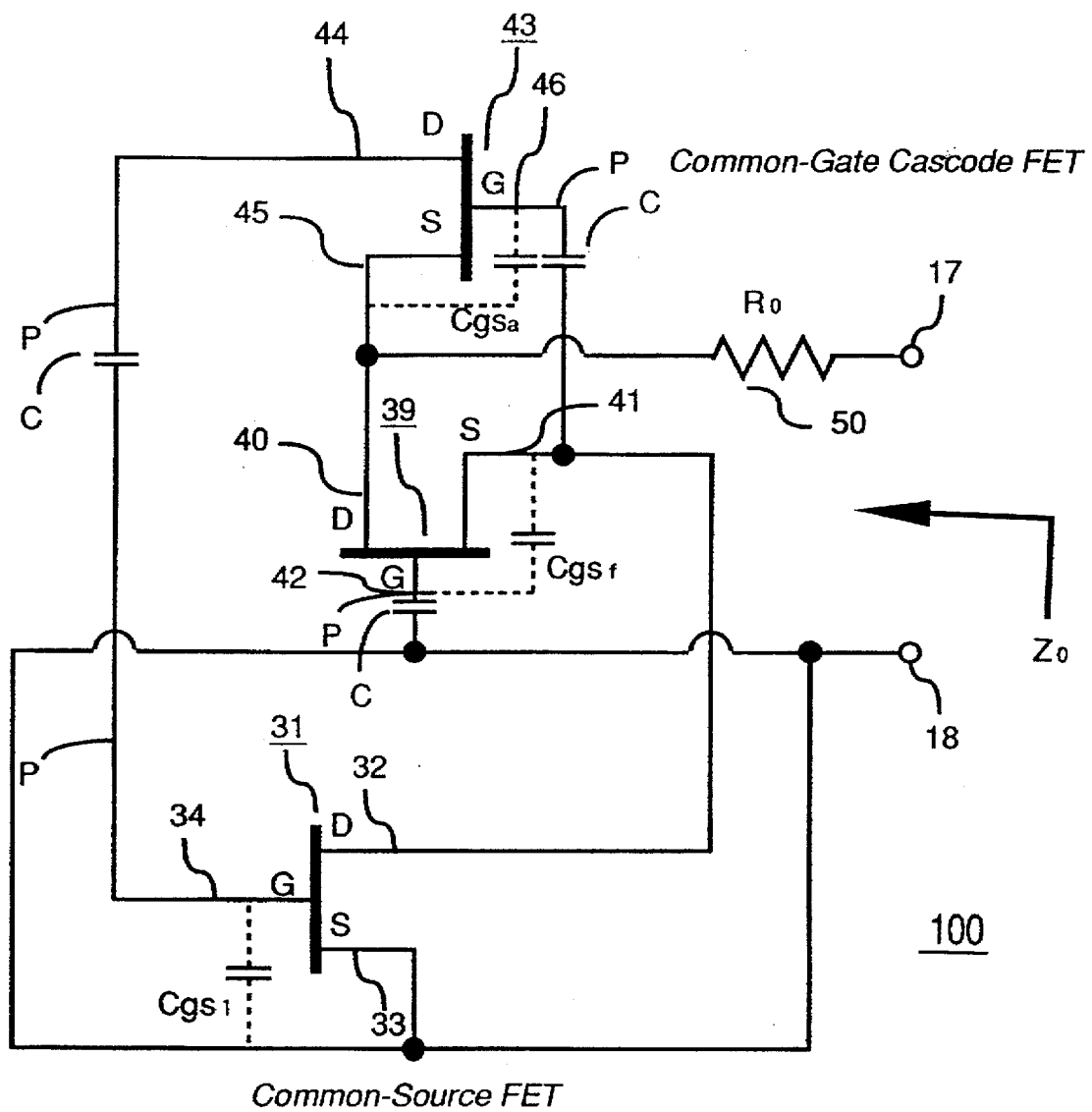
FIG. 16 shows a circuit of an active inductor according to the first embodiment of the present invention.

FIG. 16 shows a circuit of an active inductor 100 according to the first embodiment of the present invention. Terminals 17 and 18 correspond to the terminals when the circuit is considered as an inductor; the impedance of the circuit viewed from the terminals 17 and 18 is $Z_0$; the capacitor C is for refusing the application of direct current voltage; and the point P is where the voltage is applied.

FETs 31, 39 and 43 have $C_{gs1}$, $C_{gsf}$, and $C_{gsa}$ as capacitances of the gate source beneath the gates, and have $g_{m1}$, $g_{mf}$ and $g_{ma}$ as transconductances, respectively. The FETs have the gate electrode G, source electrode S, and drain electrode D. Terminals 32, 40 and 44 are drain electrodes of FETs 31, 39 and 43, respectively. Terminals 33, 41 and 45 are source electrodes of FETs 31, 39 and 43, respectively. Terminals 34, 42 and 46 are gate electrodes of FETs 31, 39 and 43, respectively. Resistor 50 has a resistance of $R_0$.

Unidirectional feedback is supplied by common gate and cascode-connected FET 39 and FET 43 to common source FET 31 in the active inductor 100. Resistor 50 is provided between the connection of drain 40 of FET 39 and source 45 of FET 43 and terminal 17.

The impedance $Z_0$ viewed from terminals 17 and 18 is calculated. Supposing, for simplicity, that FET 31, FET 39, and FET 43 are electrically identical and their characteristics are determined by the capacitances $C_{gs1}$, $C_{gsf}$, and $C_{gsa}$ of the gate source beneath the gate and the transconductances $g_{m1}$, $g_{mf}$, and $g_{ma}$. By using the above terms, the impedance $Z_0$ is obtained as follows:

$$Z_0 = \frac{1}{\left\{1-\left(\frac{f}{f_T}\right)^2\right\}} \left\{ -\frac{1}{g_{mf}} + \left(\frac{1}{g_{mf}} + \frac{1}{g_{ma}}\right) \frac{j\omega C_{gs1}}{g_{m1}} \right\} + R_0 \quad (6)$$

Figure 17:
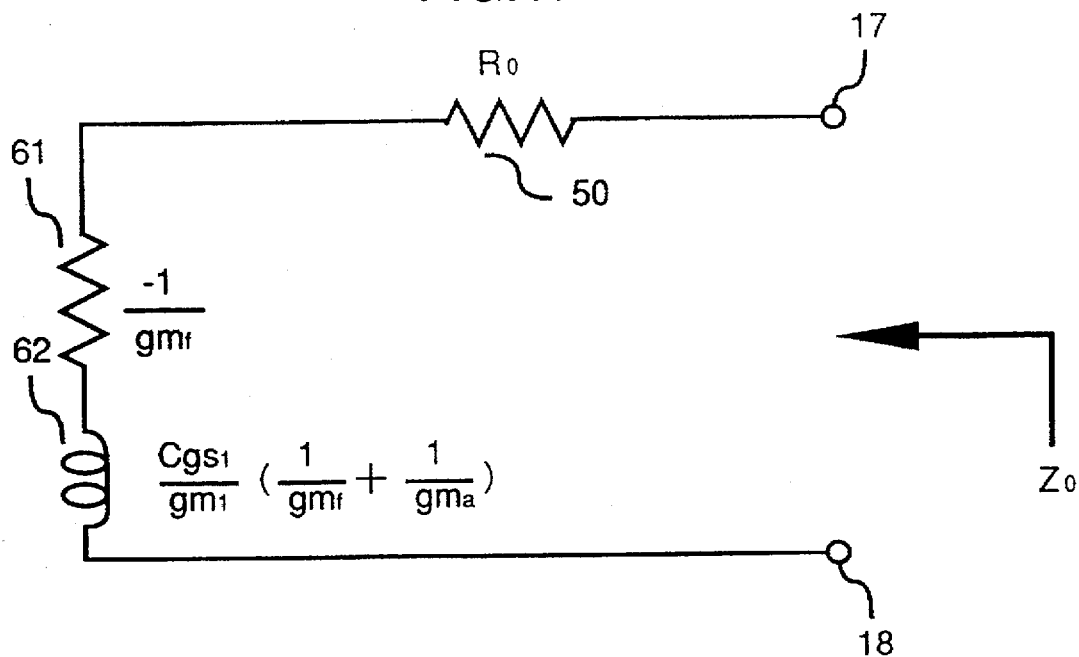
FIG. 17 shows an equivalent circuit of the active inductor according to the embodiment depicted in FIG. 16.

The cut-off frequency $f_T$ of the FETs is $g_{m1}/(2\pi C_{gs1}) \leq g_{mf}/(2\pi C_{gsf})=g_{ma}/2\pi C_{gsa}$. FETs having identical cut-off frequencies are obtainable from the same wafer. An equivalent circuit is shown in FIG. 17. As shown in FIG. 17, active inductor 100 is approximately equivalent with a circuit consisting of a resistor 50 having a resistance $R_0$, a resistor 61 having a resistance $-1/g_{mf}$ and inductor 62 having an inductance $((1/g_{mf}+1/g_{ma}C_{gs1})(C_{gs}1/g_{m1})$ connected in series.

Figure 18:
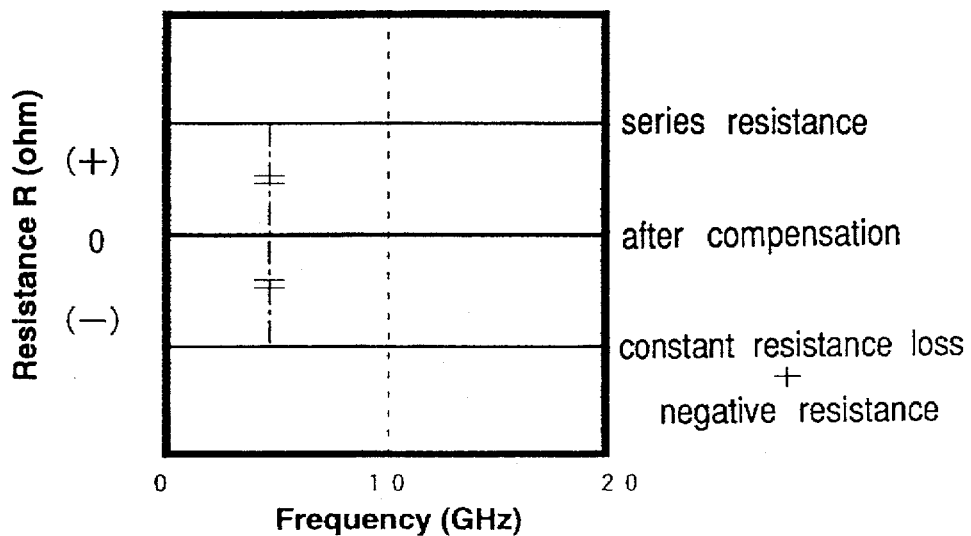
FIG. 18 shows a schematic diagram depicting the loss compensation of resistors connected in series.

If the resistance $R_0$ of resistor 50 is $1/g_{mf}$ which is equal to the absolute value of the resistance of resistor 61, the resistance component in equation (6) becomes zero and as a result the impedance $Z_0$ is determined only by the inductance which means a loss-less inductor is obtained. FIG. 18 shows this. In the figure, the abscissa corresponds to frequency and the ordinate corresponds to resistance R of the impedance $Z_0$ of the active inductor. If the resistance of resistor 50 is zero, the resistance component of the active inductor corresponds to the sum of constant resistance loss and negative resistance, which is negative. In other words, by generating a negative resistance component, the total resistance which is the sum of the conventional constant resistance loss and the negative resistance becomes negative. Resistor 50 has a positive resistance which is connected in series with the above resistance. Consequently, by tuning the resistance of resistor 50 to an absolute value equal to the negative resistance, the resistance of the inductor becomes zero.

Figure 19A:
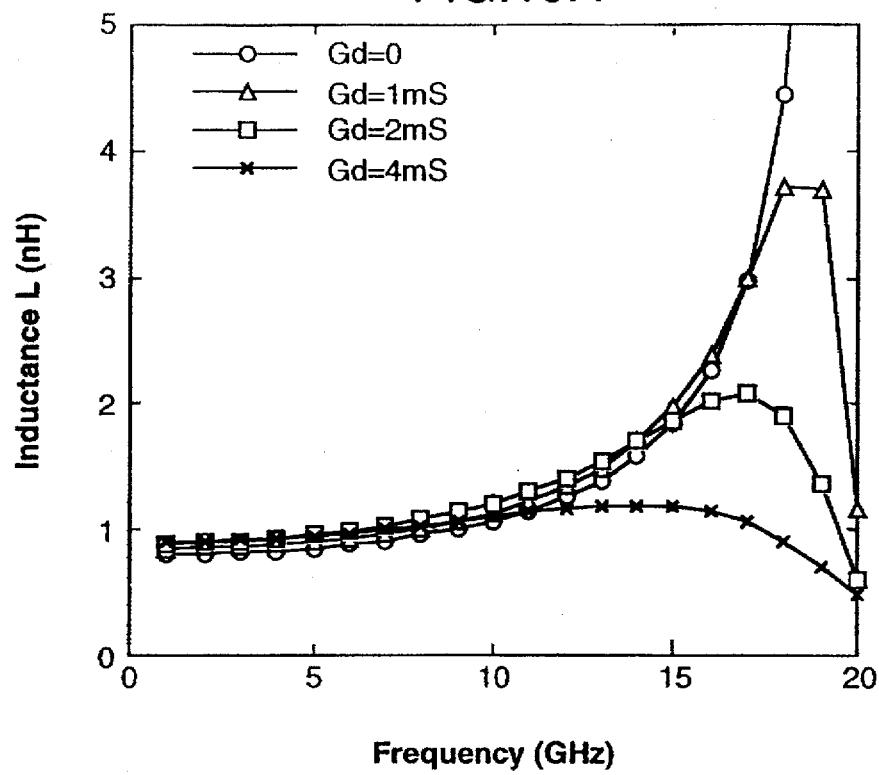
FIG. 19A shows frequency characteristics of the inductance L of the inductor depicted in FIG. 16.
Figure 19B:
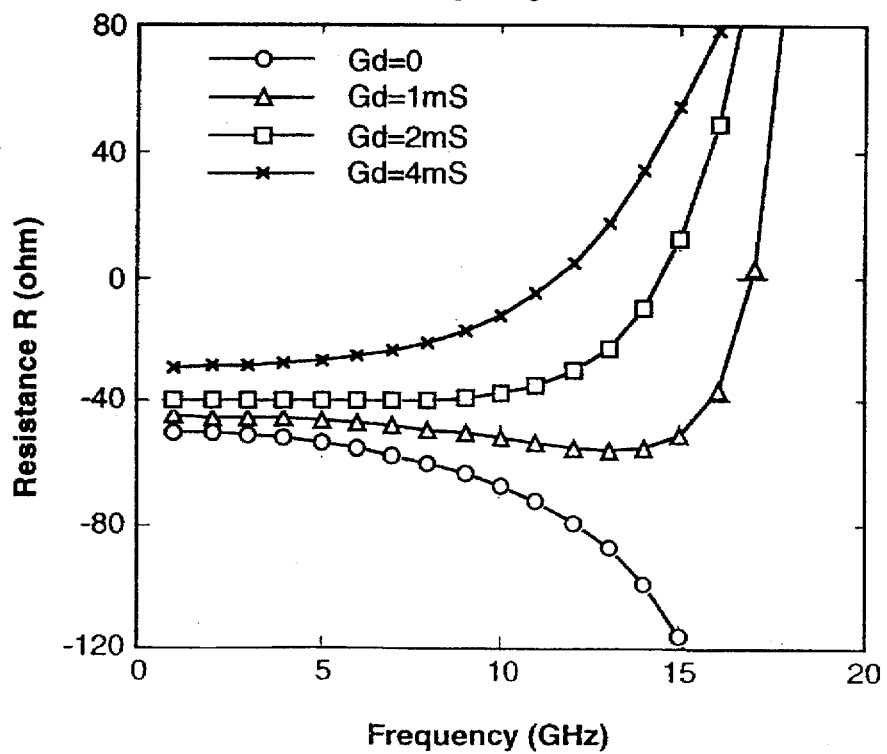
FIG. 19B shows frequency characteristics of the resistance R of the inductor depicted in FIG. 16.

FIGS. 19A and 19B show the frequency characteristics of L and R of the impedance $Z_0$ when an FET having a gate width of 100 microns (transconductance $g_m$=20 mS, capacitance $C_{gs}$=0.16 pF, cut-off frequency $f_T=g_m/(2\pi C_{gs})$=20 GHz) is employed. Each FET is supposed to have identical gate width. The resistance $R_0$ of the resistor 50 has the value of zero. The figures show the cases wherein the drain conductance $G_d$=0, 1, 2, 4 mS. Since all the FETs have electrically identical characteristics, the FETs have identical drain conductances.

In FIG. 19B, the resistance component shows that there is negative resistance. Therefore, as stated above, if the resistance $R_0$ of resistor 50 is determined to have an identical absolute value with this negative resistance, the overall resistance of the circuit becomes zero.

As described above, the resistance loss due to the constant resistance is compensated by properly determining the resistance $R_0$ of resistor 50 and thus low-loss frequency characteristics are obtained. Therefore, the above-described active inductor according to the present invention has good characteristics even in higher frequency ranges corresponding to microwaves.

Second Preferred Embodiment

Figure 20:
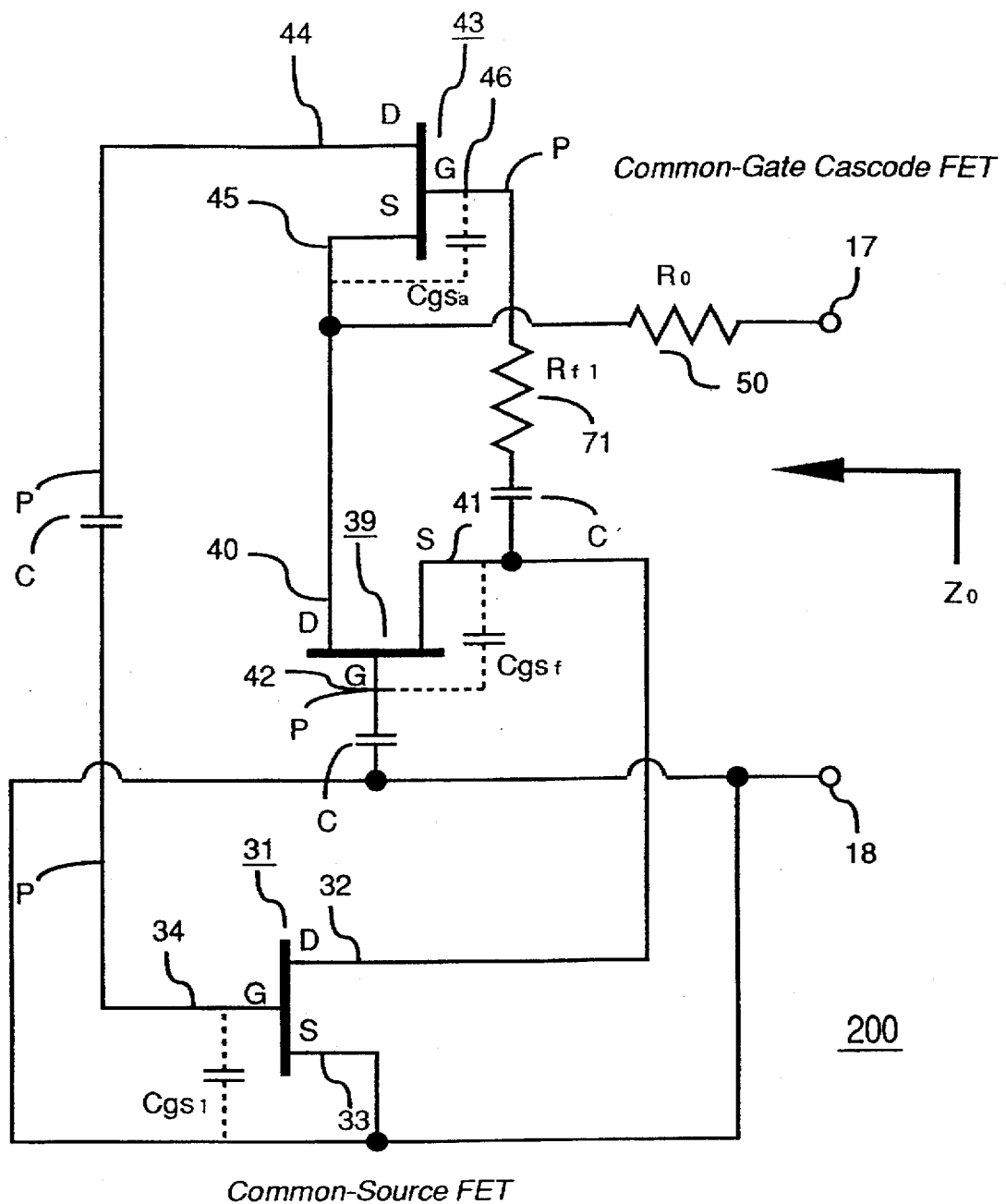
FIG. 20 shows a circuit of an active inductor according to the second embodiment of the present invention.

FIG. 20 shows a circuit of an active inductor 200 according to the second embodiment of the present invention. The elements having the same numerals as in FIG. 16 are the same as described in the description of the first preferred embodiment. In this preferred embodiment, resistor 71 having resistance $R_{f1}$ is added compared to the first preferred embodiment.

In the active inductor 200, unidirectional feedback is provided to common source FET 31 by FET 39 and FET 43 which are common-gate and cascode-connected. Resistor 50 having resistance of $R_0$ is provided between the terminal connecting drain 40 of FET 39 and source 45 of FET 43, and terminal 17, and resistor 71 is inserted between source 41 of FET 39 and gate 46 of FET 43.

The impedance viewed in the direction of FET 39 from terminals 17 and 18 is calculated. Suppose, for simplicity, that FET 31, FET 39, and FET 43 are electrically identical and that their characteristics are determined by the capacitances $C_{gs1}$, $C_{gsf}$, and $C_{gsa}$ of the gate source beneath the gate and the transconductances $g_{m1}$, $g_{mf}$, and $g_{ma}$. By using the above terms, the impedance $Z_0$ is obtained as follows:

$$Z_0 = \frac{1}{\left\{1 - \left(\frac{f}{f_T}\right)^2\right\}} \left\{ -\frac{1}{g_{mf}} - \left(\frac{f}{f_T}\right)^2 R_{f1} + \left(\frac{1}{g_{mf}} + \frac{1}{g_{ma}}\right)\frac{j\omega C_{gsl}}{g_{ml}} \right\} + R_0 \quad (7)$$

Figure 21:
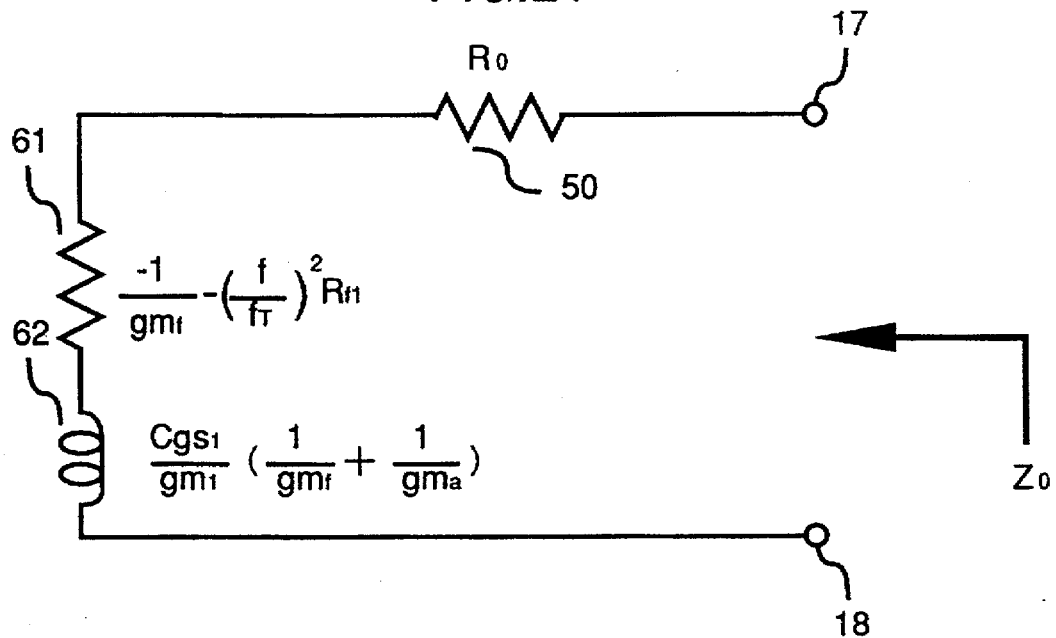
FIG. 21 shows an equivalent circuit of the active inductor according to the embodiment depicted in FIG. 20.

The cut-off frequency $f_T$ of the FETs is $g_{m1}/(2\pi C_{gs1})=g_{mf}/(2\pi C_{gsf})=g_{ma}/(2\pi C_{gsa})$. An equivalent circuit is shown in FIG. 21. As shown in FIG. 21, the active inductor is approximately equivalent with a circuit consisting of a resistor 50 having a resistance $R_0$, resistor 61 having a resistance $-(1/g_{mf}+(f/f_T)^2 R_{f1})$, and inductor 62 having an inductance $((1/g_{mf}+1/g_{ma})C_{gs1}/g_{m1})$ connected in series.

If the resistance $R_0$ of resistor 50 is $(1/g_{mf}+(f/f_T)^2 R_{f1})$ which is positive but equal in absolute value with the resistance of resistor 61, the resistance component in equation (7) becomes zero and as a result the impedance $Z_0$ is determined only by the inductance which means a loss-less inductor is obtained.

Figure 22A:
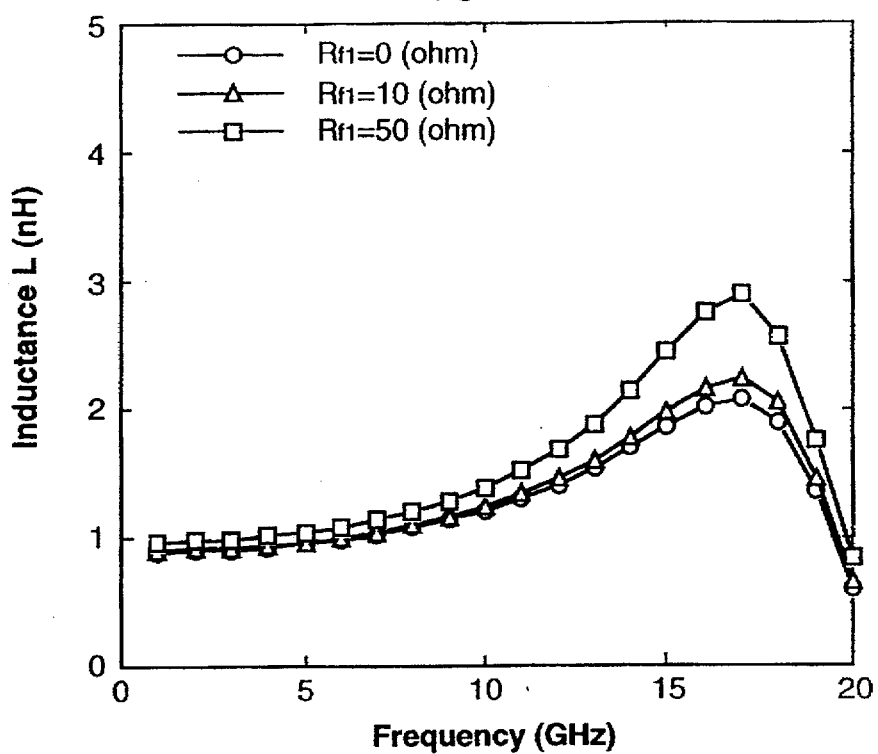
FIG. 22A shows frequency characteristics of the inductance L of the inductor depicted in FIG. 20.
Figure 22B:
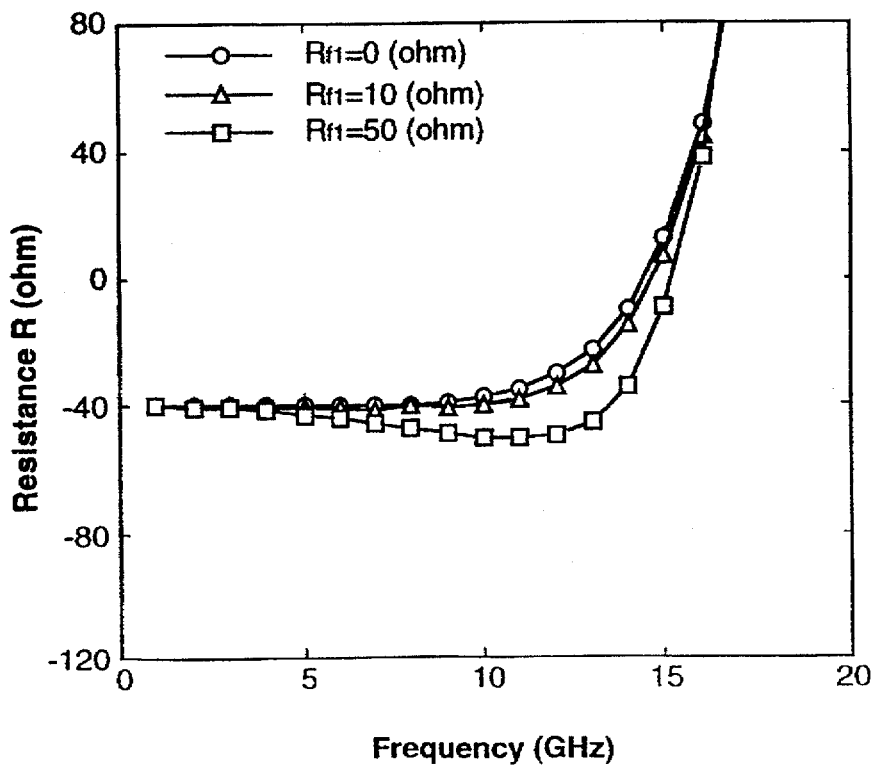
FIG. 22B shows frequency characteristics of the resistance R of the inductor depicted in FIG. 20.

FIGS. 22A and 22B show the frequency characteristics of L and R of the impedance $Z_0$ when an FET having a gate width of 100 microns (transconductance $g_m=20$ mS capacitance $C_{gs}=0.16$ pF, cut-off frequency $f_T=g_m/(2\pi C_{gs})=20$ GHz), and drain conductance $G_d=2$ mS) is employed. The figures show the cases wherein the resistance $R_{f1}$ of the resistor 71 is 0, 10, and 50 ohm. Each FET is supposed to have identical gate width. The resistance $R_0$ of the resistor 50 has the value of zero.

The frequency characteristics of the resistance component R as shown in FIG. 19B depicts that the frequency characteristics of the resistance loss depends on the drain conductance. However, if the resistance $R_{f1}$ is properly determined, the frequency characteristics of the negative resistance varies also according to the resistance $R_{f1}$ of resistor 71, the frequency dependence as shown in FIG. 19B can be compensated. In other words, the frequency dependence of the resistance $(f/f_T)^2 R_{f1}$ of resistor 61 compensates the frequency dependent characteristics of the resistance loss due to the alteration of the drain conductance.

Figure 23:
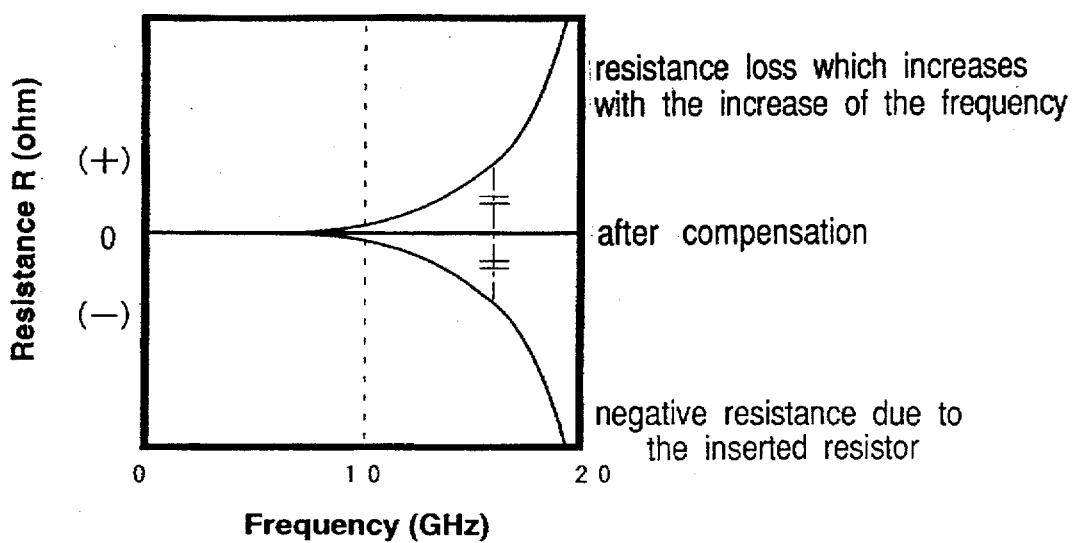
FIG. 23 shows loss compensation by inserted resistance employed in the present invention.

The above stated compensation effect is described in more detail in the following section with reference to FIG. 23. In the figure, the abscissa corresponds to the frequency and the ordinate corresponds to the resistance R of the active inductor. The frequency characteristics of the resistance component as shown in FIG. 19B corresponds to the resistance loss, which increases with the increase of the frequency in FIG. 23, and the resistance is positive in the range over 10 GHz. The frequency characteristics of the resistance $R_{f1}$ of resistor 71 corresponds to the negative resistance due to the inserted resistor in FIG. 23, and is negative in the range over 10 GHz. Therefore, frequency dependence of the resistance loss is compensated and the resistance loss becomes zero, as shown in FIG. 23.

As described above, the resistance loss is compensated by properly determining the resistance $R_{f1}$ of resistor 71. Also, by properly determining the resistance $R_0$ of resistor 50, constant resistance loss (FIG. 18) is compensated and a frequency characteristic having low loss is obtained. Therefore, the above-described active inductor according to the present invention has good characteristics even in higher frequency ranges corresponding to microwaves.

Third Preferred Embodiment

Figure 24:
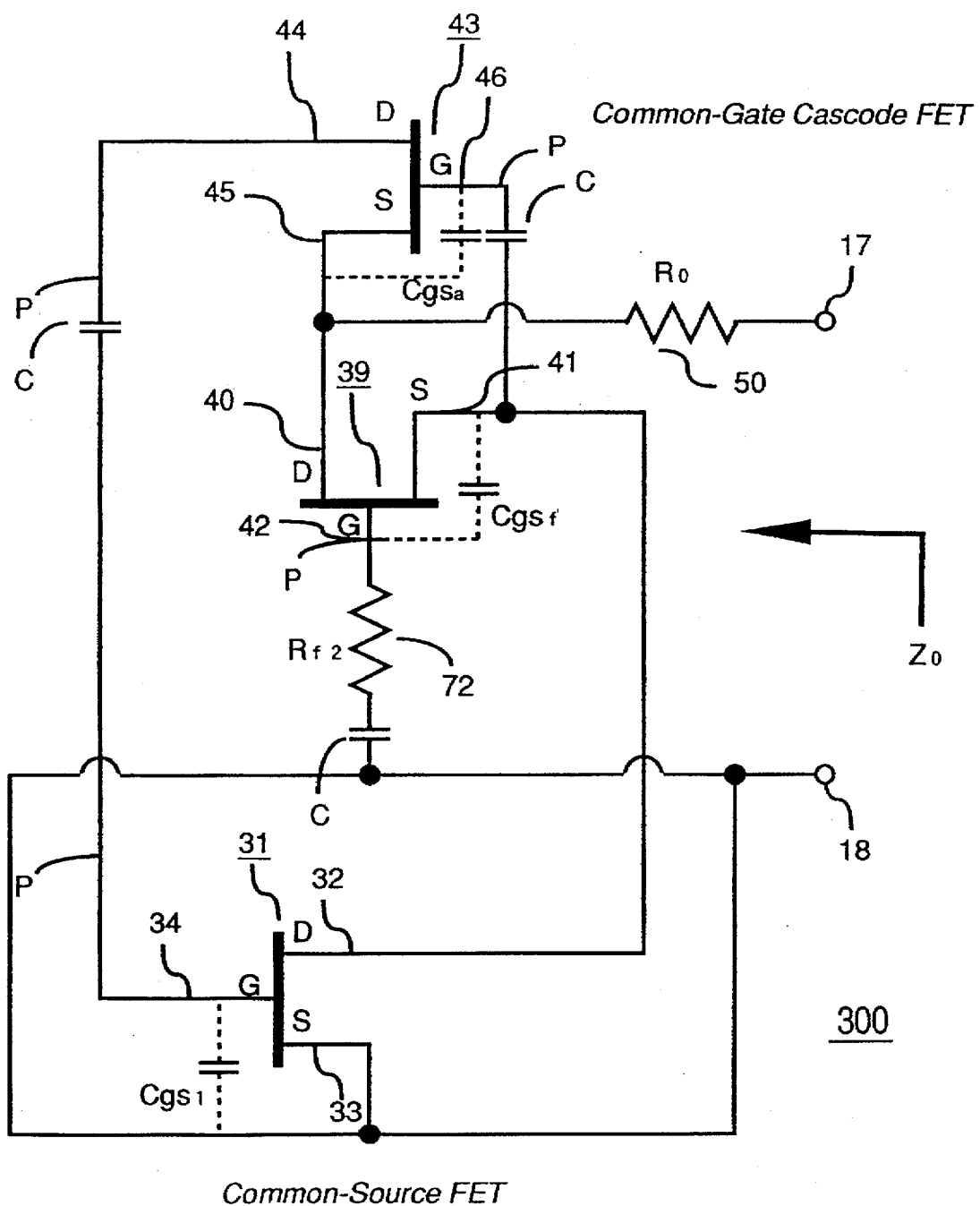
FIG. 24 shows a circuit of an active inductor according to the third embodiment of the present invention.

FIG. 24 shows a circuit of an active inductor 300 according to the third embodiment of the present invention. The elements having the same numerals as in FIG. 20 are the same as those described in the description of the first preferred embodiment, and descriptions thereof are therefore omitted.

In the active inductor 300, unidirectional feedback is provided to common source FET 31 by FET 39 and FET 43, which are common-gate and cascode-connected. Resistor 50 having resistance $R_0$ is provided between the terminal connecting drain 40 of FET 39 and source 45 of FET 43, and terminal 17. Resistor 72 having resistance of $R_{f2}$ is inserted between gate 42 of FET39 and source 33 of FET31.

The impedance $Z_0$ viewed in the direction of FET 39 from terminals 17 and 18 is calculated. Supposing, for simplicity, that FET 31, FET 39 and FET 43 are identical and their characteristics are determined by the capacitances $C_{gs1}$, $C_{gsf}$ and $C_{gsa}$ of the gate source beneath the gate and the transconductances $g_{m1}$, $g_{mf}$ and $g_{ma}$. By using the above terms, the impedance $Z_0$ is obtained as follows:

$$Z_0 = \frac{1}{\left\{1 - \left(\frac{f}{f_T}\right)^2\right\}} \left\{ -\frac{1}{g_{mf}} - \left(\frac{f}{f_T}\right)^2 R_{f2} + \left(\frac{1}{g_{mf}} + \frac{1}{g_{ma}} R_{f2}\right)\frac{j\omega C_{gsl}}{g_{ml}} \right\} + R_0 \quad (8)$$

Figure 25:
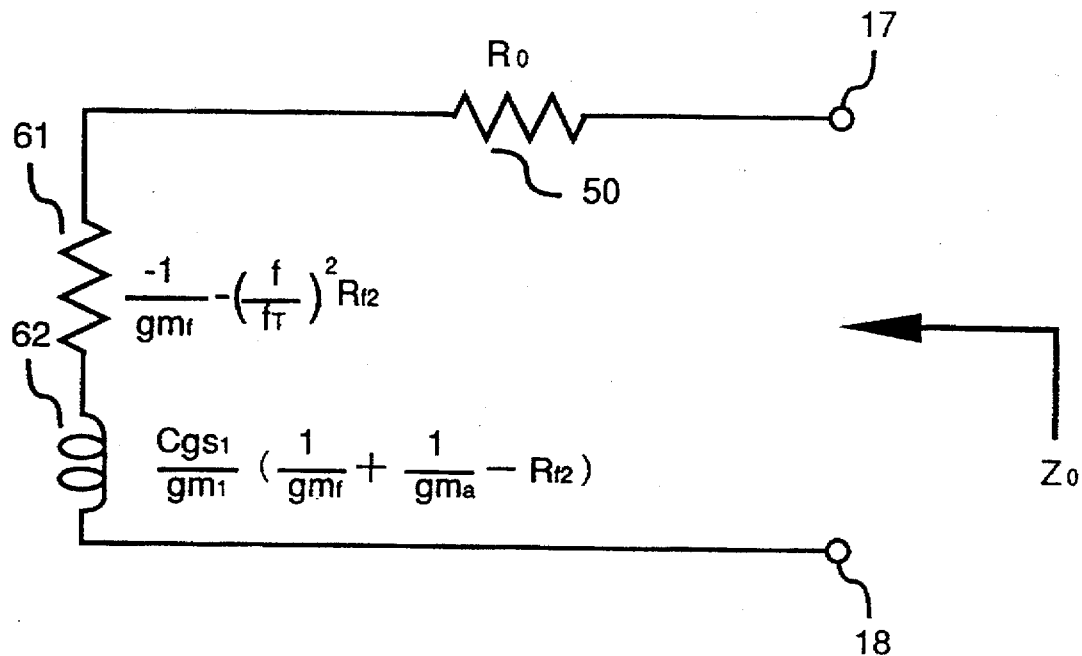
FIG. 25 shows an equivalent circuit of the active inductor according to the embodiment depicted in FIG. 24.

The cut-off frequency $f_T$ of the FETs is $g_{m1}/(2\pi C_{gs1})=g_{mf}/(2\pi C_{gsf})=g_{ma}/(2\pi C_{gsa})$. An equivalent circuit is shown in FIG. 25. As shown in FIG. 25, active inductor 300 is approximately equivalent with a circuit consisting of a resistor 50 having a resistance $R_0$, resistor 61 having a resistance $-(1/g_{mf}+(f/f_T)^2 R_{f2})$, and inductor 62 having an inductance $((1/g_{mf}+1/g_{ma}-R_{f2})C_{gs1}/g_{m1})$ connected in series.

If the resistance $R_0$ of resistor 50 is $(1/g_{mf}+(f/f_T)^2 R_{f2})$ which is positive but equal in absolute value with the resistance of resistor 61, the resistance component in equation (8) becomes zero, and as a result, the impedance $Z_0$ is determined only by the inductance, which means a loss-less inductor is obtained.

Figure 26A:
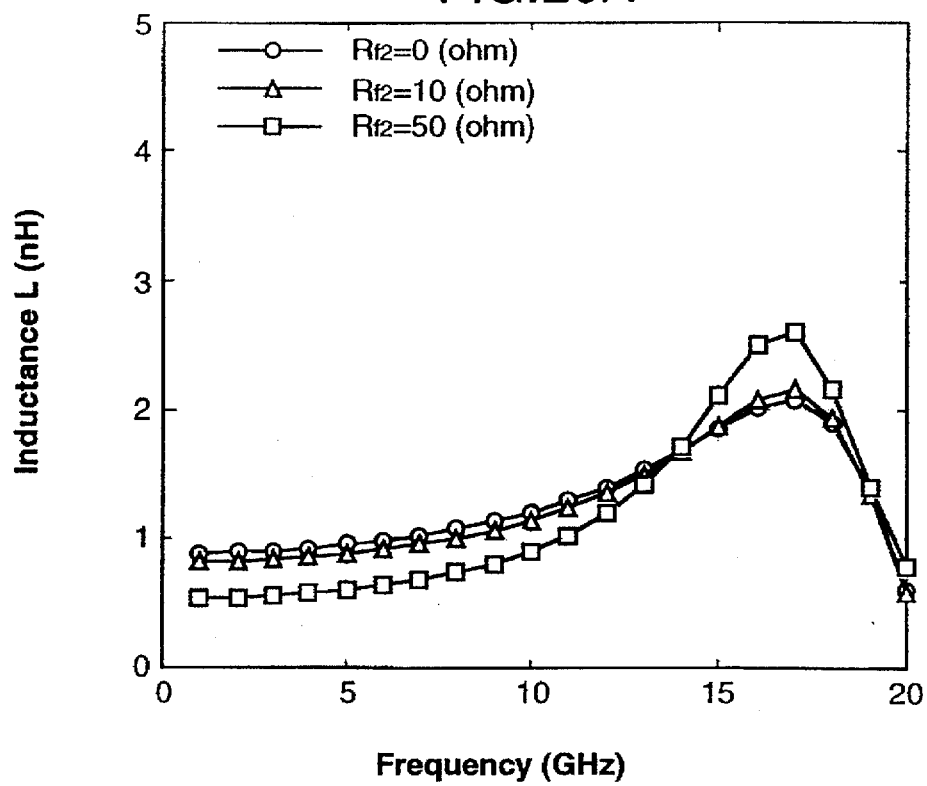
FIG. 26A shows frequency characteristics of the inductance L of the inductor depicted in FIG. 24.
Figure 26B:
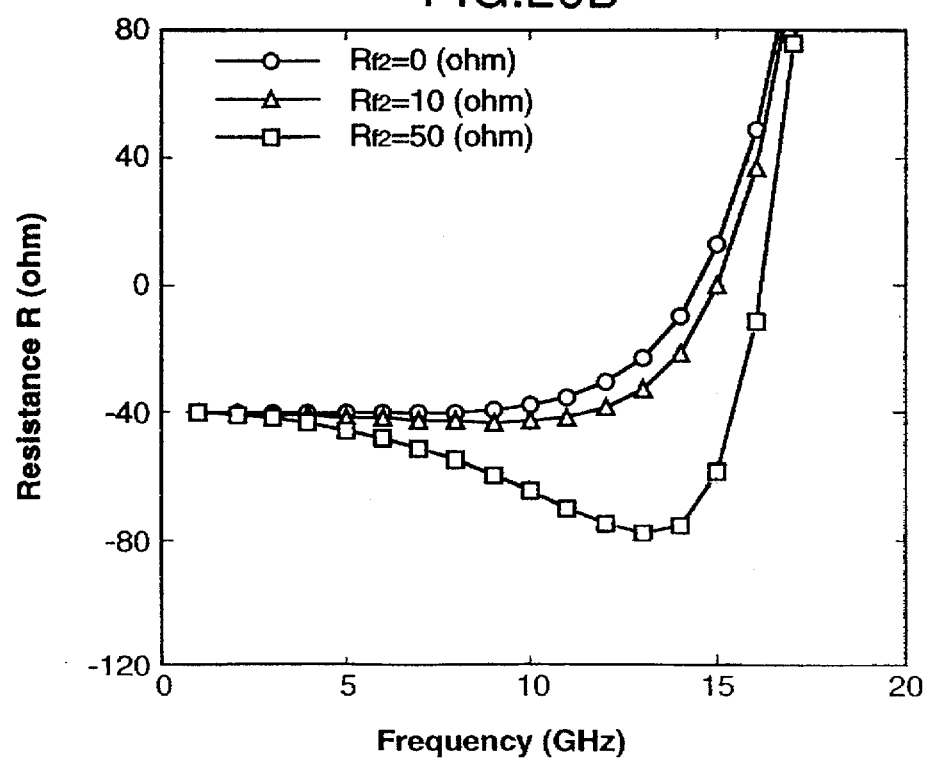
FIG. 26B shows frequency characteristics of the resistance R of the inductor depicted in FIG. 24.

FIGS. 26A and 26B show the frequency characteristics of L and R of the impedance $Z_0$ when an FET having a gate width of 100 microns (transconductance $g_m=20$ mS capacitance $C_{gs}=0.16$ pF, cut-off frequency $f_T=g_m/(2\pi C_{gs})=20$ GHz, and drain conductance $G_d=2$ mS) is employed. The figures show the cases wherein the resistance $R_{f2}$ of the resistor 72 is 0, 10, and 50 ohm. Each FET is supposed to have identical gate width. The resistance $R_0$ of the resistor 50 has the value of zero.

The frequency characteristics of the resistance component R shown in FIG. 19B show that the frequency characteristics of the resistance loss depends on the drain conductance. However, if the resistance $R_{f2}$ of resistor 72 is properly determined, the frequency characteristics of the negative resistance varies also according to the resistance $R_{f2}$, and the frequency dependence, as shown in FIG. 19B, can be compensated as described in the second preferred embodiment.

As described above, the resistance loss is compensated by properly determining the resistance $R_{f2}$ of resistor 72. Also, by properly determining the resistance $R_O$ of resistor 50, constant resistance loss (FIG. 18) is compensated and a frequency characteristic having low loss is obtained. Therefore, the above-described active inductor according to the present invention has good characteristics even in higher frequency ranges corresponding to microwaves.

Fourth Preferred Embodiment

Figure 27:
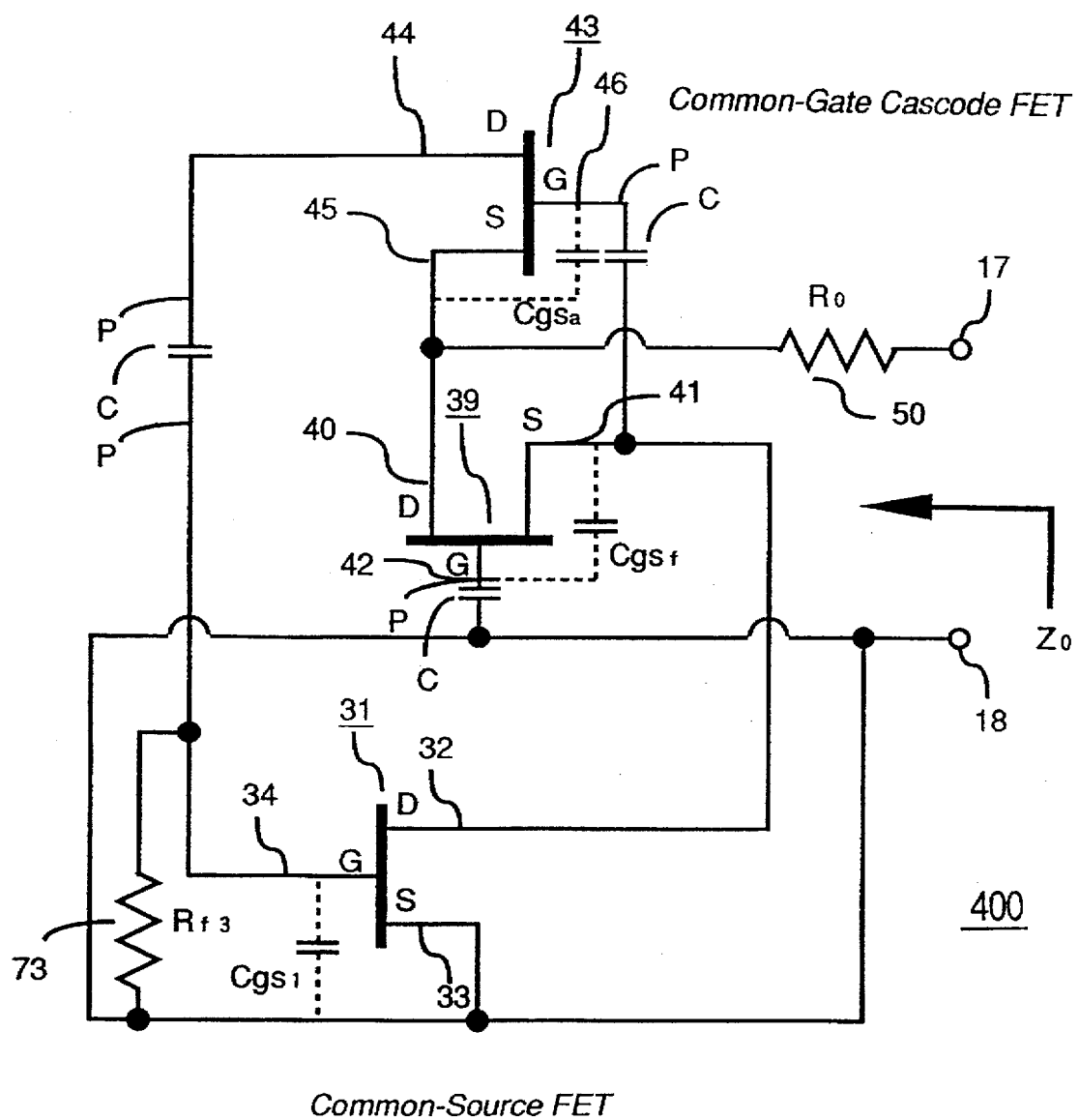
FIG. 27 shows a circuit of an active inductor according to the fourth embodiment of the present invention.

FIG. 27 shows a circuit of an active inductor 400 according to the fourth embodiment of the present invention. The elements having the same numerals as those in FIG. 20 are the same as those described in the description of the first preferred embodiment, and descriptions thereof are therefore omitted.

In the active inductor 400, unidirectional feedback is provided to common source FET 31 by FET 39 and FET 43 which are common-gate and cascode-connected. Resistor 50 having resistance $R_O$ is provided between the terminal connecting drain 40 of FET 39 and source 45 of FET 43, and terminal 17. Resistor 73 having resistance of $R_{f3}$ is inserted between gate 34 and source 33 of FET 31.

Figure 28:
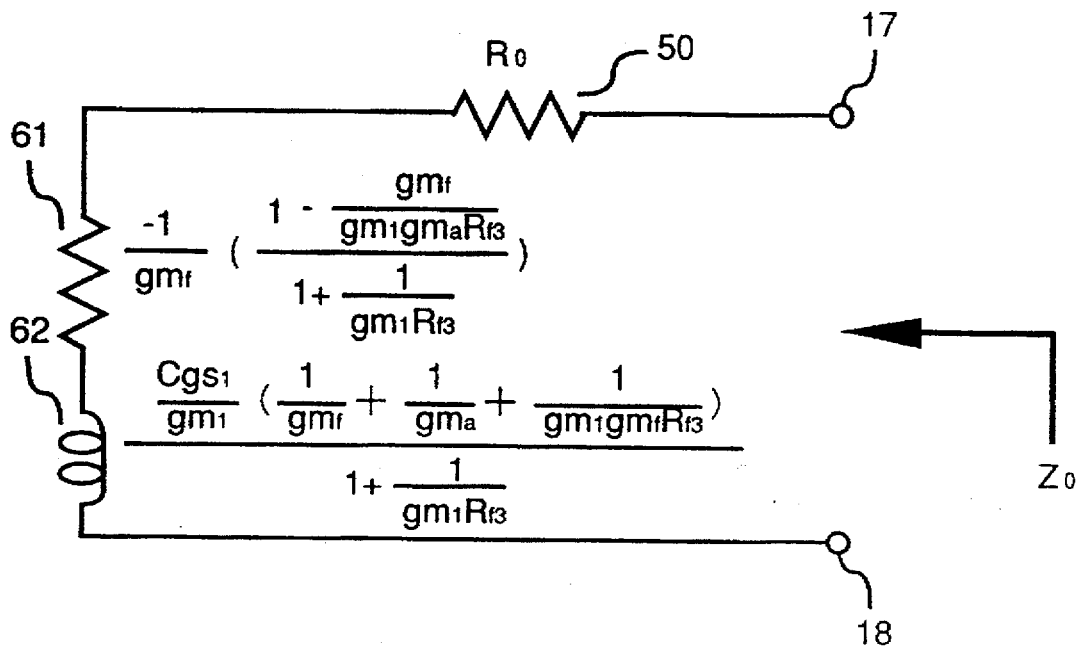
FIG. 28 shows an equivalent circuit of the active inductor according to the embodiment depicted in FIG. 27.

The impedance $Z_O$ viewed in the direction of FET 39 from terminals 17 and 18 is calculated. Supposing, for simplicity, that FET 31, FET 39 and FET 43 are electrically identical and that their characteristics are determined by the capacitances $C_{gs1}$, $C_{gsf}$ and $C_{gsa}$ of the gate source beneath the gate and the transconductances $g_{m1}$, $g_{mf}$ and $g_{ma}$. An equivalent circuit for the frequencies as low as several GHz is shown in FIG. 28.

If the resistance $R_{f3}$ of resistor 73 is $(g_{mf}/(g_{m1}g_{ma}))$, the resistance of resistor 61 becomes zero. Therefore, if the resistance $R_O$ of the resistor 50 is zero, the resistance component is negligible and the impedance $Z_O$ of the active inductor is determined by the inductance only.

Figure 29A:
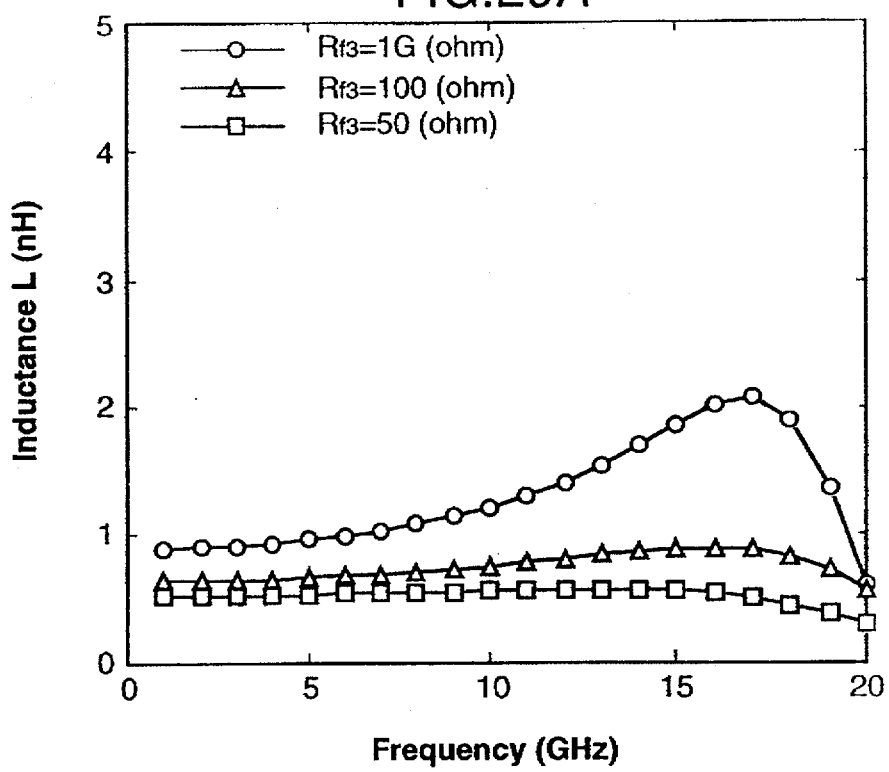
FIG. 29A shows frequency characteristics of the inductance L of the inductor depicted in FIG. 27.
Figure 29B:
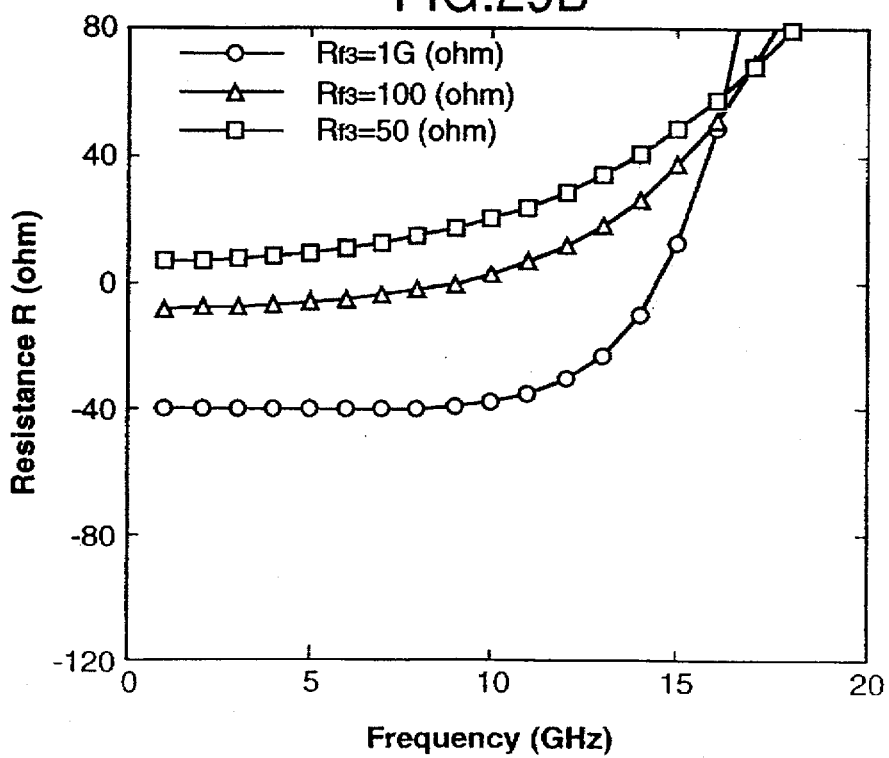
FIG. 29B shows frequency characteristics of the resistance R of the inductor depicted in FIG. 27.

FIGS. 29A and 29B show the frequency characteristics of L and R of the impedance $Z_O$ when an FET having a gate width of 100 microns (transconductance $g_m$=20 mS, capacitance $C_{gs}$=0.16 pF, cut-off frequency $f_T$=$g_m/(2\pi C_{gs})$=20 GHz, and drain conductance $G_d$=2 mS) is employed. These figures show the cases wherein the resistance $R_{f3}$ of resistor 73 is 50, 100, and 1 G ohm. Each FET is supposed to have identical gate width. The resistance $R_O$ of the resistor 50 has the value of zero.

The frequency characteristics of the resistance component R, shown in FIG. 19B, show that the frequency characteristics of the resistance loss depends on the drain conductance. However, if the resistance $R_{f3}$ of resistor 73 is properly determined, the frequency characteristics of the negative resistance also varies according to the resistance $R_{f3}$, and the frequency dependence as shown in FIG. 19B can be compensated as described in the second preferred embodiment.

As described above, the resistance loss is compensated by properly determining the resistance $R_{f3}$ of resistor 73. Also, by properly determining the resistance $R_O$ of resistor 50, constant resistance loss (FIG. 18) is compensated and a frequency characteristic having low loss is obtained. Therefore, the above-described active inductor according to the present invention has good characteristics even in higher frequency ranges corresponding to microwaves.

Fifth Preferred Embodiment

Figure 30:
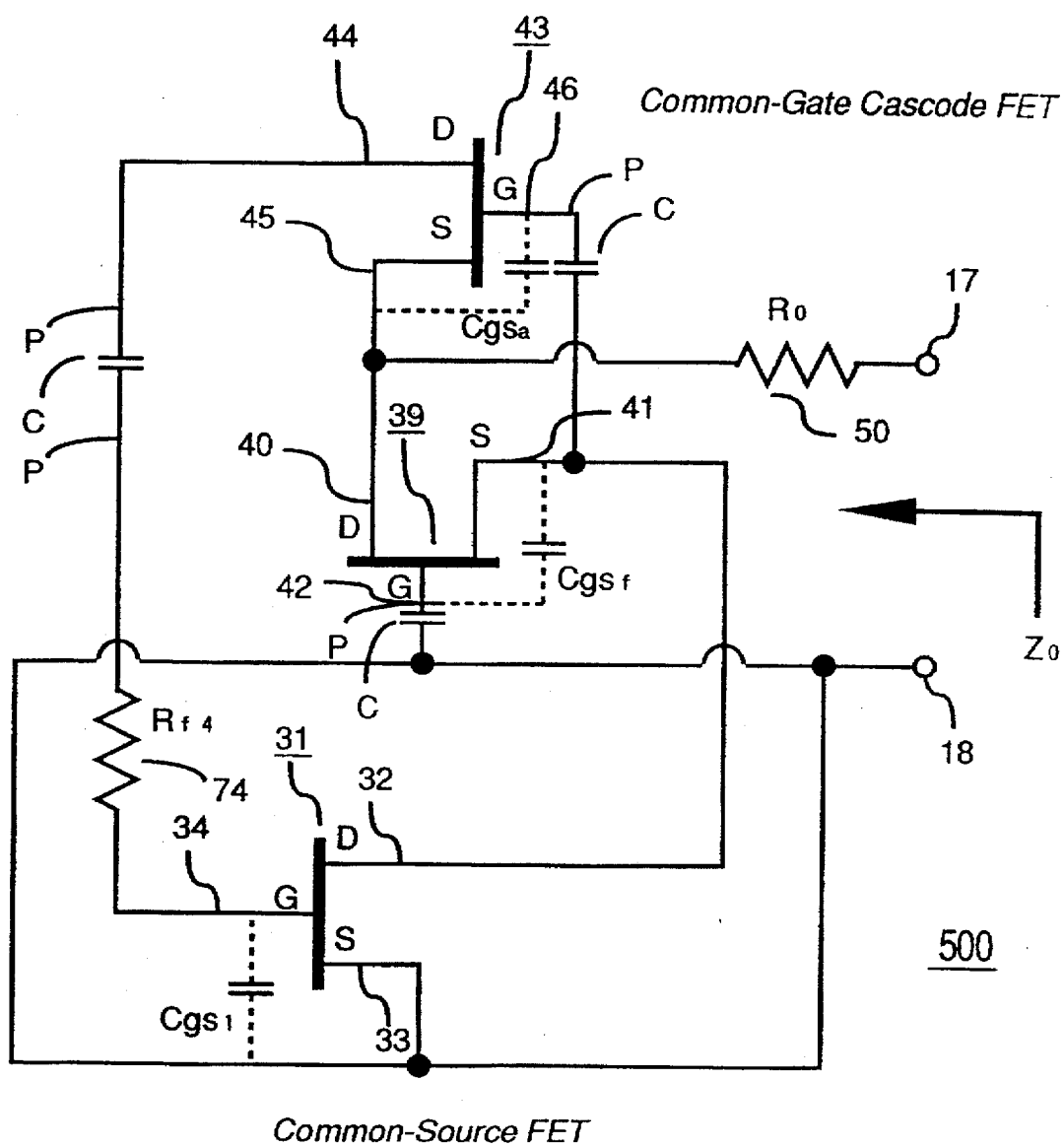
FIG. 30 shows a circuit of an active inductor according to the fifth embodiment of the present invention.

FIG. 30 shows a circuit of an active inductor 500 according to the fifth embodiment of the present invention. The elements having the same numerals as in FIG. 20 are the same as those described in the description of the first preferred embodiment and descriptions thereof are therefore omitted.

In the active inductor 500, unidirectional feedback is provided to common source FET 31 by FET 39 and FET 43 which are common-gate and cascode-connected. Resistor 50 having resistance $R_O$ is provided between the terminal connecting drain 40 of FET 39 and source 45 of FET 43, and terminal 17. Resistor 74 having resistance $R_{f4}$ is inserted between drain 44 of FET 43 and gate 34 of FET 31.

Figure 31A:
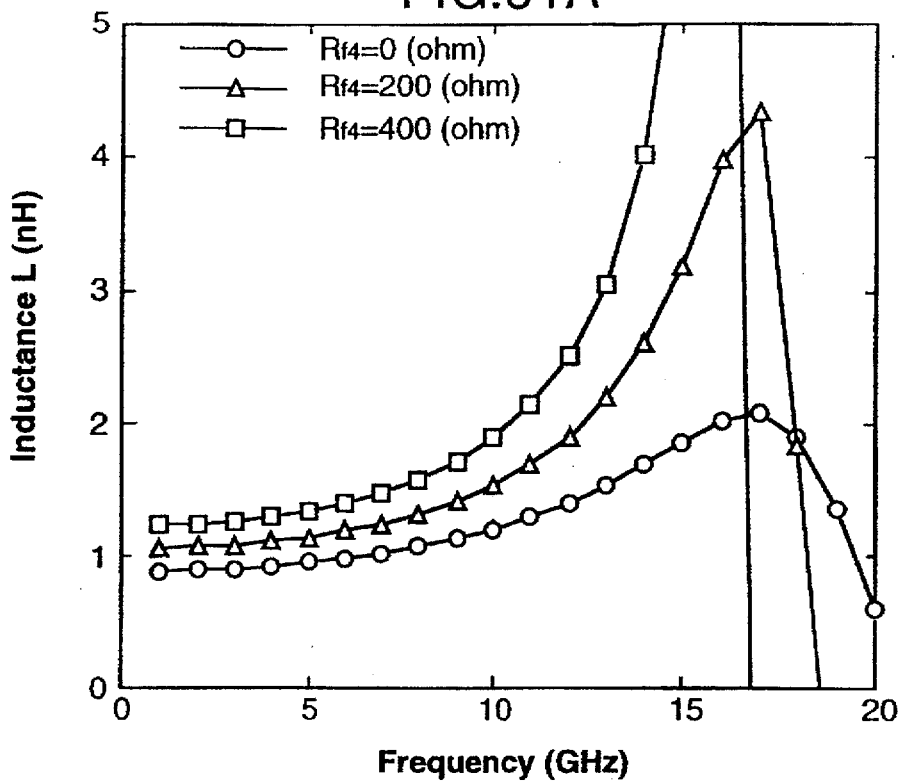
FIG. 31A shows frequency characteristics of the inductance L of the inductor depicted in FIG. 30.
Figure 31B:
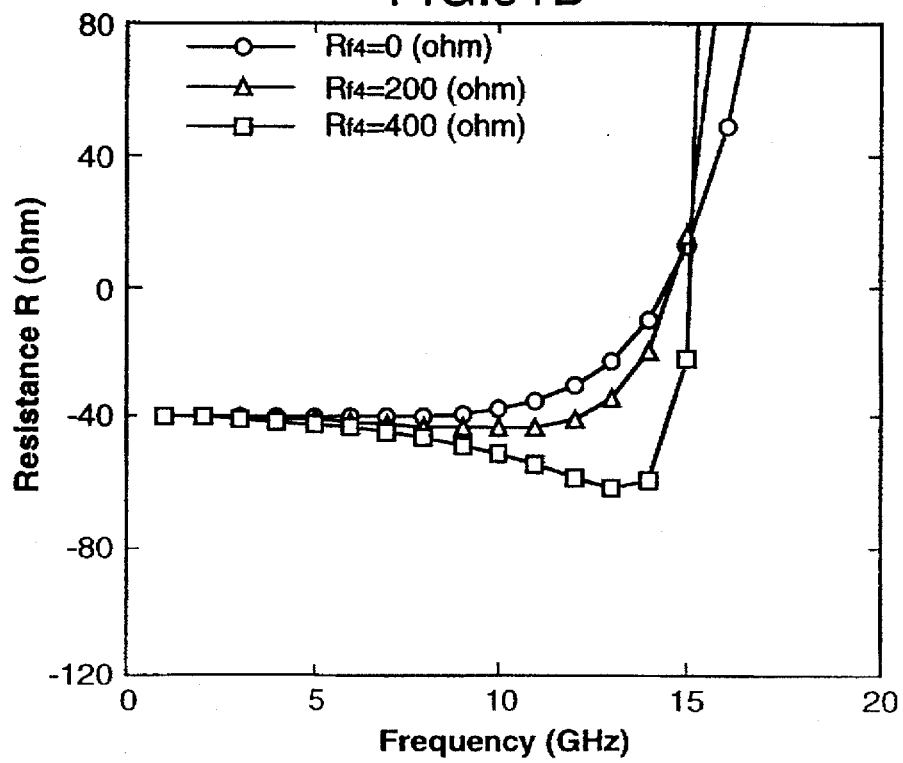
FIG. 31B shows frequency characteristics of the resistance R of the inductor depicted in FIG. 30.

FIGS. 31A and 31B show the frequency characteristics of L and R of the impedance $Z_O$ when an FET having a gate width of 100 microns (transconductance $g_m$=20 mS, capacitance $C_{gs}$=0.16 pF, cut-off frequency $f_T$=$g_m/(2\pi C_{gs})$=20 GHz, and drain conductance $G_d$=2 mS) is employed. These figures show the cases wherein the resistance $R_{f4}$ of resistor 74 is 0, 200, and 400 ohm. Each FET is supposed to have identical gate width. The resistance $R_O$ of the resistor 50 has the value of zero.

The frequency characteristics of the resistance component R shown in FIG. 19B show that the frequency characteristics of the resistance loss depend on the drain conductance. However, if the resistance $R_{f4}$ of resistor 74 is properly determined, the frequency characteristics of the negative resistance varies also according to the resistance $R_{f4}$ the frequency dependence, as shown in FIG. 19B, can be compensated as described in the second preferred embodiment.

As described above, the resistance loss is compensated by properly determining the resistance $R_{f4}$ of resistor 74. Also, by properly determining the resistance $R_O$ of resistor 50, constant resistance loss (FIG. 18) is compensated and a frequency characteristic having low loss is obtained. Therefore, the above-described active inductor according to the present invention has good characteristics even in higher frequency ranges corresponding to microwaves.

As described above, because the active inductor according to the present invention essentially consists only of active elements and does not need a resistor or capacitor, the number of elements is reduced and the circuit can be miniaturized. Furthermore, the self resonance frequency becomes higher than that of active inductors having passive elements.

In addition, because the transconductance $g_m$ of the FET varies by varying the voltage imposed at point P which is connected to the FET gate, the inductance of the active inductor can be varied, which means that a tunable active inductor wherein the inductance is tunable by varying the voltage, is provided.

Modification 1

The circuit configuration described as the first to the fifth embodiments of the present invention may be modified as far as the modified configuration is expressed by the similar equivalent circuit for lower frequency ranges. One example of such modification is that the common source FET 31 is replaced with a common source FET and a common gate FET which are cascode-connected. FIGS. 32 through 36 show such modifications of first through fifth preferred embodiments, respectively.

Figure 32:
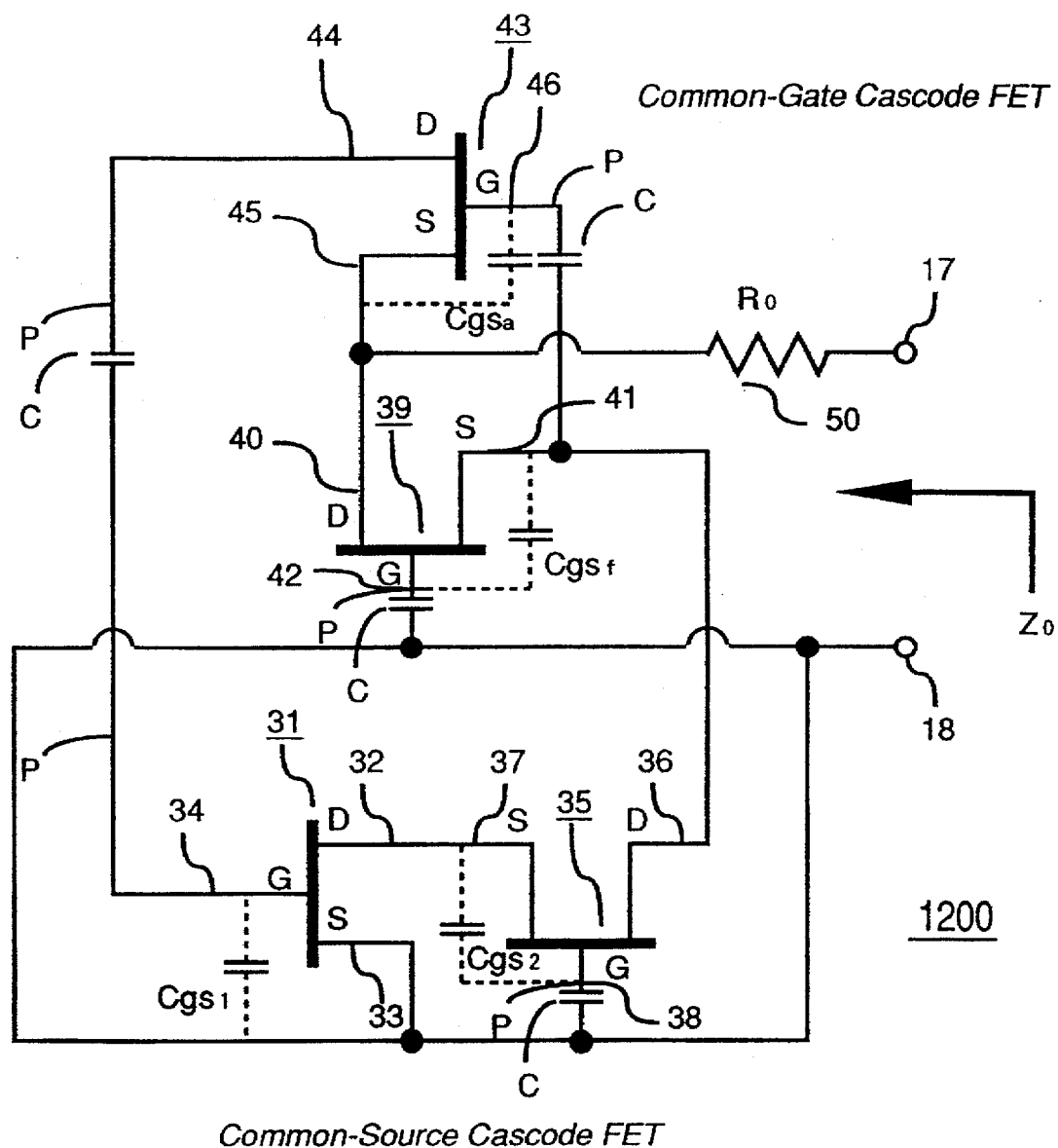
FIG. 32 shows an embodiment wherein modification 1 of the present invention is employed in the first embodiment.
Figure 33:
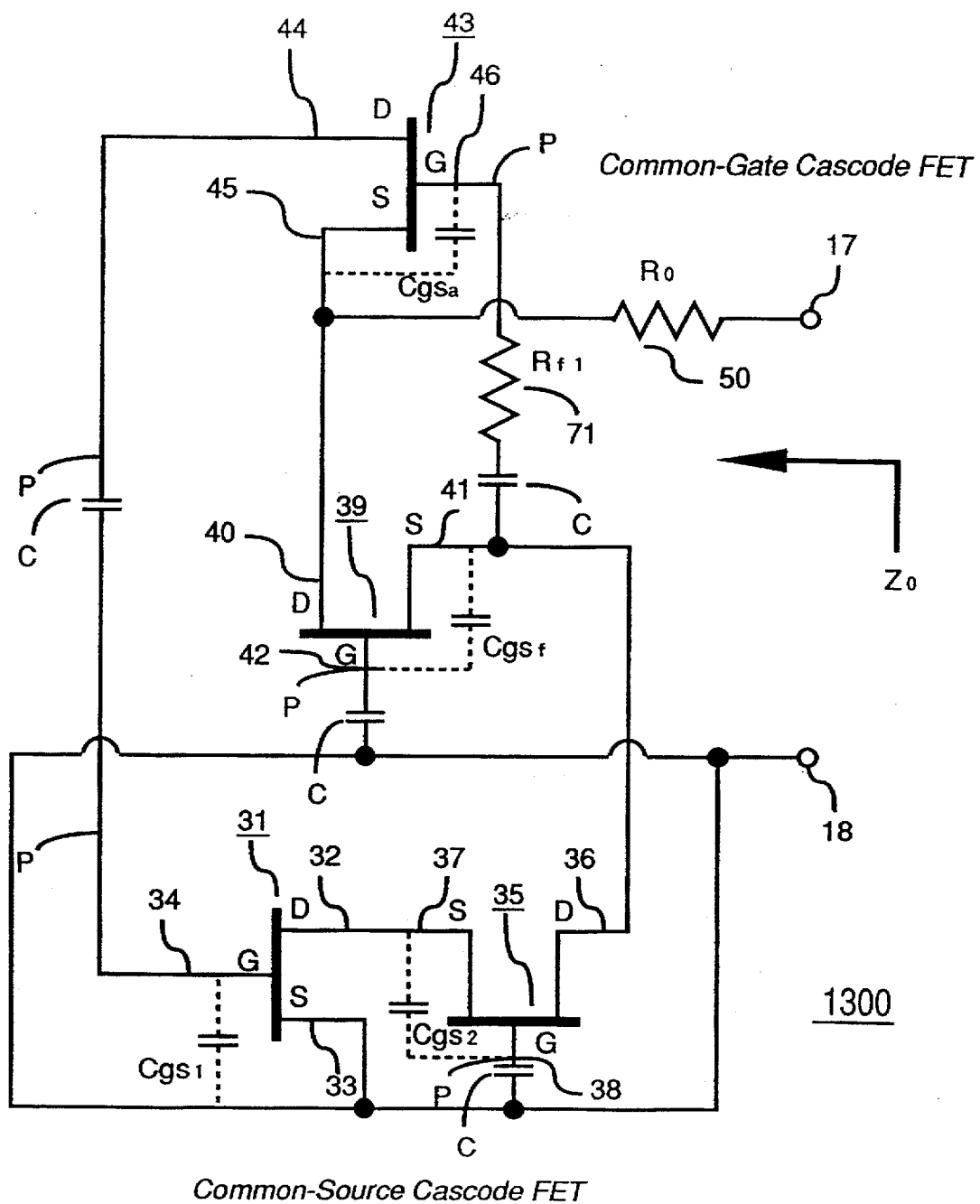
FIG. 33 shows an embodiment wherein modification 1 of the present invention is employed in the second embodiment.
Figure 34:
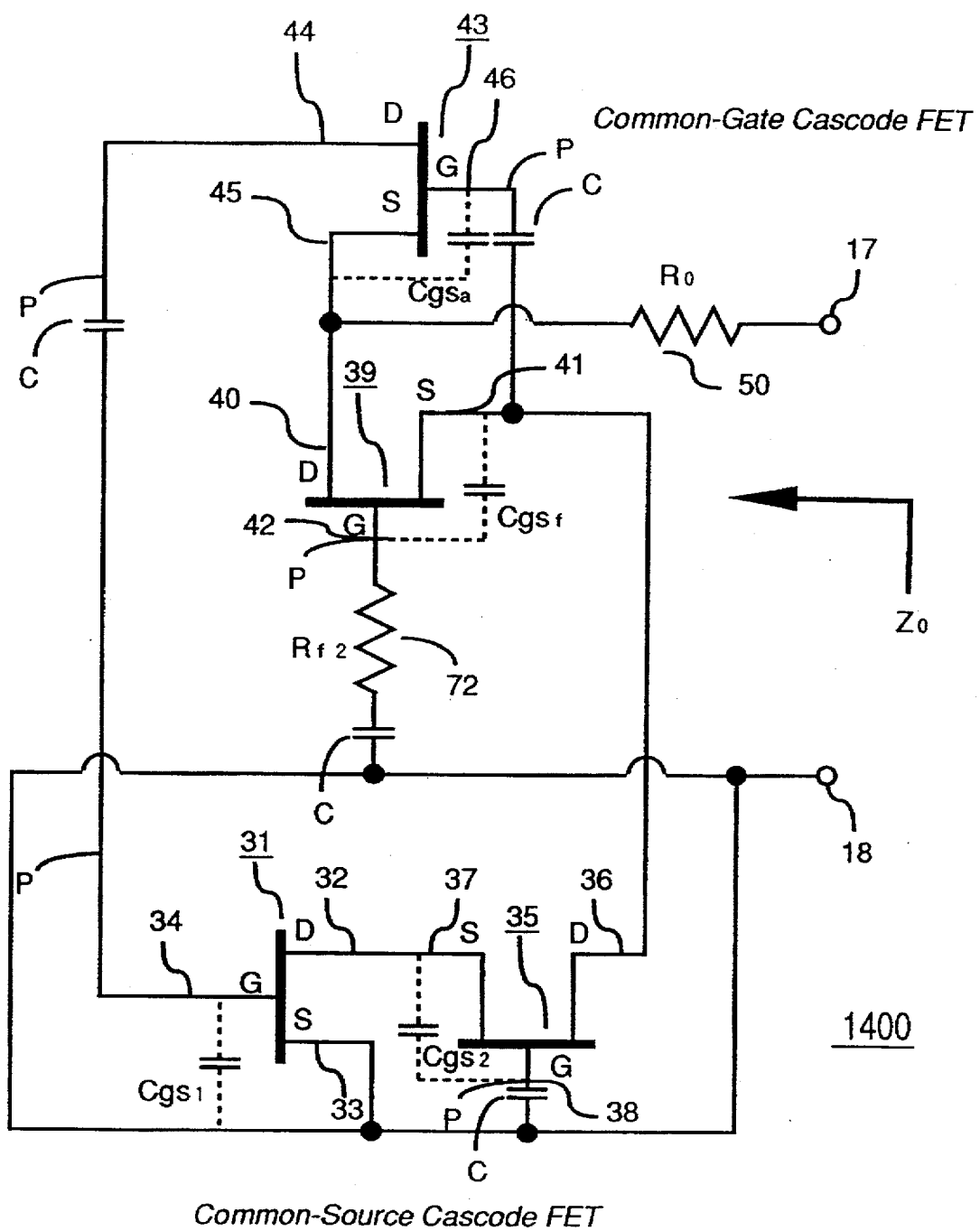
FIG. 34 shows an embodiment wherein modification 1 of the present invention is employed in the third embodiment.
Figure 35:
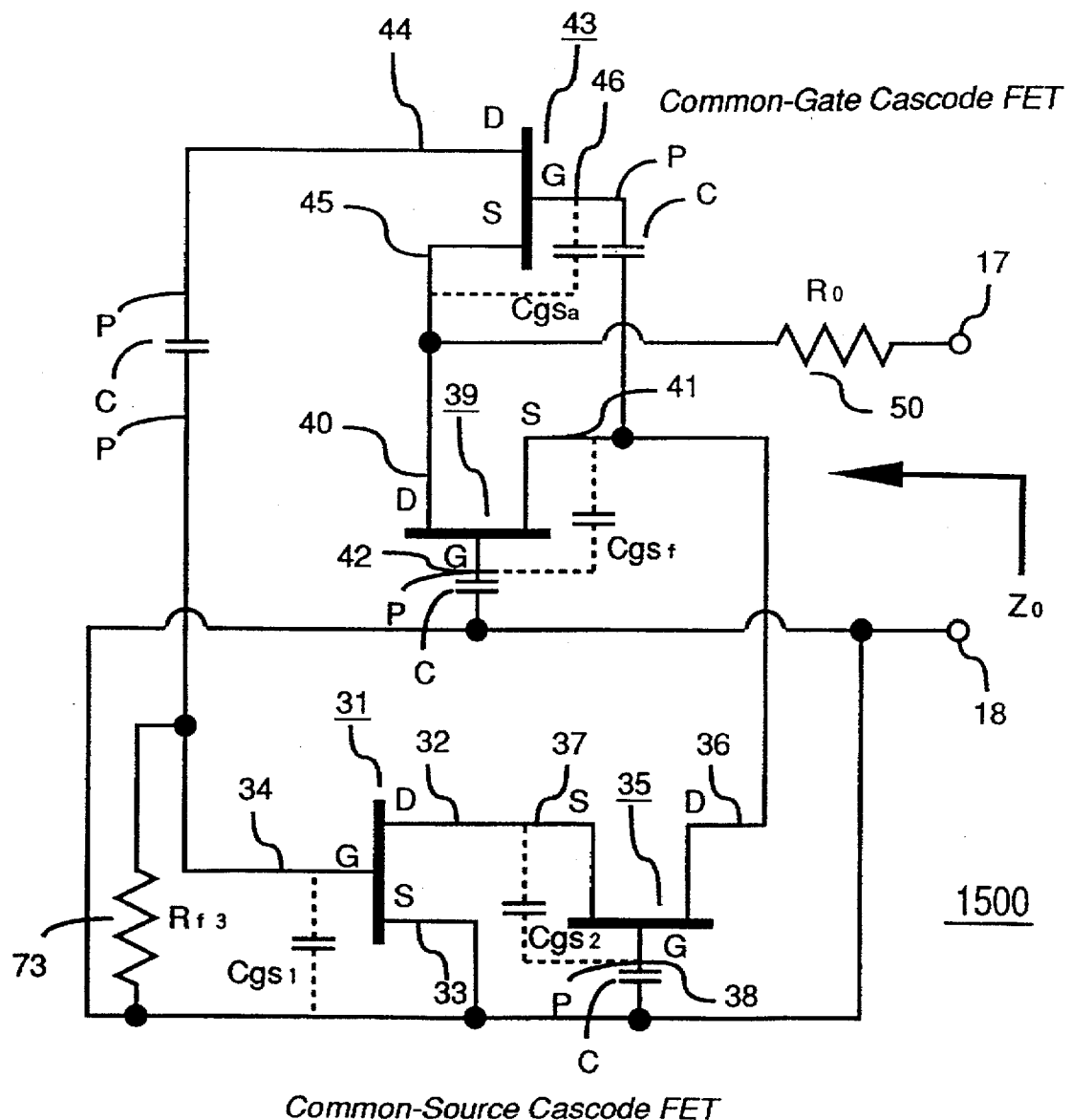
FIG. 35 shows an embodiment wherein modification 1 of the present invention is employed in the fourth embodiment.
Figure 36:
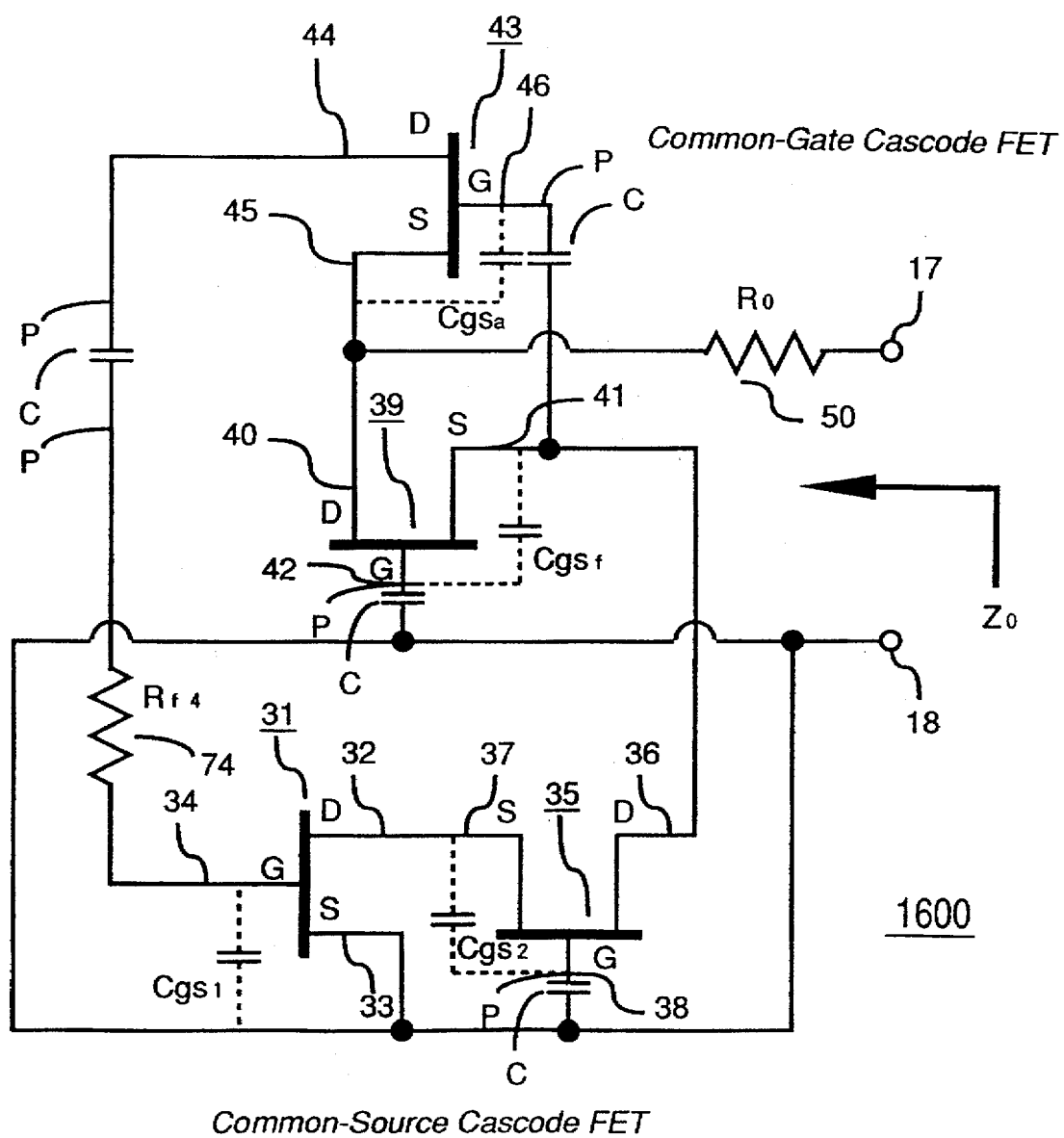
FIG. 36 shows an embodiment wherein modification 1 of the present invention is employed in the fifth embodiment.

In the modification of the first embodiment, as shown in FIG. 32, an FET 35 is added compared to the active inductor shown in FIG. 16, and common source FET 31 is replaced by common source cascode FETs consisting of FET 31 and FET 35.

Further FETs may be added to FET 35 to increase the common source cascode stages.

The effects as described in connection with the first to fifth embodiments can also be obtained by modification 1 described above.

Modification 2

Figure 37:
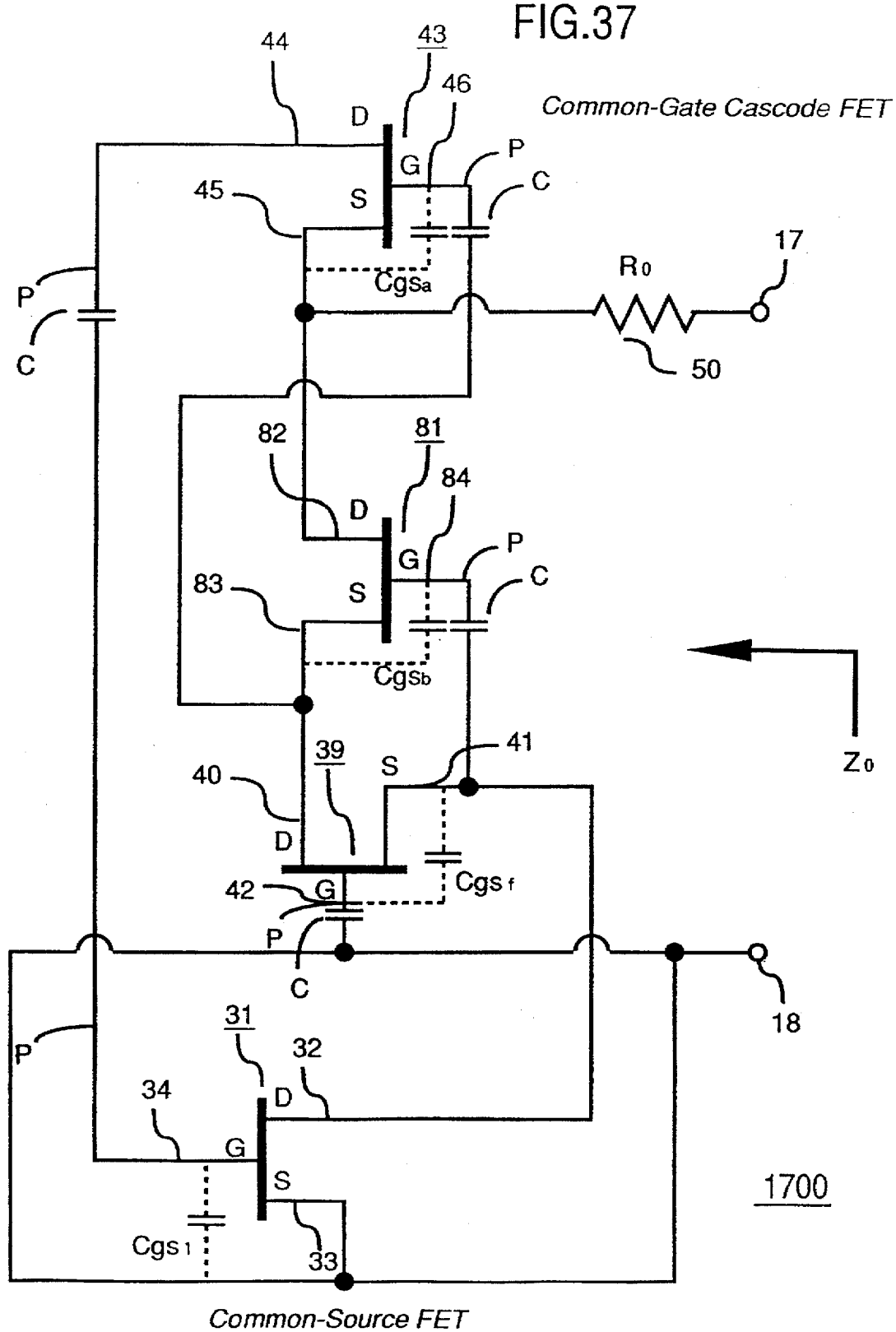
FIG. 37 shows an embodiment wherein modification 2 of the present invention is employed in the first embodiment.

A second modification having a similar equivalent circuit for lower frequency ranges is to cascode-connect the FET 39, which consists of common gate cascode FETs, in the above stated preferred embodiments. FIG. 37 shows an example of such modification applied to the first preferred embodiment, shown in FIG. 16. As shown in the figure, a new FET 81 is inserted in drain 40 of FET 39 and source 45 of FET 43, source 83 of FET 81 is connected to both drain 40 of FET 39 and gate 46 of FET 43, and gate 84 and drain 82 of FET 81 are source 41 of FET 39 and source 45 of FET 43, respectively.

Suppose, for the simplicity of analysis, that the characteristics of FET 81 are electrically identical to those of FET 31, FET 39 and FET 43. The characteristics of the circuit are determined only by the capacitance $C_{gsb}$ of the gate source beneath the gate and transconductance $g_{mb}$ and the cut-off frequency $f_T$ of the FETs is expressed as $f_T = g_{m1}(2\pi C_{gs1}) = g_{m1}(2\pi C_{gsf}) = g_{ma}/(2\pi C_{gsa}) = g_{mb}/(2\pi C_{gsb})$. The active inductor as shown in FIG. 37 is approximately equivalent to a circuit wherein a resistor having resistance $R_0$, a resistor having negative resistance $-(1/g_{mf}+1/g_{mb})$ and an inductor having an inductance $((1/g_{mb}+1/g_{ma})C_{gs1}/g_{m1})$ are connected in series. Therefore, if the transconductance $g_{mb}$ coincides with $g_{mf}$, the circuit is identical to the equivalent circuit shown in FIG. 17, which is equivalent with the circuit shown in FIG. 16 except that the negative resistance is doubled. The greater negative resistance is favorable when the active inductor is used in an oscillator.

The same modification is applicable for the second to fifth embodiments. Further FETs can be added to FET 81 and increase the cascode connection stages.

The effects described in connection with the first through fifth embodiments are obtained also by modification 2.

Modification 3

Figure 38:
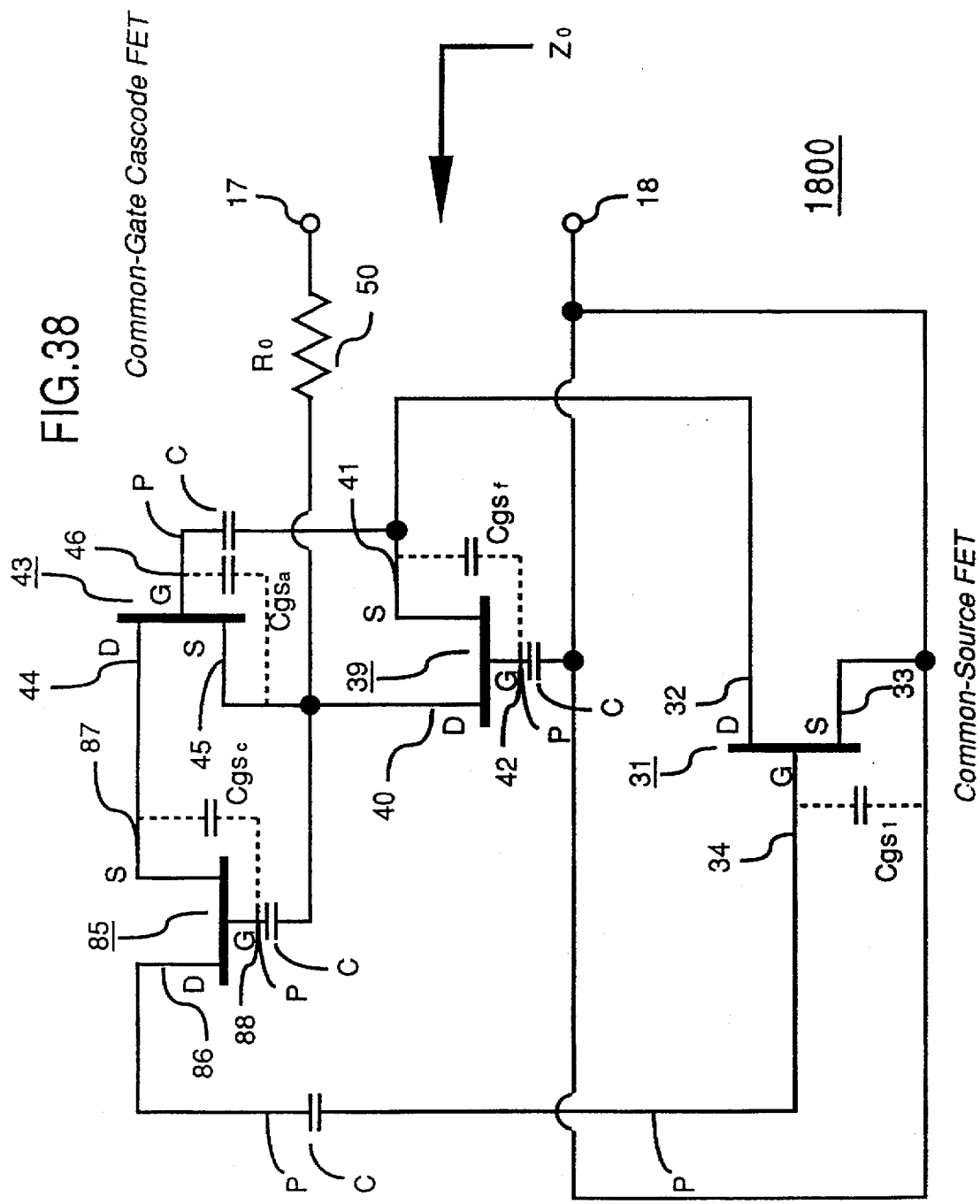
FIG. 38 shows an embodiment wherein modification 3 of the present invention is employed in the first embodiment.
Figure 39:
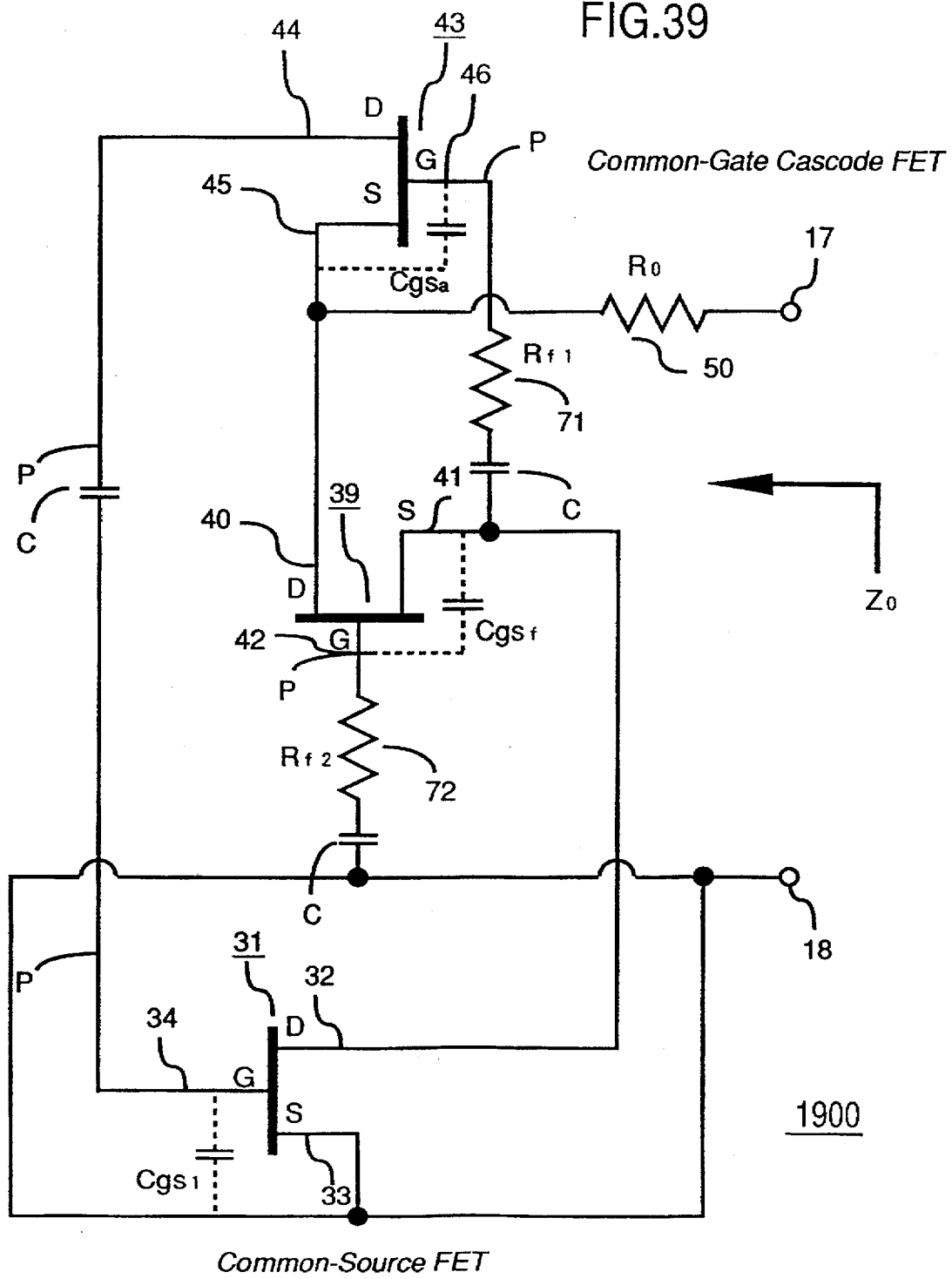
FIG. 39 shows a circuit of an embodiment wherein the embodiments 2 and 3 are combined.

A third modification having a similar equivalent circuit for lower frequency ranges is to cascode-connect the FET 43, which consists of common gate cascode FETs. FIG. 38 shows this modification as applied to the first preferred embodiment (FIG. 16). As shown in the figure, a new FET 85 is inserted between drain 44 of FET 43 and gate 34 of FET 31, and source 87 and gate 88 of FET 85 is connected to drain 44 and source 45 of FET 43 respectively, and drain 86 of FET 85 is connected to gate 34 of FET 31.

The same modification is applicable for the second to fifth embodiments. Further FETs can be added to FET 85 and increase the cascode stages. The effects described in connection with the first through fifth embodiments are obtained also by modification 3.

Other modifications are possible as far as the modified circuit is equivalent with the above described circuits for lower frequency ranges.

Modification 4

In the above-described preferred embodiments 2 through 5, one of the resistors 71 through 74 having resistance $R_{f1}$ through $R_{f4}$ is inserted in the circuit to provide a negative resistance. However, more than one of the above-described resistors can be used at the same time.

FIGS. 39 through 44 show modifications wherein two resistors are used. The modification shown in FIG. 39 corresponds to a combination of the second and third embodiments. In the modification, as shown in the figure, resistor 71 having resistance $R_{f1}$ is inserted between source 41 of FET 39 and gate 46 of FET 43, and resistor 72 having resistance $R_{f2}$ is inserted between gate 42 of FET 39 and source 33 of FET 31.

Figure 40:
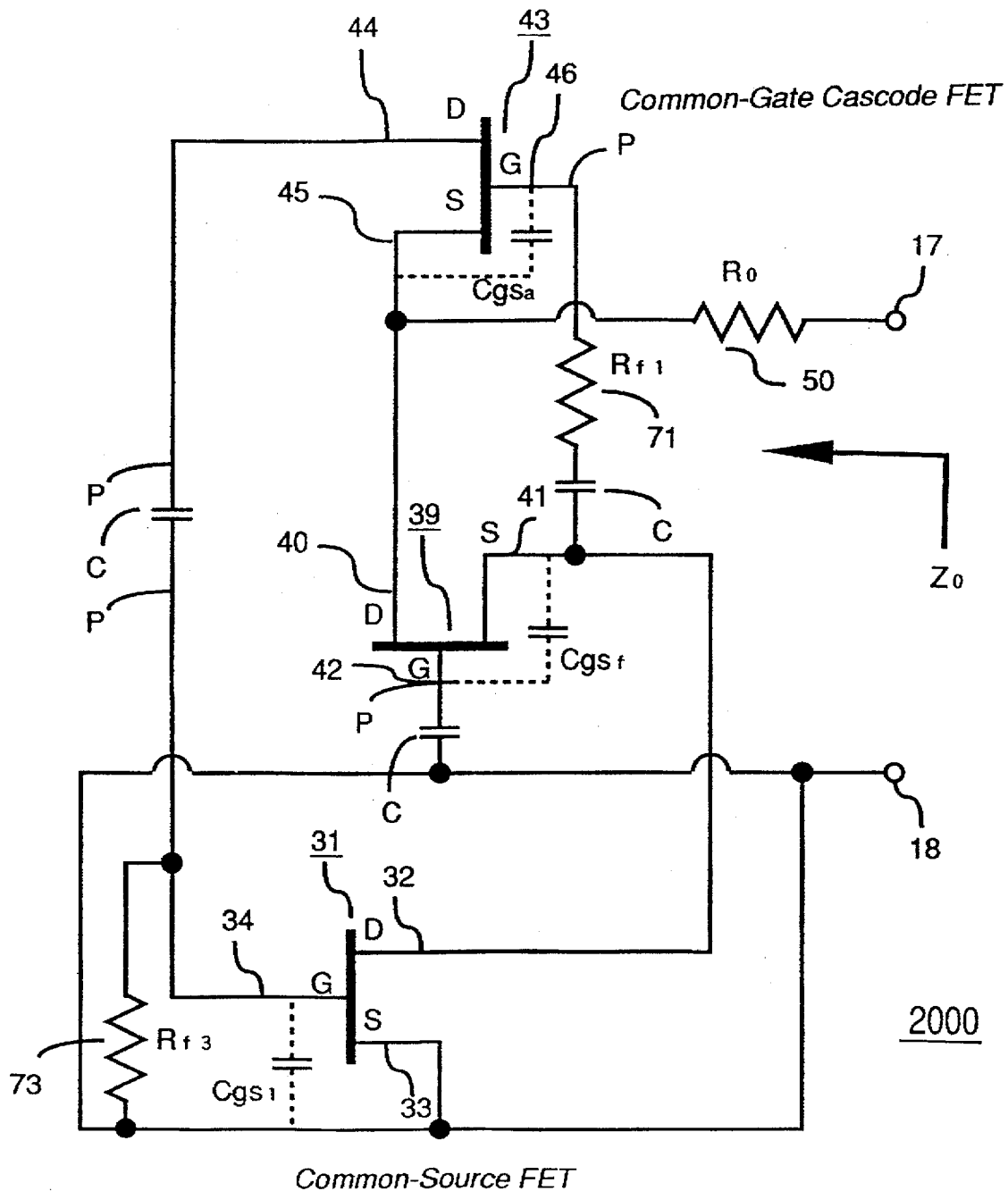
FIG. 40 shows a circuit of an embodiment wherein the embodiments 2 and 4 are combined.

FIG. 40 shows a modification corresponding to a combination of the second and fourth embodiments, wherein resistor 71 having resistance $R_{f1}$ is inserted between source 41 of FET 39 and gate 46 of FET 43, and resistor 73 having resistance $R_{f3}$ is inserted between source 33 and gate 34 of FET 31.

Figure 41:
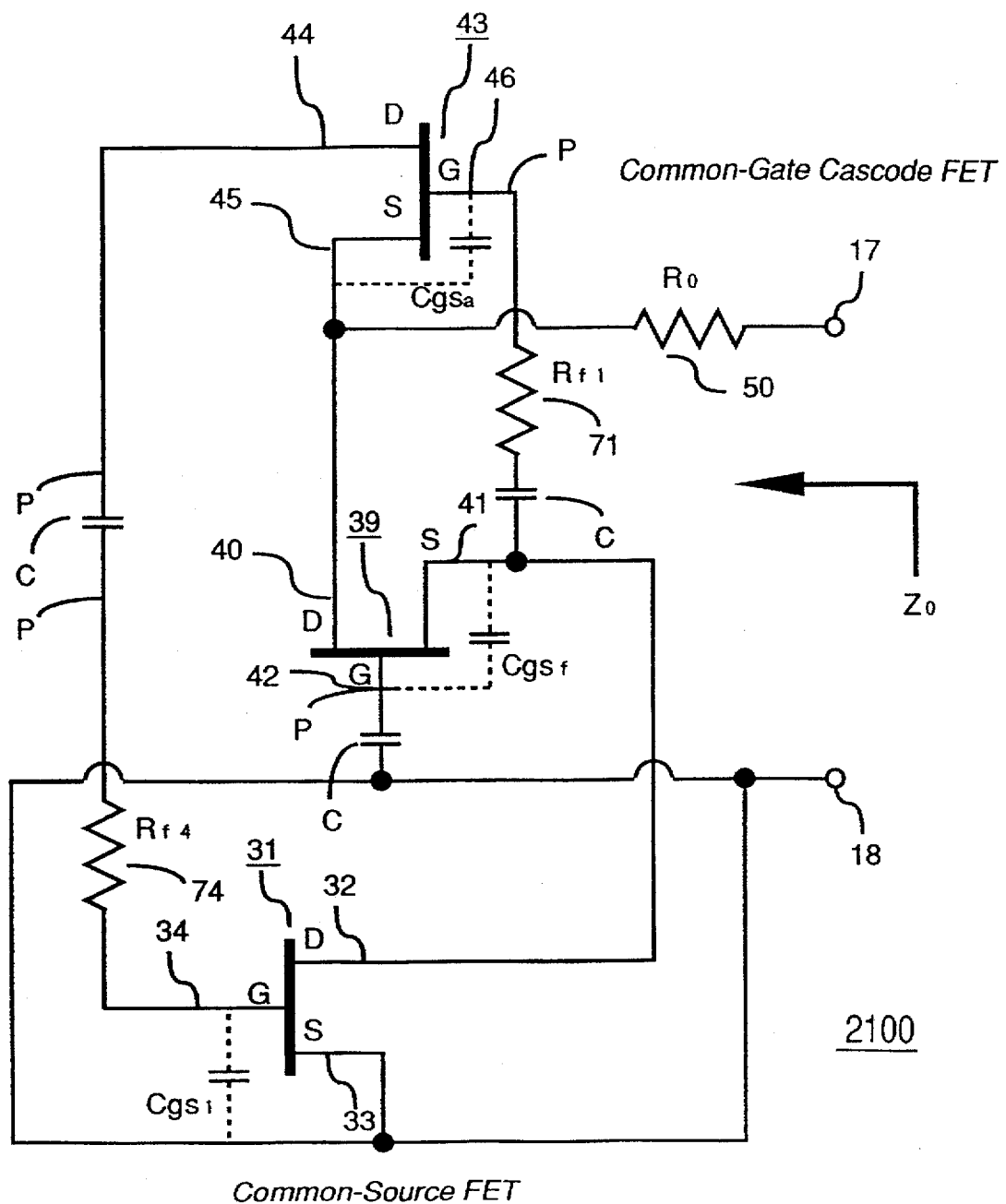
FIG. 41 shows a circuit of an embodiment wherein the embodiments 2 and 5 are employed.
Figure 42:
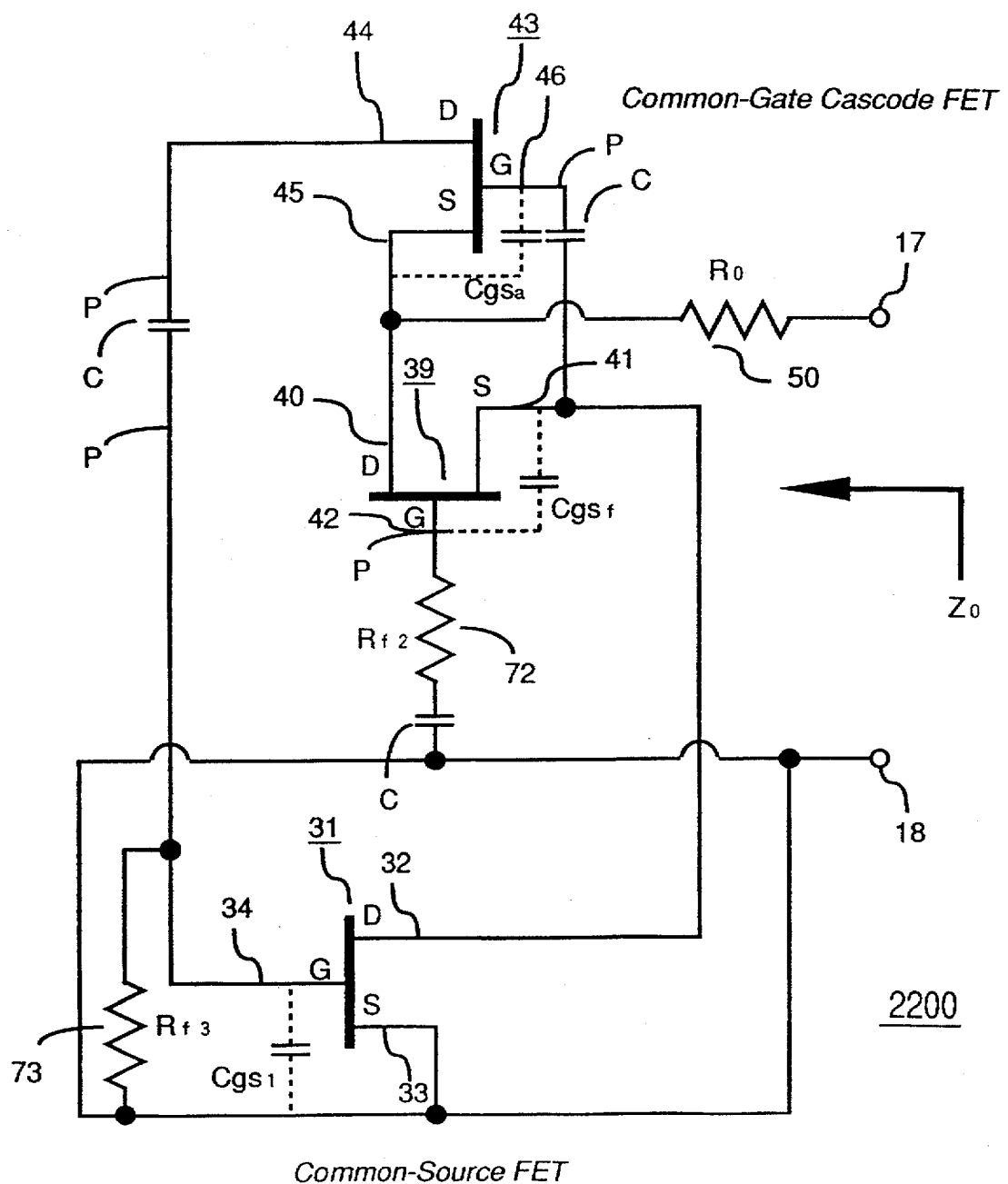
FIG. 42 shows a circuit of an embodiment wherein the embodiments 3 and 4 are employed.

FIG. 41 shows a modification corresponding to a combination of the second and fifth embodiments wherein resistor 71 having resistance $R_{f1}$ is inserted between source 41 of FET 39 and gate 46 of FET 43, and resistor 74 having resistance $R_{f4}$ is inserted between gate 34 of FET 31 and drain 44 of FET 43.

Figure 43:
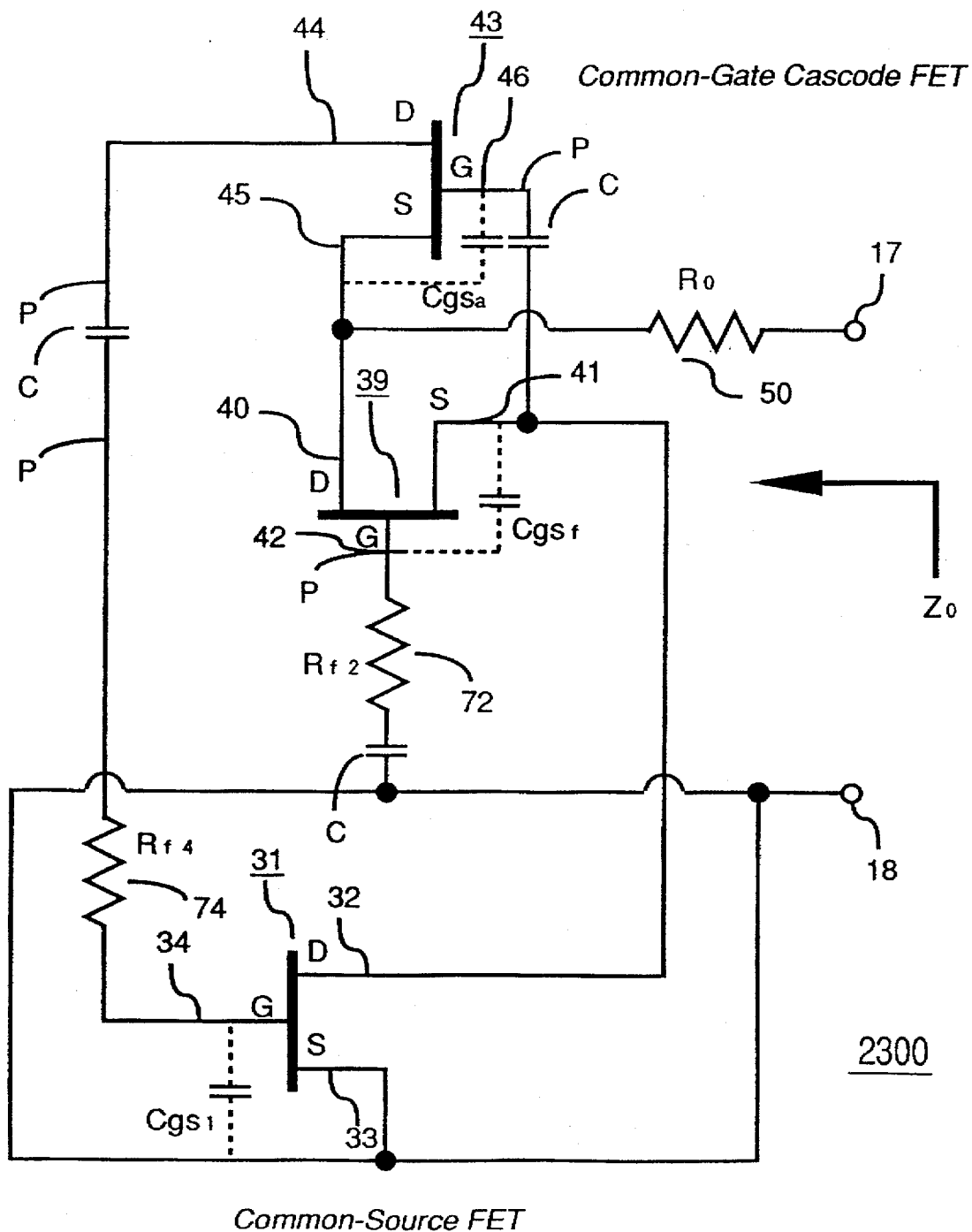
FIG. 43 shows a circuit of an embodiment wherein the embodiments 3 and 5 are employed.
Figure 44:
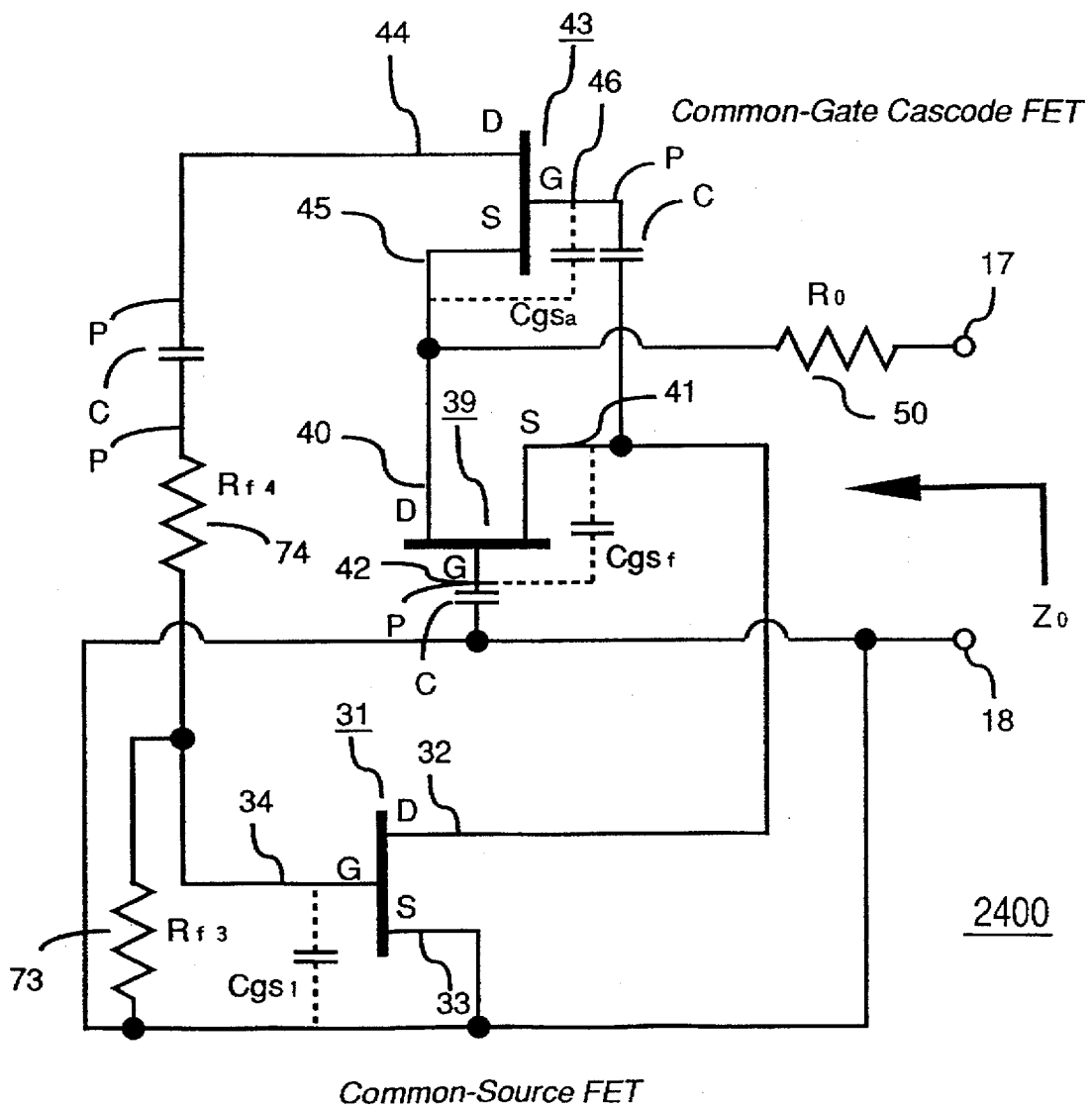
FIG. 44 shows a circuit of an embodiment wherein the embodiments 4 and 5 are employed.

In the same manner as described above, FIG. 42 shows a modification corresponding to a combination of third and fourth embodiments; FIG. 43 shows a modification corresponding to a combination of the third and fifth embodiments; and FIG. 44 shows a modification corresponding to a combination of the fourth and fifth embodiments.

Figure 45:
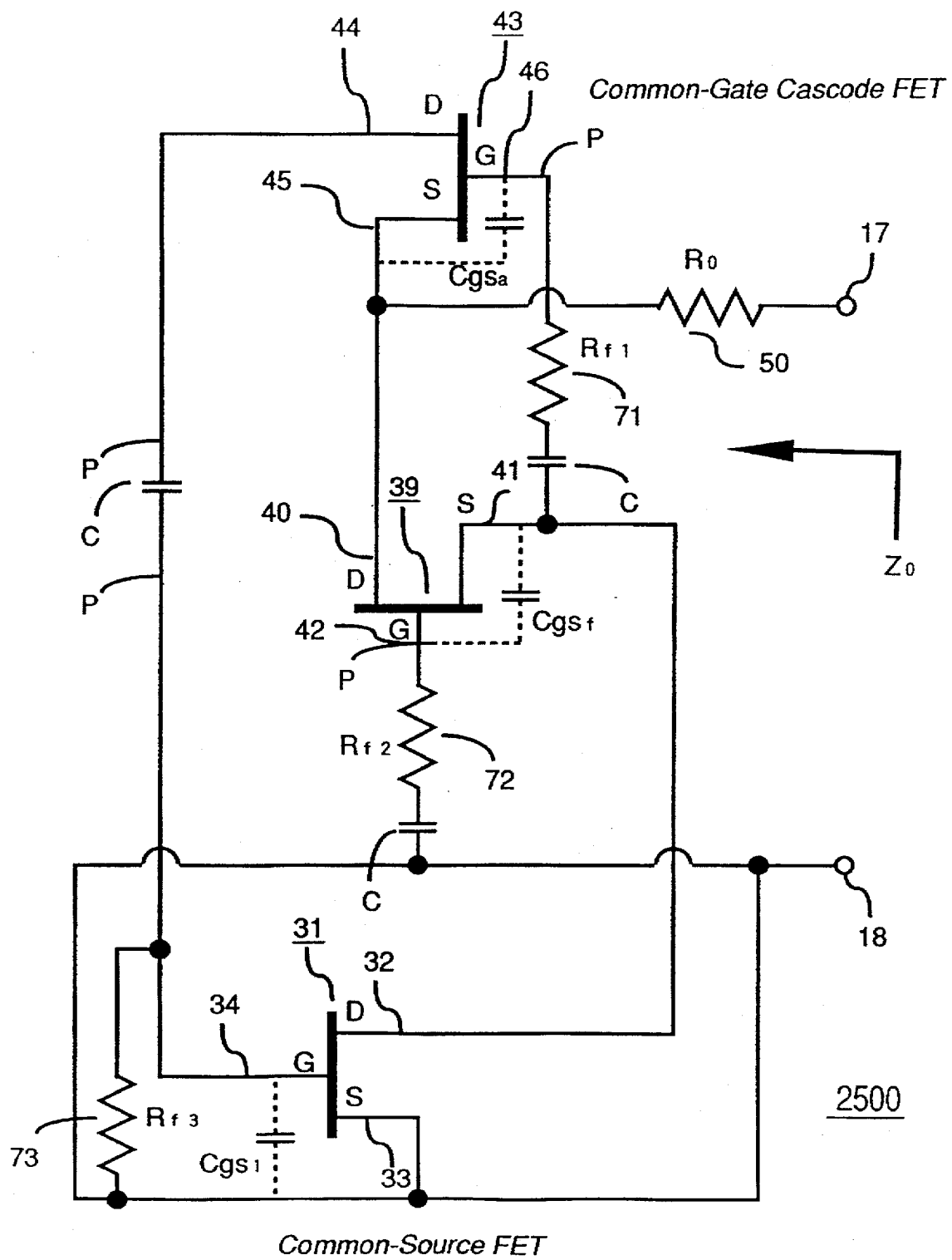
FIG. 45 shows a circuit of an embodiment wherein the embodiments 2, 3, and 4 are employed.
Figure 46:
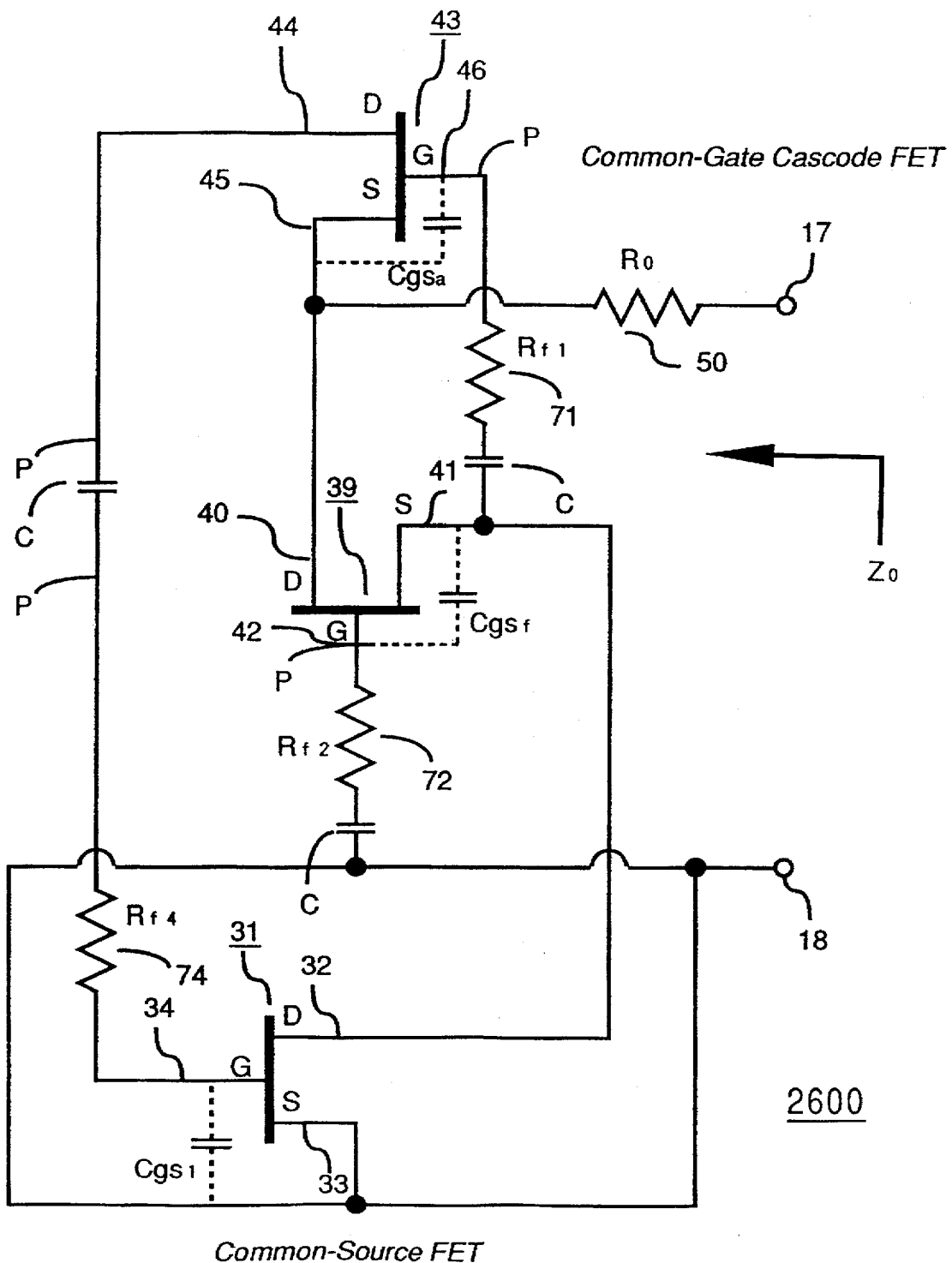
FIG. 46 shows a circuit of an embodiment wherein the embodiments 2, 3, and 5 are employed.
Figure 47:
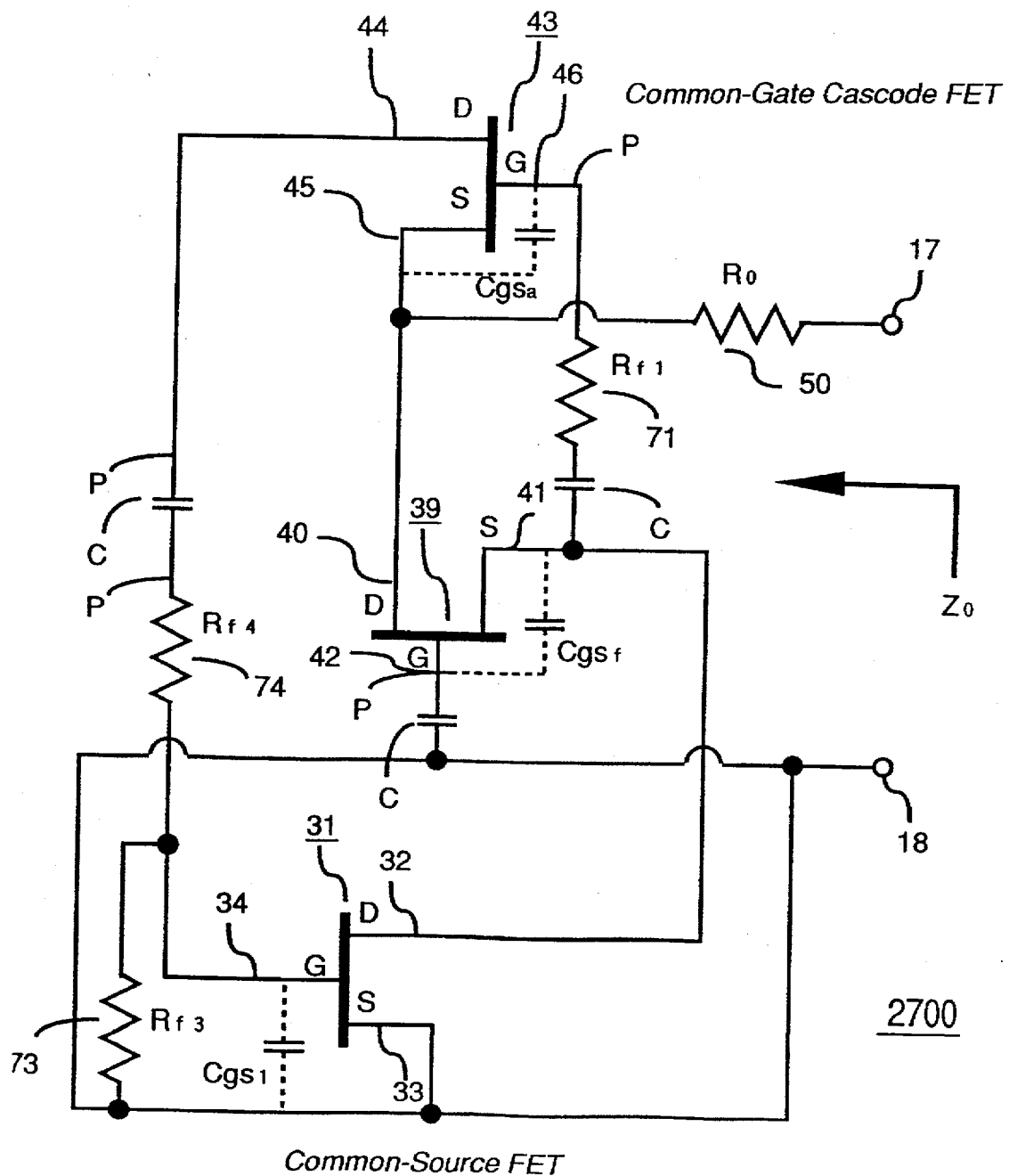
FIG. 47 shows a circuit of an embodiment wherein the embodiments 2, 4, and 5 are employed.
Figure 48:
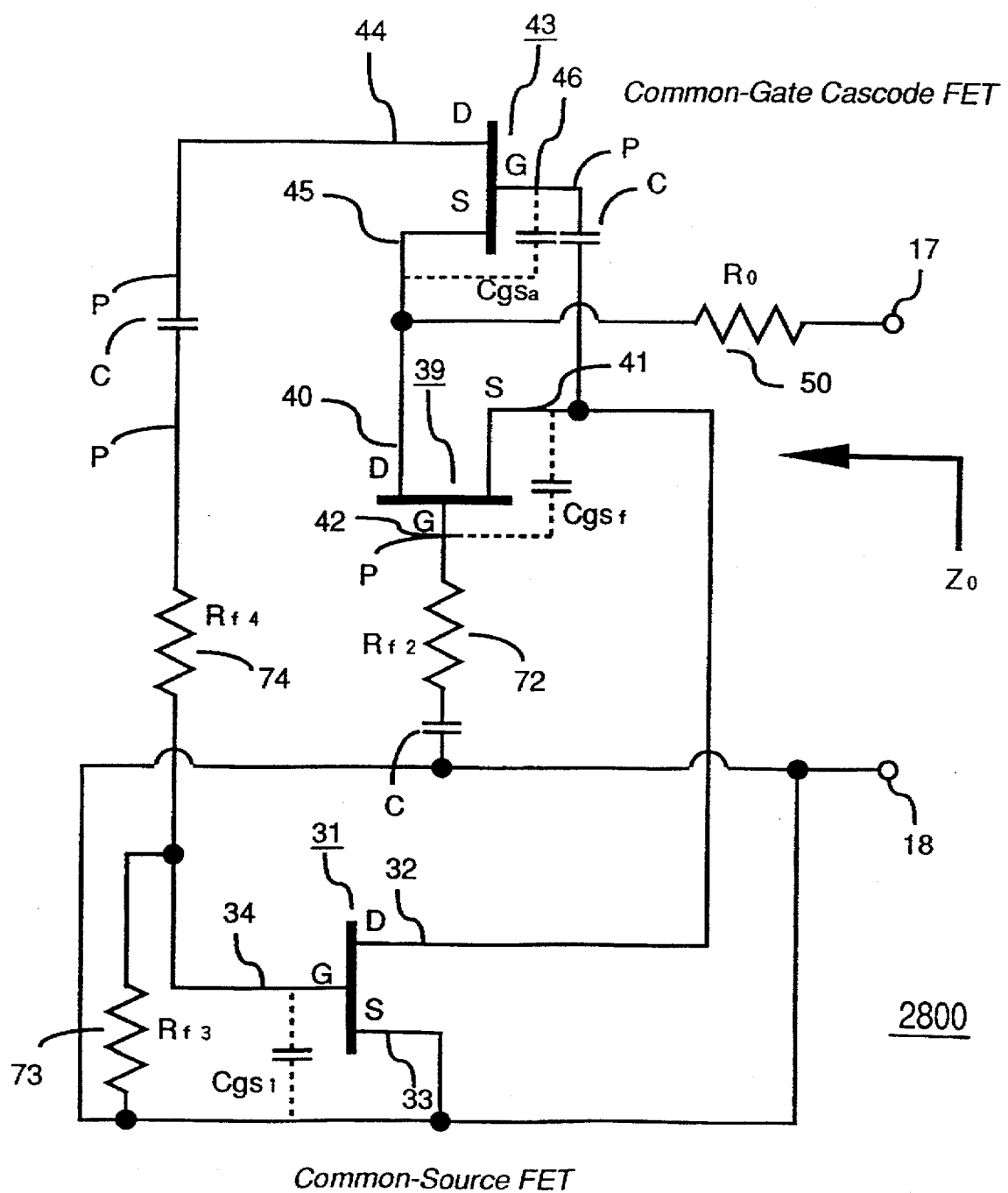
FIG. 48 shows a circuit of an embodiment wherein the embodiments 3, 4, and 5 are employed.

FIGS. 45 through 48 show modifications wherein three resistors are inserted. FIG. 45 shows a modification corresponding to a combination of the second, third, and fourth embodiments. FIG. 46 corresponds to a modification corresponding to a combination of the second, third, and fifth embodiments. FIG. 47 corresponds to a modification corresponding to a combination of the second, fourth, and fifth embodiments. FIG. 48 corresponds to a modification corresponding to a combination of the third, fourth, and fifth embodiments.

Figure 49:
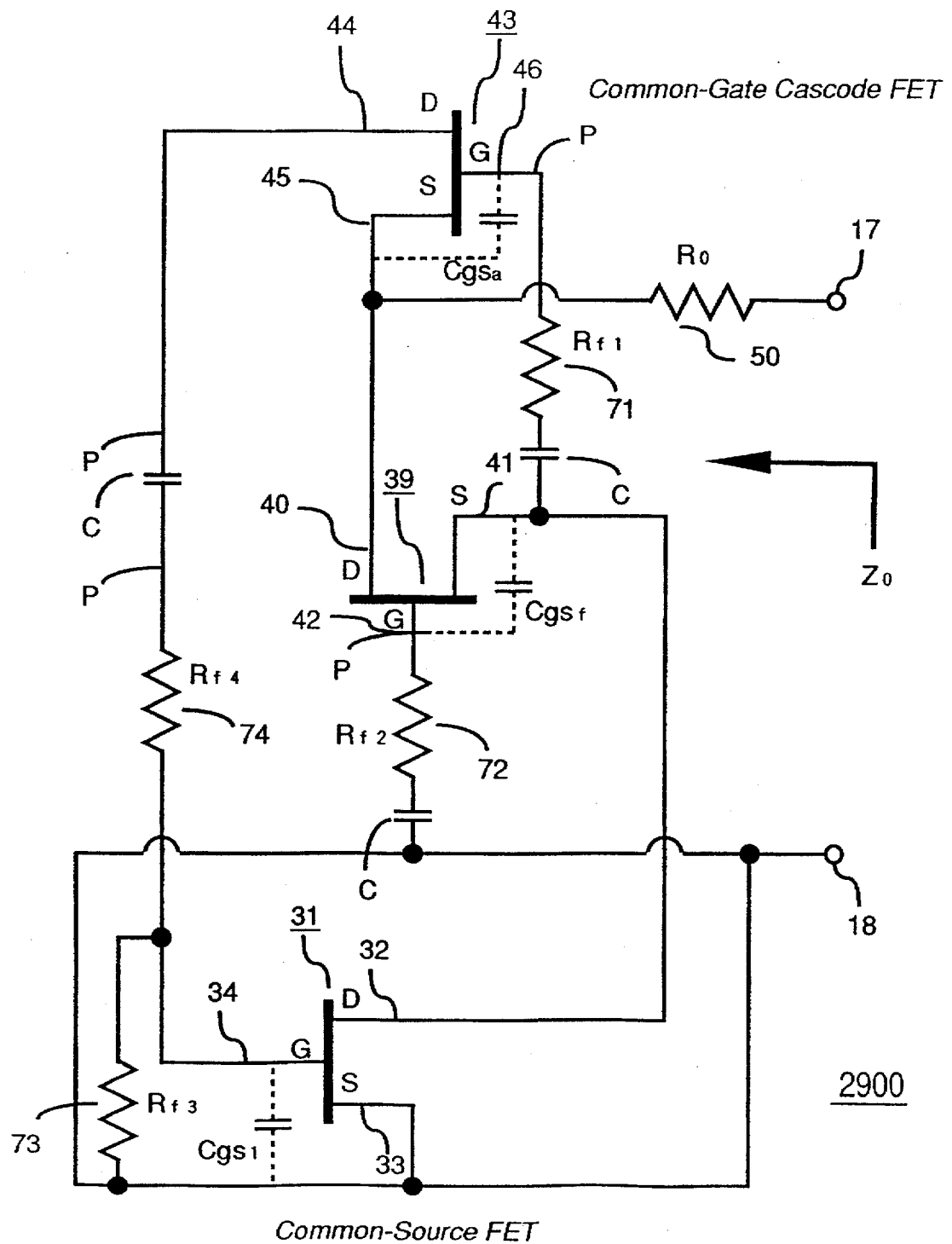
FIG. 49 shows a circuit of an embodiment wherein the embodiments 2 through 5 are combined.

FIG. 49 shows a modification wherein the above-described four resistors are all inserted.

The resistance loss compensation is obtained also according to the above-described modifications by properly determining the resistance $R_{f1}$ through $R_{f4}$ of resistors 71 through 74.

Modification 5

Figure 50:
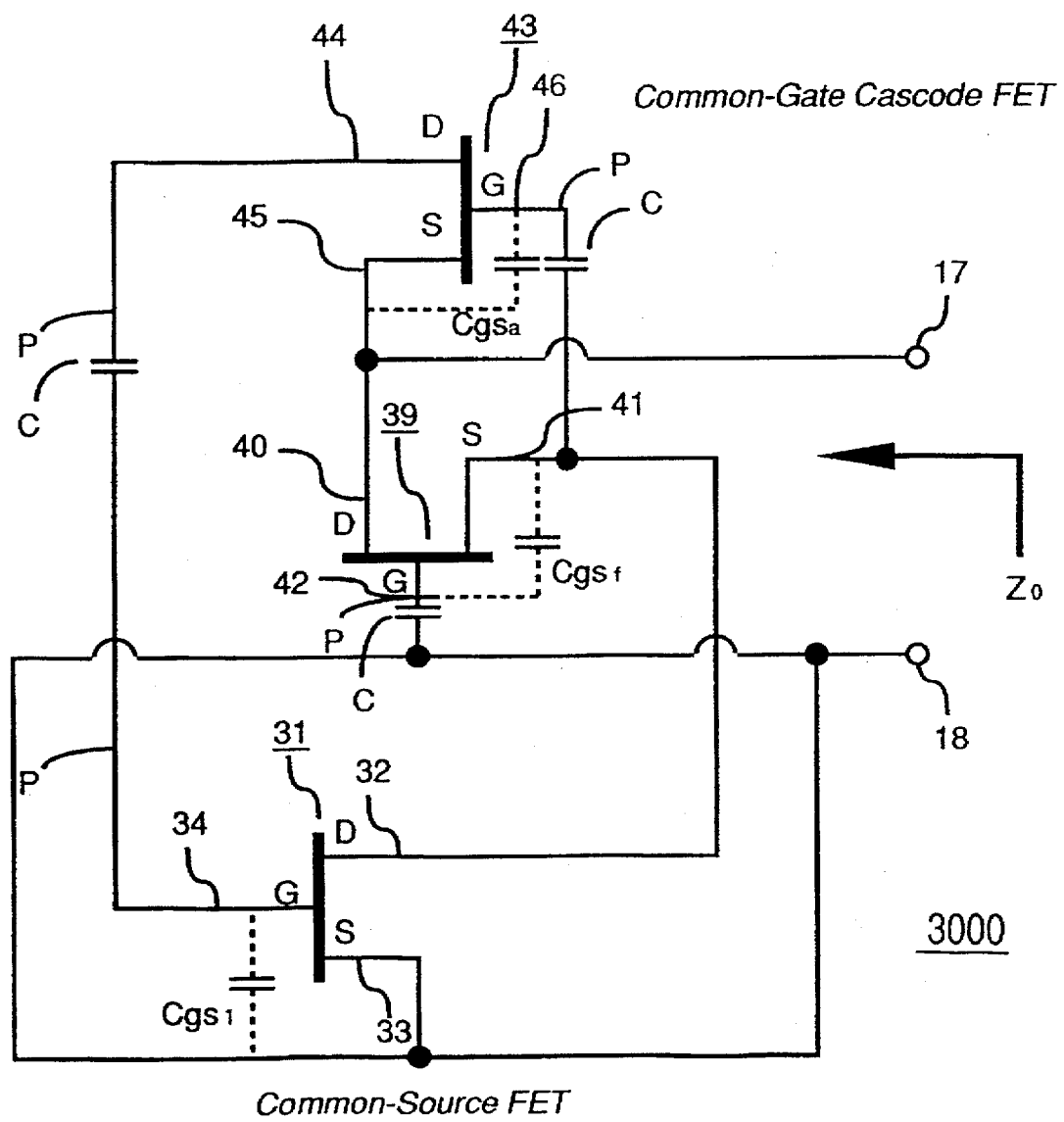
FIG. 50 shows a circuit wherein modification 5 is employed in embodiment 1.

Resistor 50 of the first through fifth embodiments can be omitted. In other words, the resistance $R_0$ of resistor 50 can be zero. FIG. 50 shows such a modification wherein the resistor is omitted from the first embodiment. Figures corresponding to similar modifications of the second through fifth embodiments are not shown because the configuration will be easy for one skilled in the art to understand based on the above descriptions.

Modification 6

Figure 51:
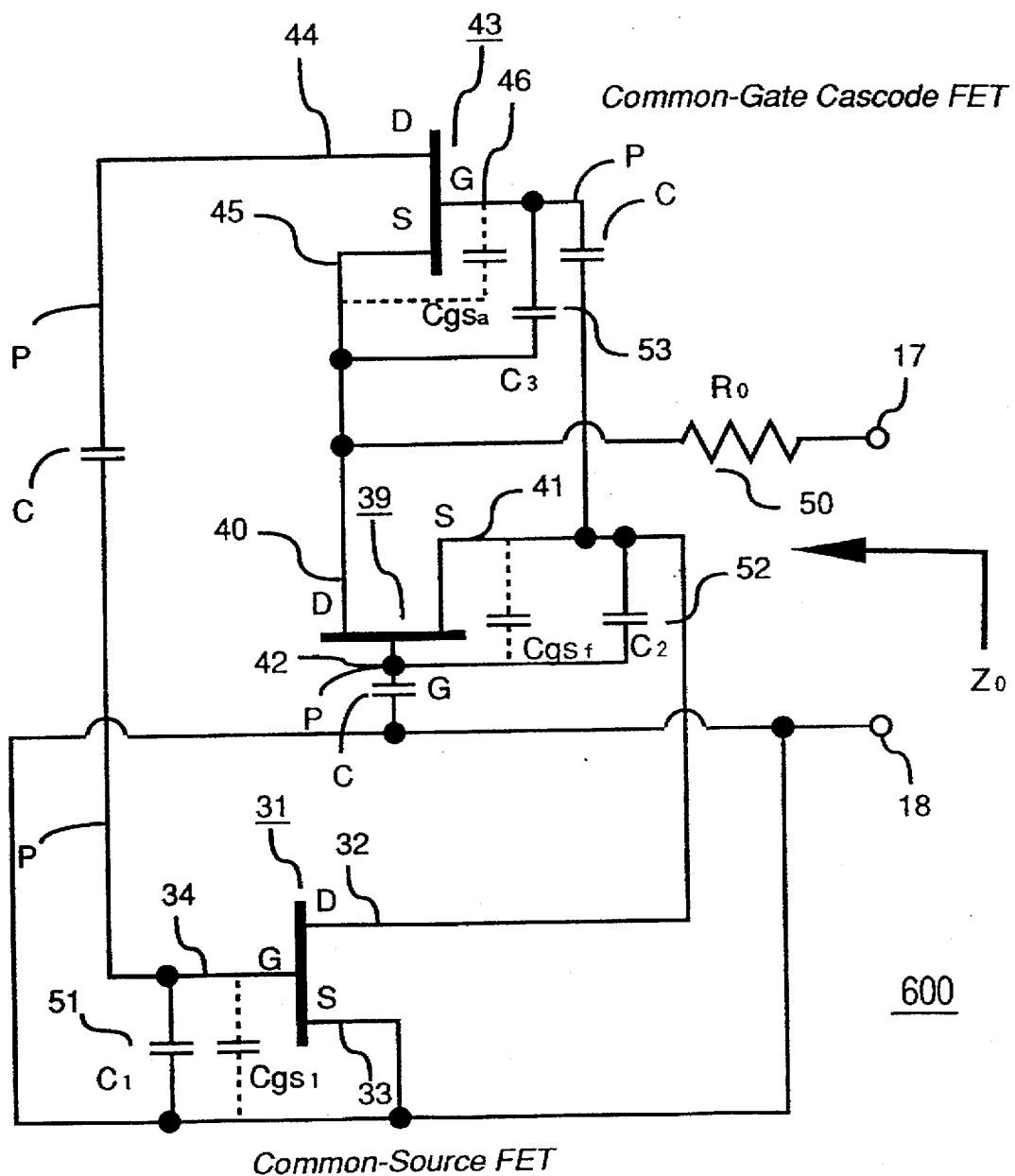
FIG. 51 shows a circuit wherein modification 6 is employed in embodiment 1.

A capacitor may be added to each FET in order to obtain greater inductance, as shown in FIG. 51.

When compared with active inductor 100 shown in FIG. 16, inductor 600 in FIG. 51 is different in that capacitors 51, 52, and 53 having capacitances $C_1$, $C_2$, and $C_3$, respectively, are inserted between source 33 and gate 34 of FET 31, source 41 and gate 42 of FET 39, and source 45 and gate 46 of FET 43.

The impedance $Z_0$ of active inductor 600 viewed from terminals 17 and 18 is obtained when $C_{gs1}$ is replaced by $(C_1+C_{gs1})$ in Equation (6). Therefore, when compared with the original Equation (6), the cutoff frequency $f_T$ is lowered and the inductance is greater.

Similar increase in inductance is obtained by inserting capacitors in each of the FETs according to the second through fifth preferred embodiments.

The circuit is also miniaturized in such modifications because the active inductors consist essentially of transistors and capacitors.

Modification 7

The preferred embodiments can be modified to use bipolar transistors or HEMTs in place of FETs.

Similar results will also be obtained by arbitrarily combining any two or more of the preferred embodiments and the modifications thereof.

Experimental Example 1

The active inductor as shown in FIG. 32 (modification 1 of preferred embodiment 1) was tested. The test results are briefly described as follows.

In the experiment, HEMTs having a gate width of 25 microns and a transconductance $g_m$ of 11 mS were used for FETs 31, 35, 39, and 43 and for DC bias FETs. Resistor 50 had a resistance of 36 ohms as resistance $R_O$. Gate bias resistor was 2 K ohms and was connected with the source electrode of the FETs. The drain voltage was 10 V, and the drain current was 15 mA. The size of the chip was 0.43×0.40 mm².

Figure 52:
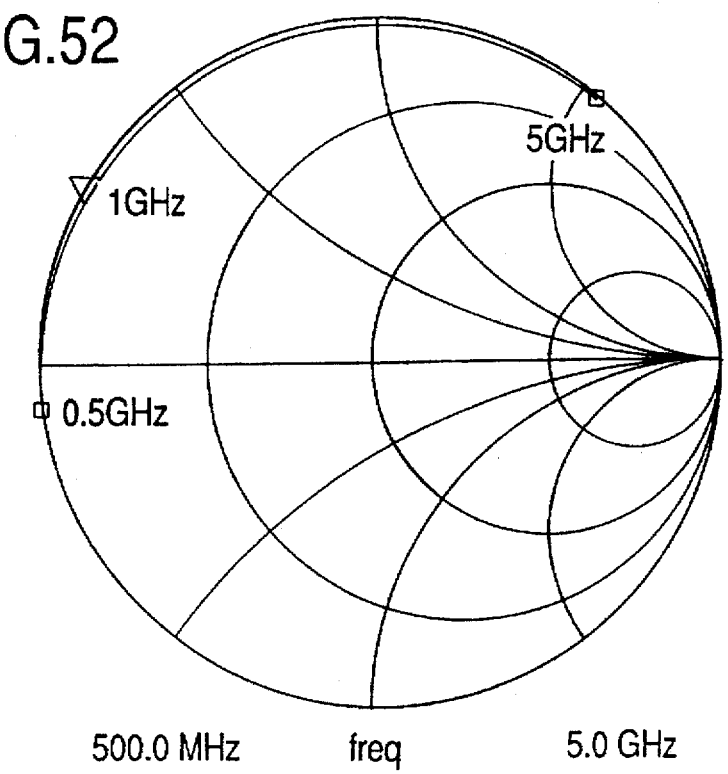
FIG. 52 shows the calculated S parameter of the embodiment wherein modification 1 is employed in embodiment 1.

FIG. 52 shows simulation results of the S parameter. The series resistance at 1 GHz is 0.3 ohms.

Figure 53:
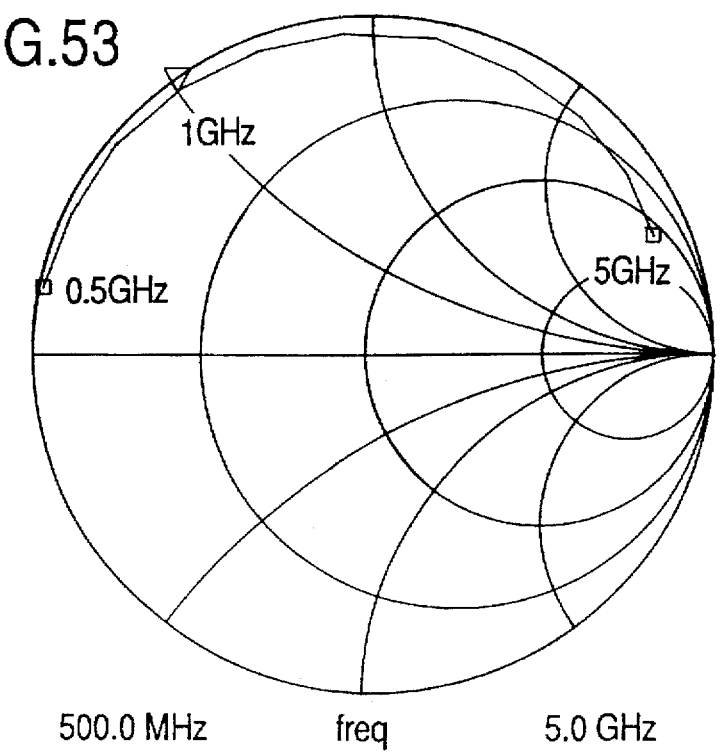
FIG. 53 shows the measured S parameter of the first experimental example wherein modification 1 is employed in embodiment 1.

FIG. 53 shows the S parameter as measured. The measured resistance and inductance are greater than those of simulations. Them reasons seem to be the parasitic capacitance due to the pattern layout, and the impedance of the FETs for DC bias. Furthermore, it may also be due to the insufficient free tuning of the negative resistance which were due to the gate bias resistor which were connected with the source terminals of the FETs. The series resistance at 1 GHz was 0.8 ohms, and Q was 28.

Experimental Example 2

Other test results of the same circuit as described in Embodiment 1 are described in the following sections.

Figure 54:
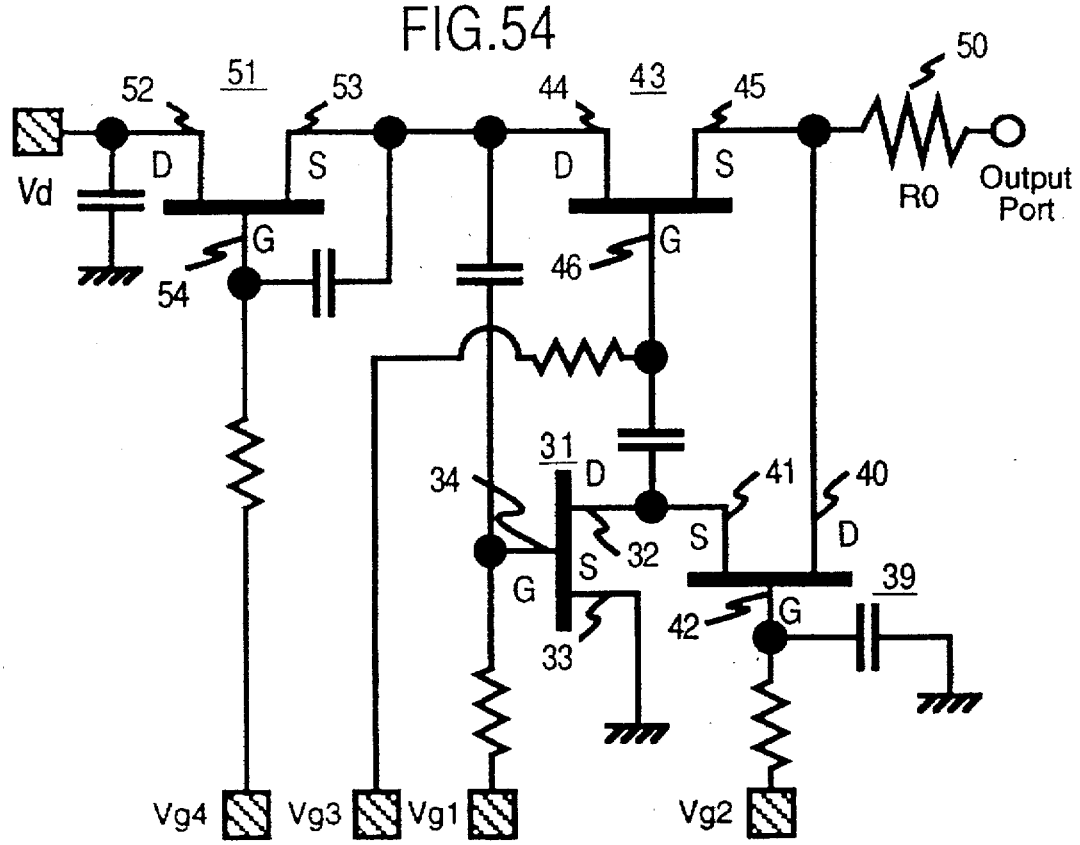
FIG. 54 shows the circuit in detail of the active inductor of the second experimental example.

FIG. 54 shows in detail the circuit used in this experiment. HEMTs having gate length 0.1 micron and InAlAs/InGaAs/InP construction were used for FETs 31, 39, and 43 and for DC bias FET 51. The HEMTs are 25 microns in width, have average cut-off frequency $f_T$ of 140 GHz, and have $f_{max}$ of 180 GHz. The source electrode and the drain electrode are non-alloyed ohmic contact, and $n^+$-InGaAs/$n^+$-InAlAs has been used for the cap layer to reduce contact resistance. Bias conditions were: $V_{g1}$=0.0 V, $V_{g2}$=1.2 V, $V_{g3}$=2.4 V, $V_{g4}$=3.5 V, and $V_d$=4.9 V, and drain current $I_d$=11 mA. The resistance $R_O$ was 29 ohms, and the chip size was 0.78×0.40 mm².

Figure 55:
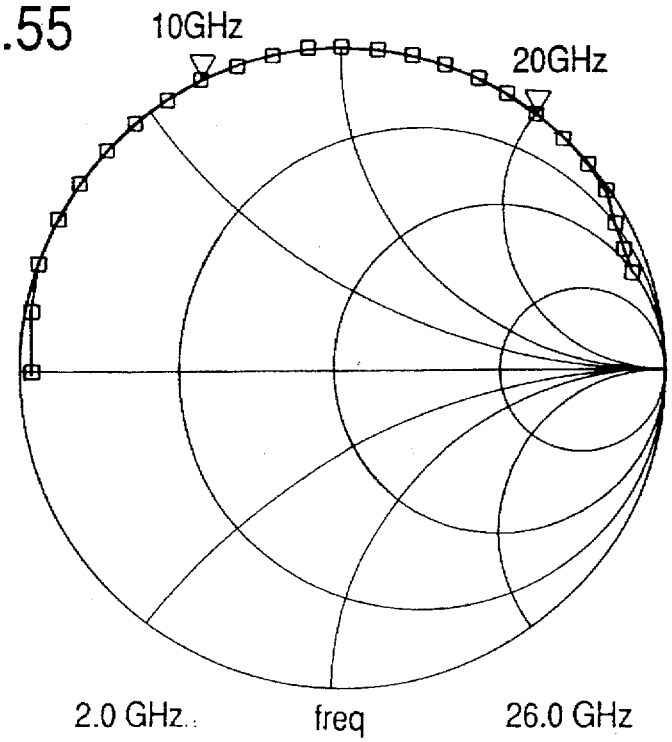
FIG. 55 shows a measured S parameter of the above experimental example.

FIG. 55 shows the S Parameter measured for the frequency range of 2 GHz through 26 GHz. The associated series resistance is kept above zero ohm for the range from 0.045 GHz to 26.5 GHz. And as shown in the figure, a loss compensation is guaranteed up until above 20 GHz. The S parameter at 2 GHz is capacitive due to the capacitor for cutting the direct current component.

Figure 56:
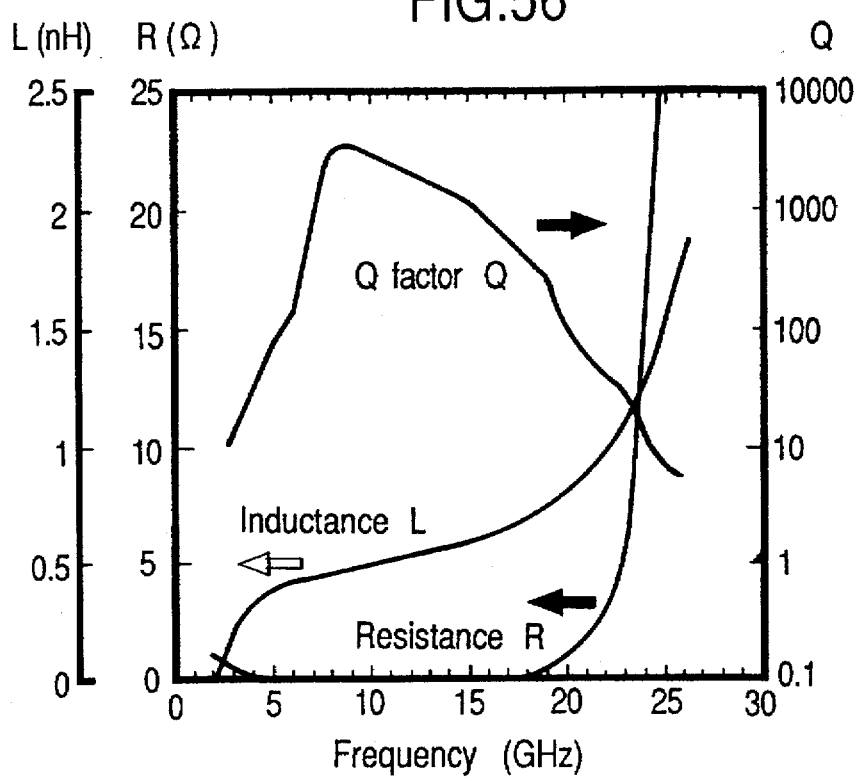
FIG. 56 shows frequency characteristics of the impedance of the active inductor as depicted in FIG. 54.

FIG. 56 shows the measured frequency characteristics of the impedance supposing that the impedance of the active inductor is expressed by a resistance and an inductance connected in series. At the frequencies of 6 GHz and 20 GHz, the measurements of inductance were 0.41 nH and 0.82 nH, and Q was over 100 in this frequency range. At 7 GHz and 15 GHz, the measurements of inductance were 0.44 nH and 0.59 nH, and the Q value was above 1000 in this frequency range.

Figure 57:
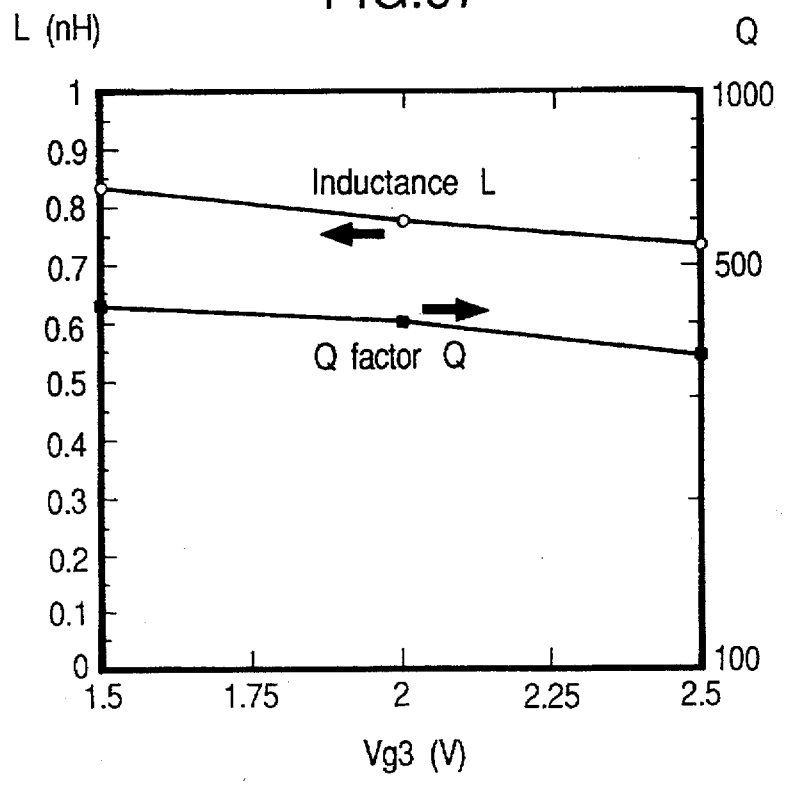
FIG. 57 shows the characteristics of the inductance and Q value corresponding to variable bias voltage of the FETs in the experimental example as depicted in FIG. 54.

For the application in an active filter, phase shifter and oscillator, the stability of characteristics against bias voltage and temperature change is important. FIG. 57 shows the characteristics at 18 GHz measured for variable bias voltage $V_{g3}$. The inductance at 2.5 V and 1.5 V was 0.73 nH and 0.83 nH, and the Q value was 350 and 420, respectively. The inductance and resistance variation for the temperature change from −5 through 55 degrees Celsius were within 0.1 nH and 2 ohms respectively at 18 GHz.

Figure 58:
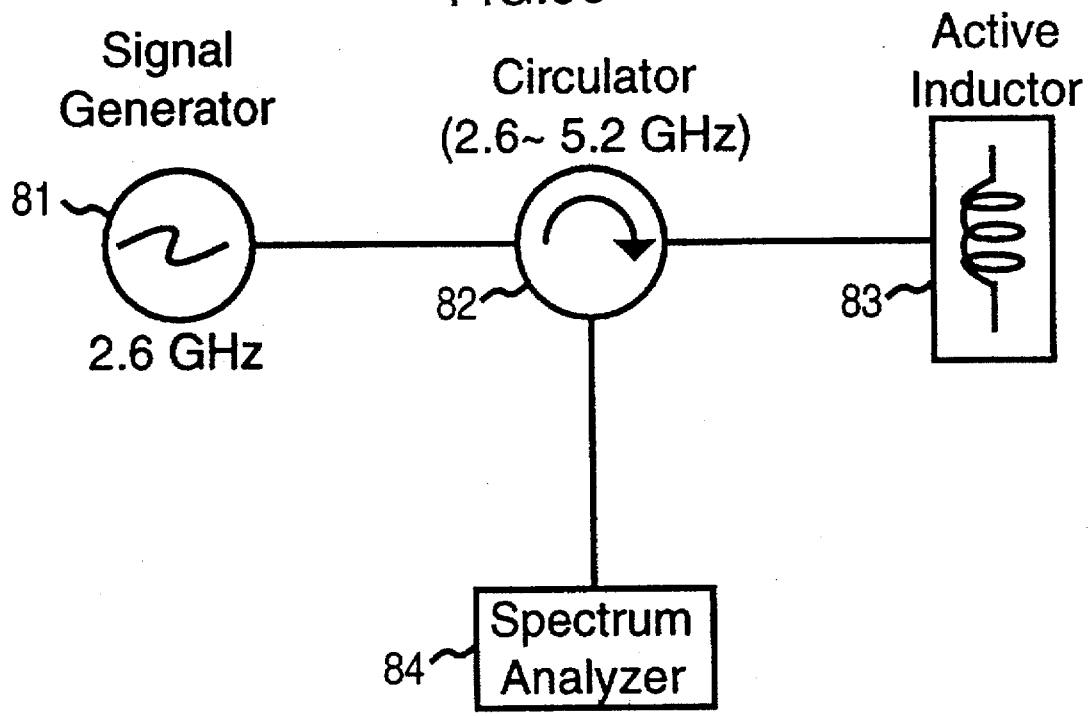
FIG. 58 shows a system configuration for the measurement of the dynamic range of the active inductor as depicted in FIG. 54.
Figure 59:
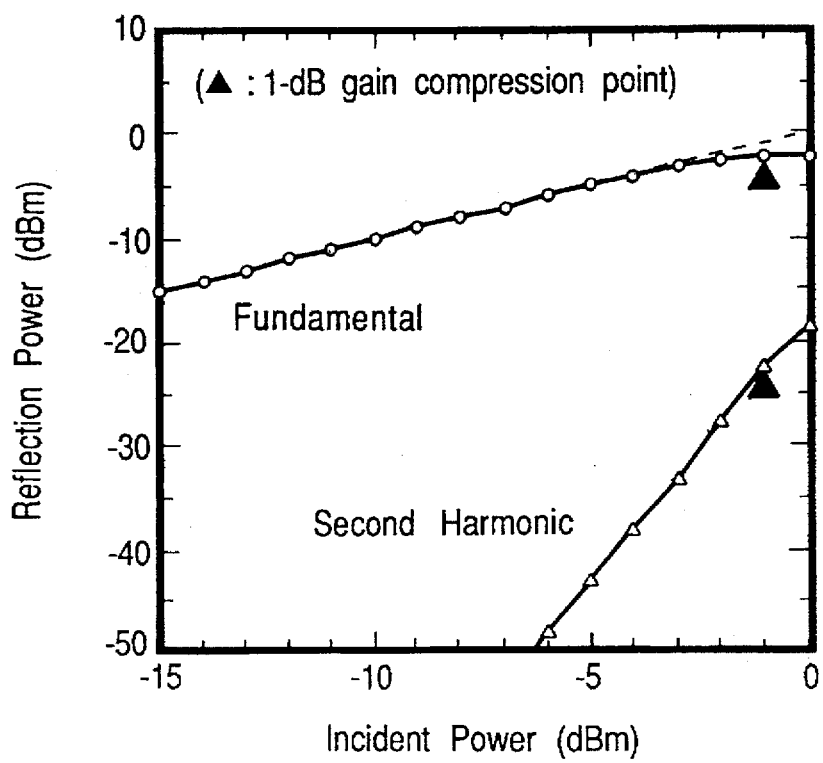
FIG. 59 shows the relationship between the powers of the incident signal and the reflected signal of the active inductor as depicted in FIG. 54.

In order to measure the dynamic range, the inductance and resistance were measured for various incident power levels at 2.6 GHz. FIG. 58 shows the system configuration of the measurement. As shown in the figure, the signal at 2.6 GHz generated by signal generator 81 was inputted into active inductor 83 through circulator 82, and the reflected signal was analyzed by spectrum analyzer 84. As shown in FIG. 59, 1-dB gain compression occurred when the incident power was −1 dBm, and the ratio of the fundamental wave power to the second-harmonic power of the reflected signal is more than 20 dB. The phase deviation was less than 1 degree for the range of the incident power shown in the figure. As is apparent from the figure, the change of inductance and resistance is negligible for the variation of incident power up until −1 dBm.

Figure 60:
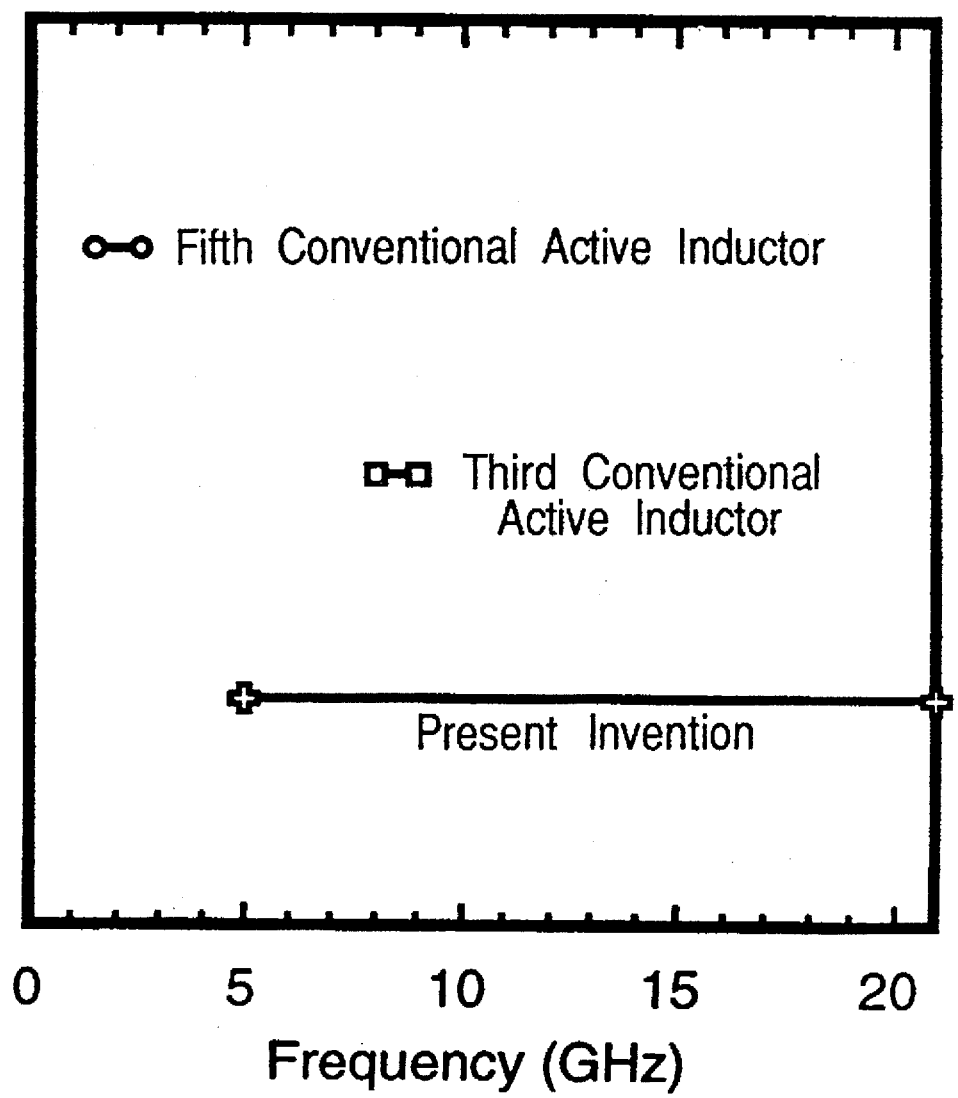
FIG. 60 shows a comparison of the dynamic ranges of the experimental example as depicted in FIG. 54 and the third and fifth conventional inductors.

FIG. 60 shows a comparison of band width of the present invention versus measurements reported in recent literature wherein Q values are greater than 50. As shown in the figure, the active inductor according to the present invention has broader band width and lower loss compared to prior devices wherein the reported frequency range is not above approximately 1 GHz to 2 GHz.

What is claimed is:

1. An active inductor having a low resistance loss and broad frequency characteristics, said active inductor comprising;

a first transistor having a gate electrode, a source electrode, and a drain electrode;

a second transistor having a gate electrode, a source electrode, and a drain electrode;

a third transistor having a gate electrode, a source electrode, and a drain electrode; and first and second terminals, wherein said gate electrode of said second transistor is connected to said source electrode of said first transistor, said source electrode of said second transistor is connected to said drain electrode of said first transistor, said gate electrode of said third transistor is connected to said source electrode of said second transistor, said source electrode of said third transistor is connected to said drain electrode of second transistor, said drain electrode of said third transistor is connected to said gate electrode of said first transistor, said drain electrode of said second transistor and said source electrode of said third transistor are connected to said first terminal, said source electrode of said first transistor is connected to said second terminal.

2. The active inductor according to claim 1, wherein the connection between said drain electrode of said second transistor and said source electrode of said third transistor is connected to said first terminal via a first resistor.

3. The active inductor according to claim 1, wherein a first resistor is inserted between said source electrode of said second transistor and said gate electrode of said third transistor.

4. The active inductor according to claim 2, wherein a second resistor is inserted between said source electrode of said second transistor and said gate electrode of said third transistor.

5. The active inductor according to claim 1 wherein a first resistor is inserted between said source electrode of said first transistor and said gate electrode of said second transistor.

6. An active inductor according to claim 2 wherein a second resistor is inserted between said source electrode of said first transistor and said gate electrode of said second transistor.

7. The active inductor according to claim 1, wherein a first resistor is inserted between said gate electrode of said first transistor and said source electrode of said first transistor.

8. An active inductor according to claim 2 wherein a second resistor is inserted between said gate electrode of said first transistor and said source electrode of said first transistor.

9. The active inductor according to claim 1, wherein a first resistor is inserted between said gate electrode of said first transistor and said drain electrode of said third transistor.

10. The active inductor according to claim 2, wherein a second resistor is inserted between said gate electrode of said first transistor and said drain electrode of said third transistor.

11. The active inductor according to claim 1, wherein a first capacitor is inserted between said gate and source electrodes of said first transistor, a second capacitor is inserted between said gate and source electrodes of said second transistor, and a third capacitor is inserted between said gate and source electrodes of said third transistor.

12. The active inductor according to claim 2 wherein a first capacitor is inserted between said gate and source electrodes of said first transistor, a second capacitor is inserted between said gate and source electrodes of said second transistor, and a third capacitor is inserted between said gate and source electrodes of said third transistor.

13. The active inductor according to one of claim 1 through 12, wherein at least one transistor is inserted between said drain electrode of said first transistor and said source electrode of said second transistor, said at least one transistor is cascode-connected to said first transistor.

14. The active inductor according to claim 13, wherein a fourth capacitor is inserted between gate and source electrodes of said at least one transistor inserted between said drain electrode of said first transistor and said source electrode of said second transistor.

15. The active inductor according to one of claims 1 through 12, wherein at least one transistor is inserted between said gate electrode of said first transistor and said drain electrode of said third transistor, said at least one transistor being cascode-connected to said third transistor.

16. The active inductor according to claim 15, wherein a fourth capacitor is inserted between gate and source electrodes of said at least one transistor inserted between said gate electrode of said first transistor and said drain electrode of said third transistor.

17. The active inductor according to one of claims 1 through 12, wherein at least one transistor is inserted between said drain electrode of said second transistor and said source electrode of said third transistor, said at least one transistor being cascode-connected to said second transistor.

18. The active inductor according to claim 17, wherein a fourth capacitor is inserted between gate and source electrodes of said at least one transistor inserted between said drain electrode of said second transistor and said source electrode of said third transistor.

19. The active inductor according to one of claims 1 through 12 wherein said first, second, and third transistors are field effect transistors.

20. The active inductor according to one of claims 1 through 12, wherein said first, second, and third transistors are high electron mobility transistors.

21. An active inductor having a low resistance loss and broad frequency characteristics, said active inductor comprising:
a first bipolar transistor having a base electrode, an emitter electrode, and a collector electrode;
a second bipolar transistor having a base electrode, an emitter electrode, and a collector electrode;
a third bipolar transistor having a base electrode, an emitter electrode, and a collector electrode; and
first and second terminals,
wherein said base electrode of said second bipolar transistor is connected to said emitter electrode of said first bipolar transistor, said emitter electrode of said second bipolar transistor is connected to said collector electrode of said first bipolar transistor, said base electrode of said third bipolar transistor is connected to said emitter electrode of said second bipolar transistor, said emitter electrode of said third bipolar transistor is connected to said collector electrode of said second bipolar transistor, said collector electrode of said third bipolar transistor is connected to said base electrode of said first bipolar transistor, said collector electrode of said second bipolar transistor and said emitter electrode of said third bipolar transistor are connected to said first terminal, and said emitter electrode of said first bipolar transistor is connected to said second terminal.

22. The active inductor according to claim 21, wherein the connection between said collector electrode of said second bipolar transistor and said emitter electrode of said third bipolar transistor is connected to said first terminal via a first resistor.

23. The active inductor according to claim 21, wherein a first resistor is inserted between said emitter electrode of said second bipolar transistor and said base electrode of said third bipolar transistor.

24. The active inductor according to claim 22, wherein a second resistor is inserted between said emitter electrode of said second bipolar transistor and said base electrode of said third bipolar transistor.

25. The active inductor according to claim 21, wherein a first resistor is inserted between said emitter electrode of said first bipolar transistor and said base electrode of said second bipolar transistor.

26. The active inductor according to claim 22, wherein a second resistor is inserted between said emitter electrode of said first bipolar transistor and said base electrode of said second bipolar transistor.

27. The active inductor according to claim 21, wherein a first resistor is inserted between said base electrode of said first bipolar transistor and said emitter electrode of said first bipolar transistor.

28. The active inductor according to claim 22, wherein a second resistor is inserted between said base electrode of said first bipolar transistor and said emitter electrode of said first bipolar transistor.

29. The active inductor according to claim 21, wherein a first resistor is inserted between said base electrode of said first bipolar transistor and said collector electrode of said third bipolar transistor.

30. The active inductor according to claim 22, wherein a second resistor is inserted between said base electrode of said first bipolar transistor and said collector electrode of said third bipolar transistor.

31. The active inductor according to claim 21, wherein a first capacitor is inserted between said base and emitter electrodes of said first bipolar transistor, a second capacitor is inserted between said base and emitter electrodes of said second bipolar transistor, and a third capacitor is inserted between said base and emitter electrodes of said third bipolar transistor.

32. The active inductor according to claim 22, wherein a first capacitor is inserted between said base and emitter electrodes of said first bipolar transistor, a second capacitor is inserted between said base and emitter electrodes of said second bipolar transistor, and a third capacitor is inserted between said base and emitter electrodes of said third bipolar transistor.

33. The active inductor according to one of claims 21 through 32, wherein at least one bipolar transistor is inserted between said collector electrode of said first bipolar transistor and said emitter electrode of said second bipolar transistor, said at least one bipolar transistor is cascode-connected to said first bipolar transistor.

34. The active inductor according to claim 33, wherein a fourth capacitor is inserted between base and emitter electrodes of said at least one bipolar transistor inserted between said collector electrode of said first bipolar transistor and said emitter electrode of said second bipolar transistor.

35. The active inductor according to one of claims 21 through 32, wherein at least one bipolar transistor is inserted between said base electrode of said first bipolar transistor and said collector electrode of said third bipolar transistor, said at least one bipolar transistor being cascode-connected to said third bipolar transistor.

36. The active inductor according to claim 35, wherein a fourth capacitor is inserted between base and emitter electrodes of said at least one bipolar transistor inserted between said base electrode of said first bipolar transistor and said collector electrode of said third bipolar transistor.

37. The active inductor according to one of claims 21 through 32, wherein at least one bipolar transistor is inserted between said collector electrode of said second bipolar transistor and said emitter electrode of said third bipolar transistor, said at least one bipolar transistor being cascode-connected to said second bipolar transistor.

38. The active inductor according to claim 37, wherein a fourth capacitor is inserted between base and emitter electrodes of said at least one bipolar transistor inserted between said collector electrode of said second bipolar transistor and said emitter electrode of said third bipolar transistor.

* * * * *